US006544813B1

(12) United States Patent
Lin

(10) Patent No.: US 6,544,813 B1
(45) Date of Patent: *Apr. 8, 2003

(54) METHOD OF MAKING A SEMICONDUCTOR CHIP ASSEMBLY WITH A CONDUCTIVE TRACE SUBTRACTIVELY FORMED BEFORE AND AFTER CHIP ATTACHMENT

(76) Inventor: Charles W. C. Lin, 34 Pinewood Grove, Singapore 738290 (SG)

( * ) Notice: Subject to any disclaimer, the term of this patent is extended or adjusted under 35 U.S.C. 154(b) by 27 days.

This patent is subject to a terminal disclaimer.

(21) Appl. No.: 09/878,649

(22) Filed: Jun. 11, 2001

Related U.S. Application Data

(63) Continuation-in-part of application No. 09/677,207, filed on Oct. 2, 2000, now Pat. No. 6,448,108.

(51) Int. Cl.[7] ............................................... H01L 21/44
(52) U.S. Cl. ....................... 438/107; 438/108; 438/110; 438/612
(58) Field of Search ........................... 438/107, 108, 438/110, 125, 612, 613, 618

(56) References Cited

U.S. PATENT DOCUMENTS

| | | | |
|---|---|---|---|
| 4,442,967 A | 4/1984 | van de Pas et al. | 228/159 |
| 4,661,192 A | 4/1987 | McShane | 156/292 |
| 4,717,066 A | 1/1988 | Goldenberg et al. | 228/179 |
| 4,750,666 A | 6/1988 | Neugebauer et al. | 228/160 |
| 4,807,021 A | 2/1989 | Okumura | 357/75 |
| 4,925,083 A | 5/1990 | Farassat et al. | 228/102 |
| 4,937,653 A | 6/1990 | Blonder et al. | 357/68 |
| 4,955,523 A | 9/1990 | Calomagno et al. | 228/179 |
| 4,970,571 A | 11/1990 | Yamakawa et al. | 357/71 |
| 4,984,358 A | 1/1991 | Nelson | 29/830 |
| 5,014,111 A | 5/1991 | Tsuda et al. | 357/68 |
| 5,060,843 A | 10/1991 | Yasuzato et al. | 228/179 |
| 5,074,947 A | 12/1991 | Estes et al. | 156/307.3 |
| 5,090,119 A | 2/1992 | Tsuda et al. | 29/843 |
| 5,106,461 A | 4/1992 | Volfson et al. | 205/125 |

(List continued on next page.)

FOREIGN PATENT DOCUMENTS

| | | |
|---|---|---|
| EP | 0 718 882 A1 | 6/1996 |
| WO | WO 97/38563 | 10/1997 |
| WO | WO 99/57762 | 11/1999 |

OTHER PUBLICATIONS

Markstein et al., "Controlling the Variables in Stencil Printing," Electronic Packaging & Production, Feb. 1997, pp. 48–56.

Elenius, "Choosing a Flip Chip Bumping Supplier—Technology an IC Package contractor should look for," Advanced Packaging, Mar./Apr. 1998, pp. 70–73.

Erickson, "Wafer Bumping: The Missing Link for DCA," Electronic Packaging & Production, Jul. 1998, pp. 43–46.

Kuchenmeister et al., "Film Chip Interconnection Systems Prepared By Wet Chemical Matallization," IEEE publication 0–7803–4526–6/98, Jun. 1998, 5 pages.

Ghaffarian, "Long Time BGA Assembly Reliability," Advancing Microelectronics, vol. 25, No. 6, Sep./Oct. 1998, pp. 20–23.

U.S. application Ser. No. 09/465,024, filed Dec. 16, 1999, entitled "Bumpless Flip Chip Assembly With Solder Via".

U.S. application Ser. No. 09/464,562, filed Dec. 16, 1999, entitled "Bumpless Flip Chip Assembly With Strips And Via–Fill".

(List continued on next page.)

Primary Examiner—Kevin M. Picardat
(74) Attorney, Agent, or Firm—David M. Sigmond

(57) ABSTRACT

A method of manufacturing a semiconductor chip assembly includes providing a semiconductor chip and a conductive metal, wherein the chip includes a conductive pad and the conductive metal includes routing line that is disposed above and overlaps the pad, etching the conductive metal on a side opposite the routing line to expose the routing line, and forming a connection joint that contacts and electrically connects the routing line and the pad.

210 Claims, 52 Drawing Sheets

U.S. PATENT DOCUMENTS

| | | | |
|---|---|---|---|
| 5,116,463 A | 5/1992 | Lin et al. | 156/653 |
| 5,137,845 A | 8/1992 | Lochon et al. | 437/183 |
| 5,167,992 A | 12/1992 | Lin et al. | 427/437 |
| 5,172,851 A | 12/1992 | Matsushita et al. | 228/179 |
| 5,196,371 A | 3/1993 | Kulesza et al. | 437/183 |
| 5,209,817 A | 5/1993 | Ahmed et al. | 156/643 |
| 5,237,130 A | 8/1993 | Kulesza et al. | 174/260 |
| 5,260,234 A | 11/1993 | Long | 437/203 |
| 5,261,593 A | 11/1993 | Casson et al. | 228/180.22 |
| 5,275,330 A | 1/1994 | Issacs et al. | 228/180.2 |
| 5,284,796 A | 2/1994 | Nakanishi et al. | 437/183 |
| 5,293,067 A | 3/1994 | Thompson et al. | 257/668 |
| 5,294,038 A | 3/1994 | Nakano et al. | 228/179.1 |
| 5,327,010 A | 7/1994 | Uenaka et al. | 257/679 |
| 5,334,804 A | 8/1994 | Love et al. | 174/267 |
| 5,346,750 A | 9/1994 | Hatakeyama et al. | 428/209 |
| 5,355,283 A | 10/1994 | Marrs et al. | 361/760 |
| 5,358,621 A | 10/1994 | Oyama | 205/123 |
| 5,364,004 A | 11/1994 | Davidson | 228/1.1 |
| 5,397,921 A | 3/1995 | Karnezos | 257/779 |
| 5,407,864 A | 4/1995 | Kim | 437/203 |
| 5,424,245 A | 6/1995 | Gurtler et al. | 437/183 |
| 5,438,477 A | 8/1995 | Pasch | 361/689 |
| 5,439,162 A | 8/1995 | George et al. | 228/180.22 |
| 5,447,886 A | 9/1995 | Rai | 437/183 |
| 5,454,161 A | 10/1995 | Beilin et al. | 29/852 |
| 5,454,928 A | 10/1995 | Rogers et al. | 205/125 |
| 5,475,236 A | 12/1995 | Yoshizaki | 257/48 |
| 5,477,933 A | 12/1995 | Nguyen | 174/262 |
| 5,478,007 A | 12/1995 | Marrs | 228/180.22 |
| 5,483,421 A | 1/1996 | Gedney et al. | 361/771 |
| 5,484,647 A | 1/1996 | Nakatani et al. | 428/209 |
| 5,485,949 A | 1/1996 | Tomura et al. | 228/180.5 |
| 5,487,218 A | 1/1996 | Bhatt et al. | 29/852 |
| 5,489,804 A | 2/1996 | Pasch | 257/778 |
| 5,493,096 A | 2/1996 | Koh | 219/121.71 |
| 5,508,229 A | 4/1996 | Baker | 437/183 |
| 5,525,065 A | 6/1996 | Sobhani | 439/67 |
| 5,536,973 A | 7/1996 | Yamaji | 257/737 |
| 5,542,601 A | 8/1996 | Fallon et al. | 228/119 |
| 5,547,740 A | 8/1996 | Higdon et al. | 428/209 |
| 5,556,810 A | 9/1996 | Fujitsu | 437/209 |
| 5,556,814 A | 9/1996 | Inoue et al. | 437/230 |
| 5,564,181 A | 10/1996 | Dineen et al. | 29/841 |
| 5,572,069 A | 11/1996 | Schneider | 257/690 |
| 5,576,052 A | 11/1996 | Arledge et al. | 427/98 |
| 5,583,073 A | 12/1996 | Lin et al. | 439/183 |
| 5,595,943 A | 1/1997 | Itabashi et al. | 437/230 |
| 5,599,744 A | 2/1997 | Koh et al. | 437/195 |
| 5,611,140 A | 3/1997 | Kulesza et al. | 29/832 |
| 5,611,884 A | 3/1997 | Bearinger et al. | 156/325 |
| 5,613,296 A | 3/1997 | Kurino et al. | 29/852 |
| 5,614,114 A | 3/1997 | Owen | 219/121.66 |
| 5,615,477 A | 4/1997 | Sweitzer | 29/840 |
| 5,619,791 A | 4/1997 | Lambrecht, Jr. et al. | 29/852 |
| 5,627,405 A | 5/1997 | Chillara | 257/668 |
| 5,627,406 A | 5/1997 | Pace | 257/700 |
| 5,633,204 A | 5/1997 | Tago et al. | 438/614 |
| 5,637,920 A | 6/1997 | Loo | 257/700 |
| 5,641,113 A | 6/1997 | Somaki et al. | 228/180.22 |
| 5,645,628 A | 7/1997 | Endo et al. | 106/1.23 |
| 5,646,067 A | 7/1997 | Gaul | 437/180 |
| 5,648,686 A | 7/1997 | Hirano et al. | 257/778 |
| 5,654,584 A | 8/1997 | Fujitsu | 257/666 |
| 5,656,858 A | 8/1997 | Kondo et al. | 257/737 |
| 5,663,598 A | 9/1997 | Lake et al. | 257/737 |
| 5,665,652 A | 9/1997 | Shimizu | 438/127 |
| 5,666,008 A | 9/1997 | Tomita et al. | 257/778 |
| 5,669,545 A | 9/1997 | Pham et al. | 228/1.1 |
| 5,674,785 A | 10/1997 | Alram et al. | 437/217 |
| 5,674,787 A | 10/1997 | Zhao et al. | 437/230 |
| 5,682,061 A | 10/1997 | Khandros et al. | 257/666 |
| 5,686,353 A | 11/1997 | Yagi et al. | 437/183 |
| 5,691,041 A | 11/1997 | Frankeny et al. | 428/209 |
| 5,722,162 A | 3/1998 | Chou et al. | 29/852 |
| 5,723,369 A | 3/1998 | Barber | 438/106 |
| 5,731,223 A | 3/1998 | Padmanabhan | 437/183 |
| 5,736,456 A | 4/1998 | Akram | 438/614 |
| 5,739,585 A | 4/1998 | Akram et al. | 257/698 |
| 5,744,859 A | 4/1998 | Ouchida | 257/668 |
| 5,757,071 A | 5/1998 | Bhansali | 257/697 |
| 5,757,081 A | 5/1998 | Chang et al. | 257/778 |
| 5,764,486 A | 6/1998 | Pendse | 361/774 |
| 5,774,340 A | 6/1998 | Chang et al. | 361/771 |
| 5,789,271 A | 8/1998 | Akram | 438/18 |
| 5,798,285 A | 8/1998 | Bentlage et al. | 438/108 |
| 5,801,072 A | 9/1998 | Barber | 438/107 |
| 5,801,447 A | 9/1998 | Hirano et al. | 257/778 |
| 5,803,340 A | 9/1998 | Yeh et al. | 228/56.3 |
| 5,804,771 A | 9/1998 | McMahon et al. | 174/255 |
| 5,808,360 A | 9/1998 | Akram | 257/738 |
| 5,811,879 A | 9/1998 | Akram | 257/723 |
| 5,813,115 A | 9/1998 | Misawa et al. | 29/832 |
| 5,817,541 A | 10/1998 | Averkiou et al. | 428/107 |
| 5,822,856 A | 10/1998 | Bhatt et al. | 29/832 |
| 5,834,844 A | 11/1998 | Akagawa et al. | 257/734 |
| 5,861,666 A | 1/1999 | Bellaar | 257/686 |
| 5,863,816 A | 1/1999 | Cho | 438/123 |
| 5,870,289 A | 2/1999 | Tokuda et al. | 361/779 |
| 5,883,435 A | 3/1999 | Geffken et al. | 257/758 |
| 5,925,931 A | 7/1999 | Yamamoto | 257/737 |
| 5,994,222 A | 11/1999 | Smith et al. | 438/689 |
| 6,012,224 A | 1/2000 | DiStefano et al. | 29/840 |
| 6,013,877 A | 1/2000 | Degani et al. | 174/264 |
| 6,017,812 A | 1/2000 | Yonezawa et al. | 438/613 |
| 6,018,196 A | 1/2000 | Noddin | 257/777 |
| 6,020,561 A | 2/2000 | Ishida et al. | 174/261 |
| 6,037,665 A | 3/2000 | Miyazaki | 257/773 |
| 6,046,909 A | 4/2000 | Joy | 361/748 |
| 6,084,297 A | 6/2000 | Brooks et al. | 257/698 |
| 6,084,781 A | 7/2000 | Klein | 361/771 |
| 6,088,236 A | 7/2000 | Tomura et al. | 361/783 |
| 6,103,552 A | 8/2000 | Lin | 438/113 |
| 6,103,992 A | 8/2000 | Noddin | 219/121.71 |
| 6,127,204 A | 8/2000 | Isaacs et al. | 438/106 |
| 6,448,108 B1 * | 9/2002 | Lin | 438/107 |

OTHER PUBLICATIONS

U.S. application Ser. No. 09/464,561, filed Dec. 16, 1999, entitled "Bumpless Flip Chip Assembly With Strips–In–Via And Plating".

U.S. application Ser. No. 09/120,408, filed Jul. 22, 1998, entitled "Flip Chip Assembly With Via Interconnection".

U.S. application Ser. No. 09/643,212, filed Aug. 22, 2000, entitled "Semiconductor Chip Assembly With Simultaneously Electroplate Contact Terminal and Connection Joint".

U.S. application Ser. No. 09/643,214, filed Aug. 22, 2000, entitled "Semiconductor Chip Assembly with Simultaneously Electrolessly Plated Contact Terminal and Connection Joint".

U.S. application Ser. No. 09/643,213, filed Aug. 22, 2000, entitled "Method Of Making A Support Circuit For A Semiconductor Chip Assembly".

U.S. application Ser. No. 09/643,445, filed Aug. 22, 2000, entitled "Method Of Making A Semiconductor Chip Assembly".

U.S. application Ser. No. 09/665,928, filed Sep. 20, 2000, entitled "Semiconductor Chip Assembly With Ball Bond Connection Joint".

U.S. application Ser. No. 09/665,931, filed Sep. 20, 2000, entitled "Method Of Making A Support Circuit With A Tapered Through–Hole For A Semiconductor Chip Assembly".

U.S. application Ser. No. 09/865,367, filed May 24, 2001, entitled "Semiconductor Chip Assembly With Simultaneously Electroplated Contact Terminal and Connection Joint".

U.S. application Ser. No. 09/864,555, filed May 24, 2001, entitled "Semiconductor Chip Assembly with Simultaneously Electrolessly Plated Contact Terminal and Connection Joint".

U.S. application Ser. No. 09/864,773, filed May 24, 2001, entitled "Semiconductor Chip Assembly With Ball Bond Connection Joint".

* cited by examiner

METHOD OF MAKING A SEMICONDUCTOR CHIP ASSEMBLY WITH A CONDUCTIVE TRACE SUBTRACTIVELY FORMED BEFORE AND AFTER CHIP ATTACHMENT

CROSS-REFERENCE TO RELATED APPLICATIONS

This application is a continuation-in-part of U.S. application Ser. No. 09/677,207 filed Oct. 2, 2000, now U.S. Pat. No. 6,448,108, which is incorporated by reference.

BACKGROUND OF THE INVENTION

1. Field of the Invention

The present invention relates to a semiconductor chip assembly, and more particularly to a semiconductor chip assembly in which a semiconductor chip is mechanically and electrically connected to a support circuit.

2. Description of the Related Art

Semiconductor chips have input/output pads that must be connected to external circuitry in order to function as part of an electronic system. The connection media is typically an array of metallic leads (e.g., a lead frame) or a support circuit (e.g., a substrate), although the connection can be made directly to a circuit panel (e.g., a mother board). Several connection techniques are widely used. These include wire bonding, tape automated bonding (TAB) and flip-chip bonding. Wire bonding is by far the most common. In this approach, wires are bonded, one at a time, from the chip to external circuitry by ultrasonic, thermocompression or thermosonic processes. TAB involves bonding gold-bumped pads on the chip to external circuitry on a polymer tape using thermocompression bonding. Both wire bonding and TAB require mechanical force such as pressure or a burst of ultrasonic vibration and elevated temperature to accomplish metallurgical welding between the wires or bumps and the designated surface.

Flip-chip bonding involves providing pre-formed solder bumps on the pads, flipping the chip so that the pads face down and are aligned with and contact matching bond sites, and melting the solder bumps to wet the pads and the bond sites. After the solder reflows it is cooled down and solidified to form solder joints between the pads and the bond sites. Organic conductive adhesive bumps with conductive fillers in polymer binders have been used in place of solder bumps, but they do not normally form a metallurgical interface in the classical sense. A major advantage of flip-chip bonding over wiring bonding and TAB is that it provides shorter connection paths between the chip and the external circuitry, and therefore has better electrical characteristics such as less inductive noise, cross-talk, propagation delay and waveform distortion. In addition, flip-chip bonding requires minimal mounting area and weight which results in overall cost saving since no extra packaging and less circuit board space are used.

While flip chip technology has tremendous advantages over wire bonding and TAB, its cost and technical limitations are significant. For instance, the cost of forming bumps on the pads is significant. In addition, an adhesive is normally underfilled between the chip and the support circuit to reduce stress on the solder joints due to thermal mismatch between the chip and the support circuit, and the underfilling process increases both manufacturing complexity and cost. Furthermore, the solder joints exhibit increased electrical resistance as well as cracks and voids over time due to fatigue from thermo-mechanical stresses. Finally, the solder is typically a tin-lead alloy and lead-based materials are becoming far less popular due to environmental concerns over disposing of toxic materials and leaching of toxic materials into ground water supplies.

Other techniques besides wire bonding, TAB and flip-chip bonding have been developed to connect chips to external circuitry without using wires, leads or bumps. Such techniques include thin film rerouting at the wafer, panel or module level, and attaching a pre-patterned substrate to the chip such that through-holes in the substrate expose the pads and selectively applying conductive material into the through-holes. Several approaches are described below.

A typical thin film routing approach includes depositing a dielectric material on the chip, providing through-holes in the dielectric material that expose the pads, providing metallization in the through-holes that contacts the pads, and providing a top layer of conductive circuitry on the dielectric material that contacts the metallization. In this manner, the additional circuitry is fabricated on the chip. Drawbacks to this approach include complicated manufacturing requirements, high cost, and chip loss if the additional circuitry is defective. In particular, since the chip or wafer provides a substrate for the additional circuitry, chips will be lost if the additional circuitry fails to achieve certain quality and yield criteria. Unpredictable chip loss has prevented the wide spread adoption of this "chip first" approach in volume production. Furthermore, if the process is not performed on wafers, the commercially available silicon wafer processing equipment may not be compatible with common tooling and handling techniques.

U.S. Pat. No. 5,407,864 discloses providing a partially assembled printed circuit board (PCB) with buried conductive traces and through-holes that expose portions of the conductive traces, attaching the PCB to the chip using an adhesive, removing portions of the adhesive exposed by the through-holes to expose the pads, depositing a blanket conductive layer over the PCB which covers the pads and sidewalls of the through-holes without filling the through-holes, depositing a blanket insulative layer over the PCB which fills the remaining space in the through-holes, polishing the PCB to remove the conductive layer and the insulative layer from the top surface, and providing circuitry at the top surface that is connected to the conductive traces. In this manner, the circuitry at the top surface is connected to the pads through the conductive traces and portions of the conductive layer in the through-holes. Since, however, the conductive layer is blanket deposited over the entire PCB, polishing is used to remove the conductive layer from the top surface of the PCB since it would otherwise short the pads together. Polishing the conductive layer is costly and time consuming. Another drawback is that the polishing completely removes the top layer of the PCB, and therefore subsequent processes such as masking, circuitization and bumping are necessary for fabricating top surface circuitry such as traces and terminals for the next level assembly.

U.S. Pat. No. 6,037,665 discloses providing a chip with solder bumped pads, providing a pre-patterned multi-layer substrate with pre-metallized through-holes aligned with the pads, filling solder from the bumped pads into the through-holes, and reflowing the solder to form solder joint connections with the pads. This approach is similar to flip-chip bonding except that the solder is filled into the through-holes instead of merely being disposed between the chip and the substrate. Drawbacks to this approach include the need to solder bump the chip as well as the disadvantages of solder joints discussed above.

U.S. Pat. No. 5,116,463 discloses attaching a multi-layer substrate to a chip that includes forming through-holes through a dielectric layer that extend to the pads and electrolessly plating metal into the through-holes. The electroless plating is initiated by the pads and continues until the deposited metal fills the through-holes and contacts metallization on the top surface of the substrate. Drawbacks to this approach include the need for the metallization on the top surface to provide endpoint detection and the possibility that electroless plating on the metallization on the top surface adjacent to the top of the through-hole may close the through-hole before the electroless plating fills the through-hole.

U.S. Pat. No. 5,556,810 discloses inner leads laminated by an organic film and attached to a chip by an adhesive. Distal ends of the inner leads are positioned near the pads and then electrically connected to the pads by L-shaped plated metal. However, since the inner leads are flexible and vary in height and length, the inner leads may not be positioned precisely and uniformly, the gaps between the distal ends and the respective pads can vary, and consequently the plated metal joints may be weak or open. Furthermore, if the chip has moderate to high pad density and a separate power/ground plane is needed to achieve better electrical performance, the single layer inner leads may not be suitable. In addition, handling of this leaded-chip for the next level assembly such as outer lead bonding or board level assembly can be problematic since the leads are soft and easily bent, rendering it difficult to maintain co-planarity among the leads during the next level assembly.

Recent introduction of grid array packaging (e.g., ball grid arrays), chip size packages (CSP) and flip-chip packages using high density interconnect substrates are relentlessly driving increased printed circuit board density. Shrinking traces and spaces and increasing layer count increase printed circuit board density, however reducing the size of plated through-holes can even more significantly increase printed circuit board density. Small through-holes allow more routing space so that more conductive lines can be placed between the through-holes. Small through-holes also increase design flexibility and reduce design cycle time and overall product introduction time.

Conventional printed circuit boards have drilled through-holes with a size (diameter) in the range of 200 to 400 microns. As drilling technology improves, the drilled through-hole size is anticipated to reach 100 microns. Moreover, recently developed methods for forming through-holes using a punch, plasma or laser have driven down through-hole size to the range of 50 microns or less. A typical chip pad has a length and width on the order of 50 to 100 microns. Since the through-holes allow the pads to interconnect with various circuitry layers, using through-holes with similar sizes to the pads is desirable. The major advantage of using metallization in through-holes to interconnect the pads is that it replaces external media such as wires, bumps and leads.

The semiconductor chip assembly is subsequently connected to another circuit such as a PCB or mother board during next level assembly. Different semiconductor assemblies are connected to the next level assembly in different ways. For instance, ball grid array (BGA) packages contain an array of solder balls, and land grid array (LGA) packages contain an array of metal pads that receive corresponding solder traces on the PCB. However, since BGA and LGA packages are connected to the PCB by solder joints, the compliance is small and solder joint reliability problems exist. Plastic quad flat pack (PQFP) packages have a lead frame formed into a gull-wing shape. When the PQFP is assembled on a PCB, this gull-wing lead serves as the contact terminal which provides compliance and reduces stress on the solder joints. However, drawbacks to PQFP packages include the large size of the lead and poor high frequency electrical characteristics.

Thermo-mechanical wear or creep of the solder joints that connect the semiconductor chip assembly to the next level assembly is a major cause of failure in most board assemblies. This is because non-uniform thermal expansion and/or contraction of different materials causes mechanical stress on the solder joints.

Thermal mismatch induced solder joint stress can be reduced by using materials having a similar coefficient of thermal expansion (CTE). However, due to large transient temperature differences between the chip and other materials during power-up of the system, the induced solder joint stress makes the assembly unreliable even when the chip and the other materials have closely matched thermal expansion coefficients.

Thermal mismatch induced solder joint stress can also be reduced by proper design of the support circuit. For instance, BGA and LGA packages have been designed with pillar post type contact terminals that extend above the package and act as a stand-off or spacer between the package and the PCB in order to absorb thermal stress and reduce solder joint fatigue. The higher the aspect ratio of the pillar, the more easily the pillar can flex to follow expansion of the two ends and reduce shear stress.

Conventional approaches to forming the pillar either on a wafer or a separate support circuit include a bonded interconnect process (BIP) and plating using photoresist.

BIP forms a gold ball on a pad of the chip and a gold pin extending upwardly from the gold ball using a thermocompression wire bonder. Thereafter, the gold pin is brought in contact with a molten solder bump on a support circuit, and the solder is reflowed and cooled to form a solder joint around the gold pin. A drawback to this approach is that when the wire bonder forms the gold ball on the pad it applies substantial pressure to the pad which might destroy active circuitry beneath the pad. In addition, gold from the pin can dissolve into the solder to form a gold-tin intermetallic compound which mechanically weakens the pin and therefore reduces reliability.

U.S. Pat. No. 5,722,162 discloses fabricating a pillar by electroplating the pillar on a selected portion of an underlying metal exposed by an opening in photoresist and then stripping the photoresist. Although it is convenient to use photoresist to define the location of the pillar, electroplating the pillar in an opening in the photoresist has certain drawbacks. First, the photoresist is selectively exposed to light that initiates a reaction in regions of the photoresist that correspond to the desired pattern. Since photoresist is not fully transparent and tends to absorb the light, the thicker the photoresist, the poorer the penetration efficiency of the light. As a result, the lower portion of the photoresist might not receive adequate light to initiate or complete the intended photo-reaction. Consequently, the bottom portion of the opening in the photoresist might be too narrow, causing a pillar formed in the narrowed opening to have a diameter that decreases with decreasing height. Such a pillar has a high risk of fracturing at its lower portion in response to thermally induced stress. Second, if the photoresist is relatively thick (such as 100 microns or more), the photoresist may need to be applied with multiple coatings and receive multiple light exposures and bakes, which increases cost and reduces yield. Third, if the photoresist is relatively thick, the electroplated pillar may be non-uniform due to poor current density distribution in the relatively deep opening. As a result, the pillar may have a jagged or pointed top surface instead of a flat top surface that is better suited for providing a contact terminal for the next level assembly.

In view of the various development stages and limitations in currently available semiconductor chip assemblies, there is a need for a semiconductor chip assembly that is cost-effective, reliable, manufacturable, provides excellent mechanical and electrical performance, and complies with stringent environmental standards.

SUMMARY OF THE INVENTION

An object of the present invention is to provide a semiconductor chip assembly with a chip and a support circuit that provides a low cost, high performance, high reliability package.

Another objective of the present invention is to provide a convenient, cost-effective method for manufacturing semiconductor chip assemblies as chip scale packages, chip size packages, ball grid arrays or other structures.

In accordance with one aspect of the invention, a method of manufacturing a semiconductor chip assembly includes providing a semiconductor chip and a conductive metal, wherein the chip includes a conductive pad, the conductive metal includes a routing line, and the routing line is disposed above and overlaps the pad, etching the conductive metal on a side opposite the routing line to expose the routing line, and forming a connection joint that contacts and electrically connects the routing line and the pad.

Preferably, the method includes mechanically attaching the chip to the conductive metal using an adhesive before etching the conductive metal, and etching the adhesive thereby exposing the pad after mechanically attaching the chip to the conductive metal and before forming the connection joint.

The method may also include etching partially but not completely through the conductive metal to form outer edges of the routing line, and then etching partially but not completely through the conductive metal on the opposite side to expose and form a top surface of the routing line.

The method may also include encapsulating the chip after mechanically attaching the chip to the conductive metal and before etching the conductive metal to expose the routing line.

The method may also include forming an insulative base over the routing line that does not extend to the top surface of the conductive trace.

The method may further include etching the conductive metal on the opposite side to form a pillar that is connected to and extends above the routing line, either before or after forming the connection joint.

An advantage of the present invention is that the semiconductor chip assembly need not include wire bonds, TAB leads or solder joints. Another advantage is that the pillar is formed using etching (i.e., subtractively) rather than by electroplating or electroless plating (i.e., additively) which improves uniformity and reduces manufacturing time and cost. Another advantage is that the assembly can be manufactured using low temperature processes which reduces stress and improves reliability. A further advantage is that the assembly can be manufactured using well-controlled wet chemical processes which can be easily implemented by circuit board, lead frame and tape manufacturers. Still another advantage is that the assembly can be manufactured using materials that are compatible with copper chip and lead-free environmental requirements.

These and other objects, features and advantages of the invention will be further described and more readily apparent from a review of the detailed description of the preferred embodiments which follows.

BRIEF DESCRIPTION OF THE DRAWINGS

The following detailed description of the preferred embodiments can best be understood when read in conjunction with the following drawings, in which.

DETAILED DESCRIPTION OF THE PREFERRED EMBODIMENTS

FIGS. 1A–1N, 2A–2N and 3A–3N are cross-sectional, top and bottom views, respectively, of a method of manufacturing a semiconductor chip assembly in accordance with a first embodiment of the present invention.

Figure 1A:
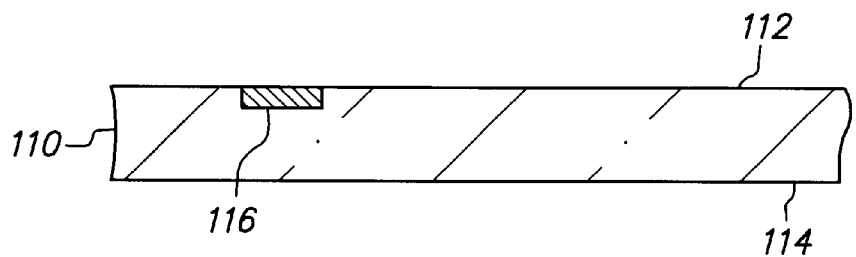
FIGS. 1A–1N are cross-sectional views showing a method of manufacturing a semiconductor chip assembly in accordance with a first embodiment of the present invention.
Figure 2A:
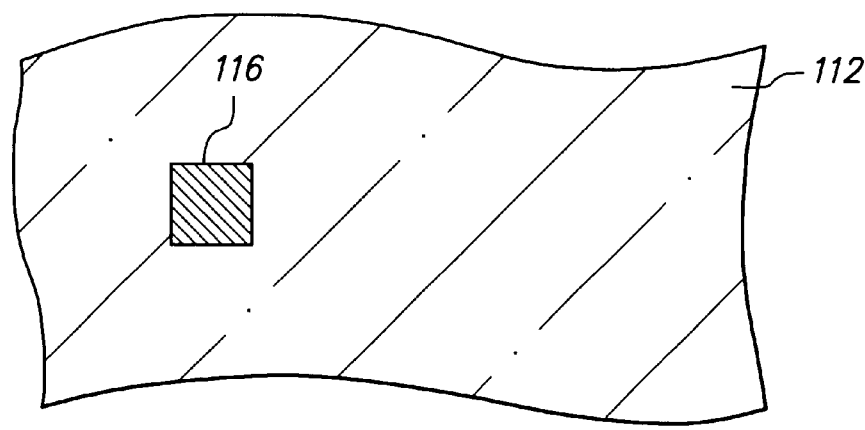
FIGS. 2A–2N are top plan views corresponding to FIGS. 1A–1N, respectively.
Figure 3A:
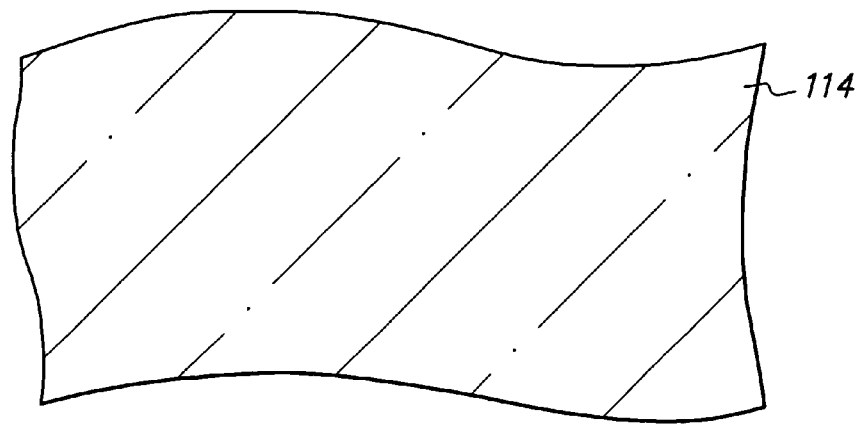
FIGS. 3A–3N are bottom plan views corresponding to FIGS. 1A–1N, respectively.

FIGS. 1A, 2A and 3A are cross-sectional, top and bottom views, respectively, of semiconductor chip 110 which is an integrated circuit in which various transistors, circuits, interconnect lines and the like are formed (not shown). Chip 110 includes upper surface 112 and lower surface 114. Upper surface 112 includes conductive pad 116. Pad 116 is substantially aligned with the insulative housing of chip 110 so that upper surface 112 is essentially flat. Alternatively, if desired, pad 116 can extend above or be recessed below the insulative housing. Pad 116 provides a bonding site to electrically couple chip 110 with external circuitry. Thus, pad 116 can be an input/output pad or a power/ground pad. Pad 116 can have an aluminum base that serves as a surface layer, or alternatively, an aluminum base covered by a surface layer such as gold with an adhesion and/or barrier layer therebetween, depending on the nature of a connection joint that shall subsequently contact the pad. If desired, the aluminum base of pad 1 6 is cleaned by dipping chip 110 in a solution containing 0.05 M phosphoric acid at room temperature for 1 minute and then rinsed in distilled water before depositing the next layer on the aluminum base. Pad 116 has a length and width of 60 microns. Chip 110 includes many other pads on upper surface 112, and only pad 116 is shown for convenience of illustration. In addition, chip 110 is one of many chips on a wafer.

Figure 1B:
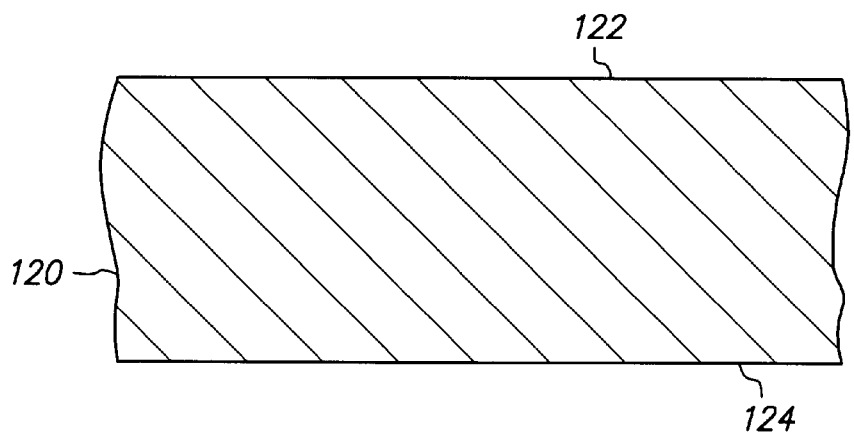
Figure 2B:
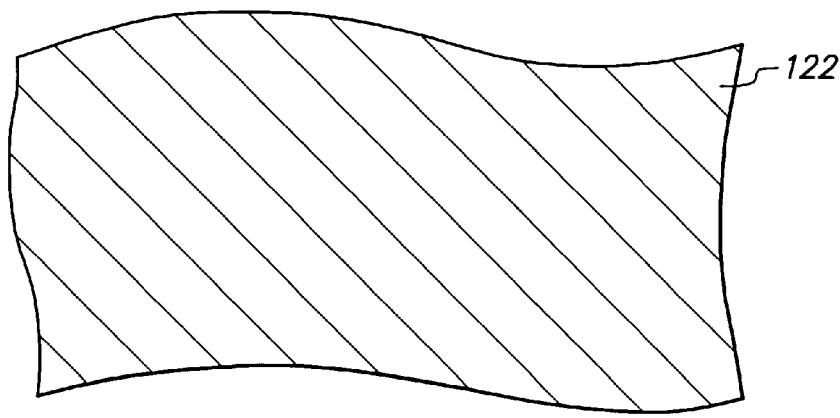
Figure 3B:
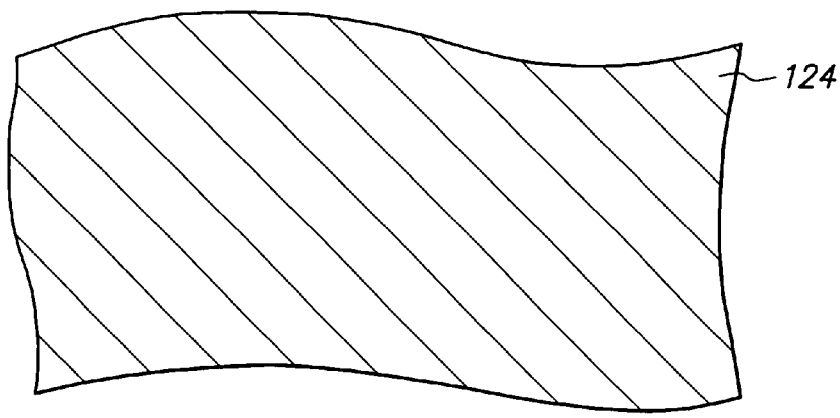

FIGS. 1B, 2B and 3B are cross-sectional, top and bottom views, respectively, of copper foil 120 which includes top surface 122 and bottom surface 124. Copper foil 120 has a thickness of 150 microns.

Figure 1C:
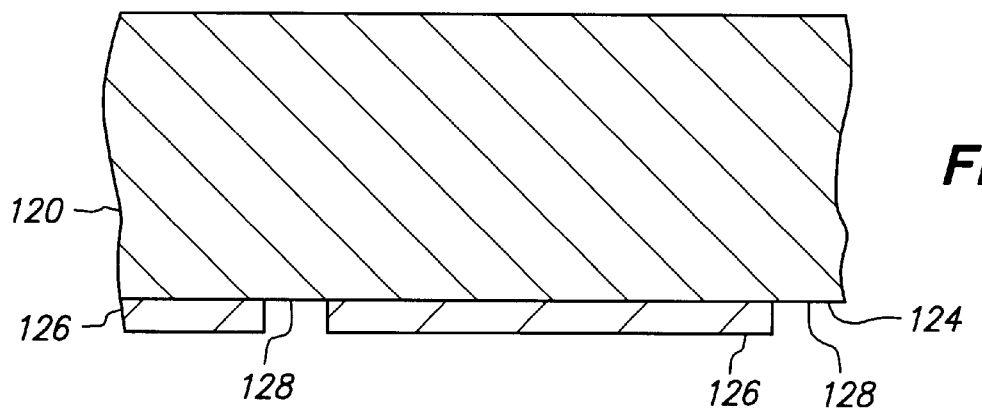
Figure 2C:
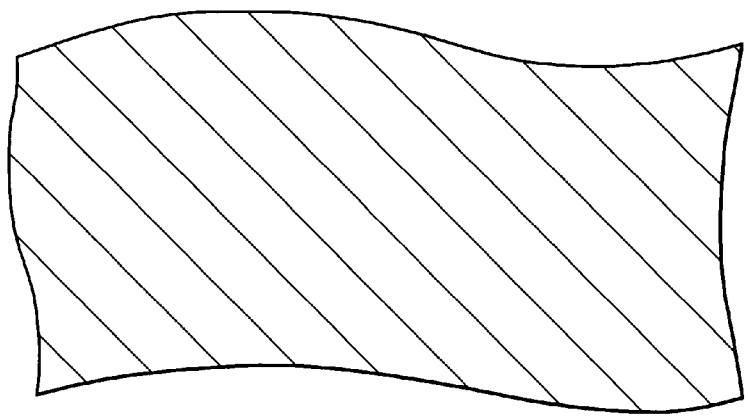
Figure 3C:
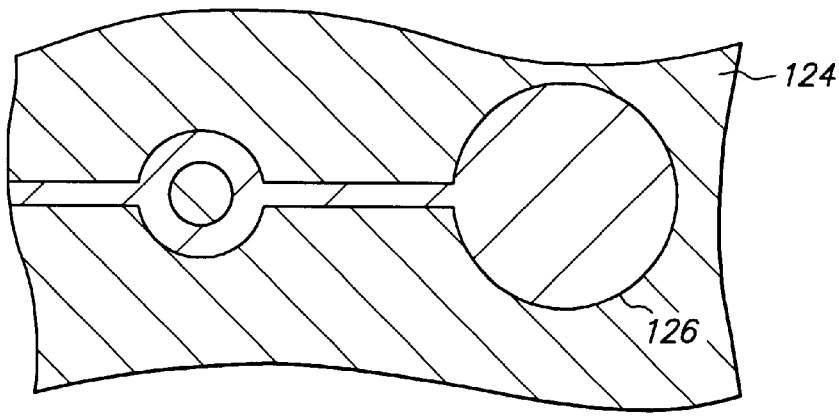

FIGS. 1C, 2C and 3C are cross-sectional, top and bottom views, respectively, of photoresist layer 126 formed on bottom surface 124 of copper foil 120. Photoresist layer 126 is deposited as a continuous layer and then patterned by selectively applying light through a reticle (not shown), applying a developer solution to remove the photoresist portions rendered soluble by the light, and then hard baking, as is conventional. As a result, photoresist layer 126 contains an opening (or openings) that selectively exposes portion 128 of bottom surface 124. Photoresist layer 126 has a thickness of 10 microns.

Figure 1D:
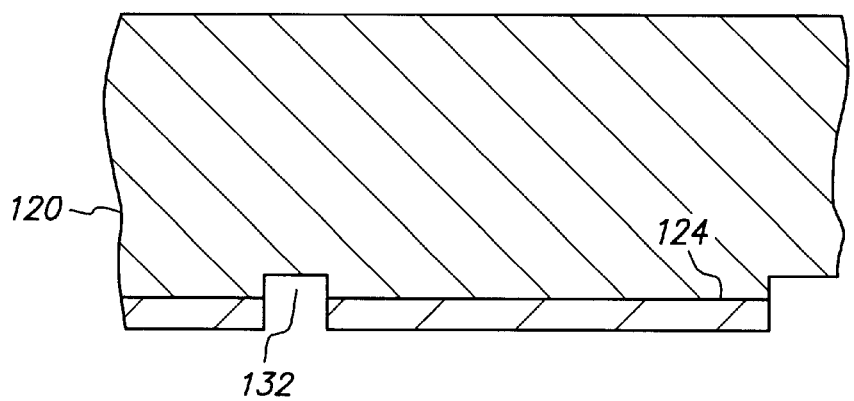
Figure 2D:
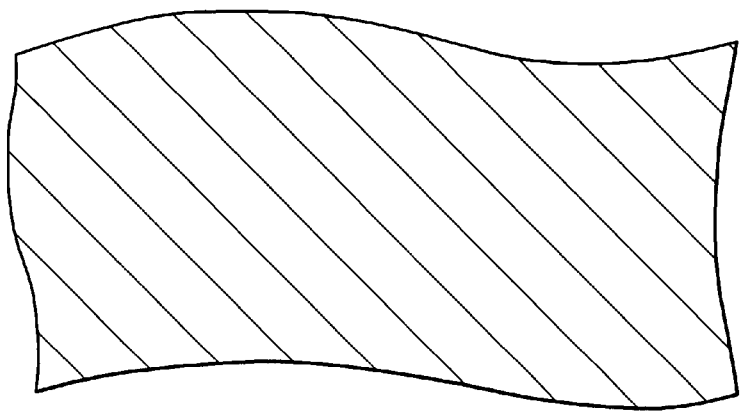
Figure 3D:
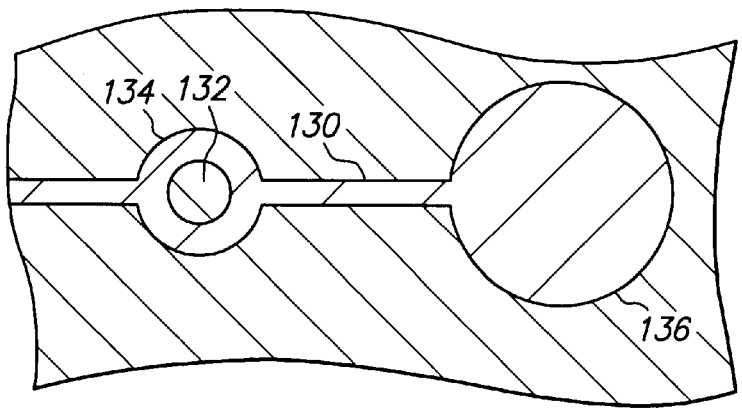

FIGS. 1D, 2D and 3D are cross-sectional, top and bottom views, respectively, of the outer edges of routing line 130 formed in copper foil 120 and dimple 132 formed in routing line 130. The outer edges of routing line 130 and dimple 132 are formed by applying a "back-side" wet chemical etch to exposed portion 128 of bottom surface 124 without applying the wet chemical etch to the opposite or front-side (top surface 122) of copper foil 120. For instance, the wet chemical etch can be sprayed on the back-side, or the front-side can be covered by a mask and then the structure can be dipped in the wet chemical etch. Thus, the outer edges of routing line 130 and dimple 132 are formed subtractively. A suitable wet chemical etch can be provided by a solution containing alkaline ammonia, sulfuric acid with hydrogen peroxide, chromic-sulfuric acid, phosphoric acid with ammonium persulfate, copper sulfate, copper chloride or ferric chloride.

The wet chemical etch does not etch completely through copper foil 120. Rather, the wet chemical etch etches partially through copper foil 120. In this instance, the wet chemical etch removes a lower thickness of 25 microns from copper foil 120 outside routing line 130 and inside routing line 130 at dimple 132. Since copper foil 120 is 150 microns thick, routing line 130 and dimple 132 each have a height of 25 microns and are covered by the unetched 125 micron thick upper portion (or base) of copper foil 120. Thus, routing line 130 and dimple 132 extend to bottom surface 124.

Routing line 130 includes an enlarged annular region 134 that surrounds dimple 132 and an enlarged circular region 136 that provides a base for a pillar that shall be subsequently formed. Routing line 130 has a width of 50 microns, enlarged annular region 134 has an outer diameter (at the periphery) of 150 microns, an inner diameter (at dimple 132) of 50 microns and an annular width (between the inner and outer diameters) of 50 microns ((150−50)/2), and enlarged circular region 136 has a diameter of 400 microns. The optimal etch time for exposing portion 128 of bottom surface 124 to the wet chemical etch in order to form the outer edges of routing line 130 and dimple 132 with the desired dimensions can be established through trial and error.

Figure 1E:
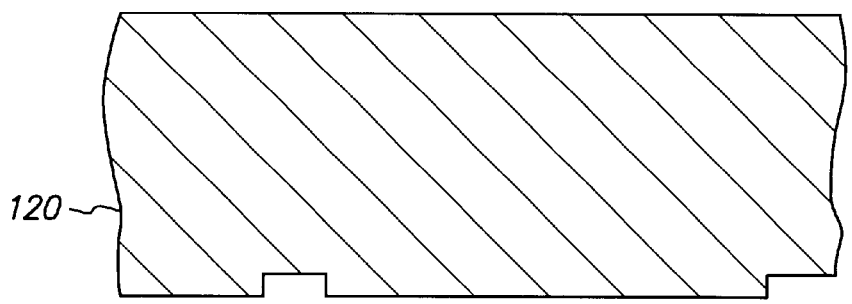
Figure 2E:
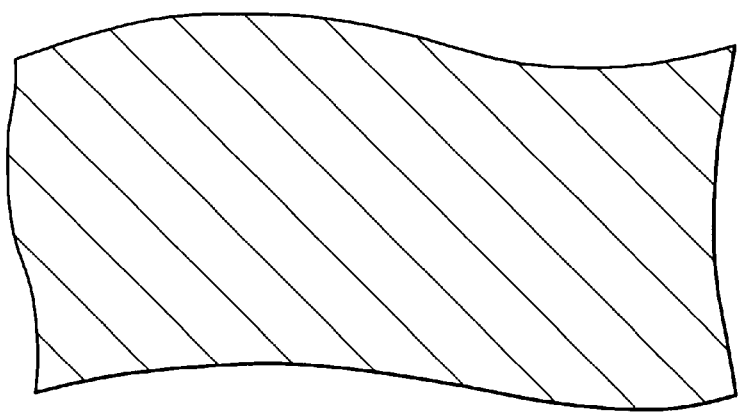
Figure 3E:
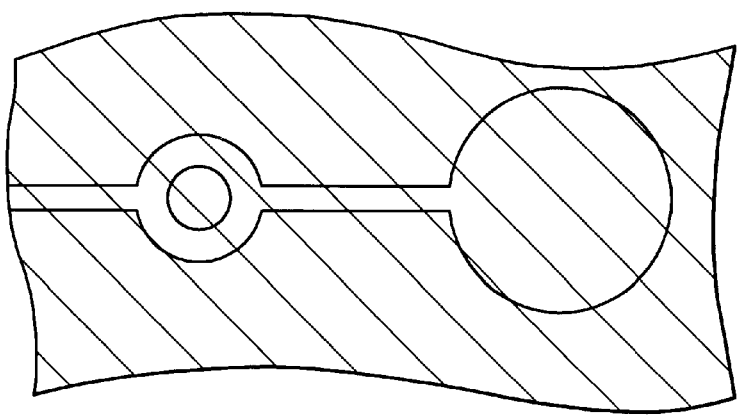

FIGS. 1E, 2E and 3E are cross-sectional, top and bottom views, respectively, of copper foil 120 after photoresist layer 126 is stripped.

Figure 1F:
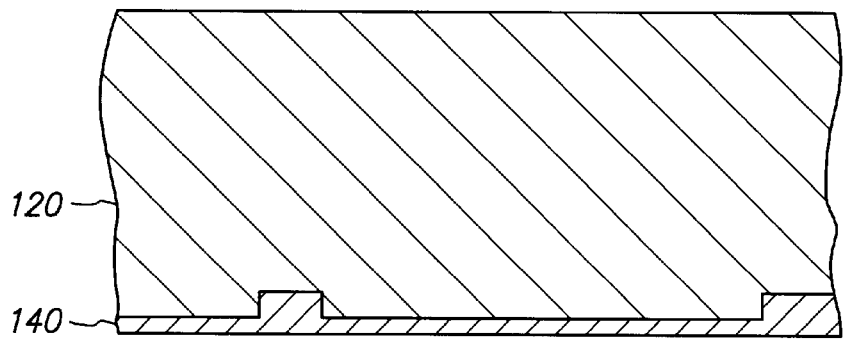
Figure 2F:
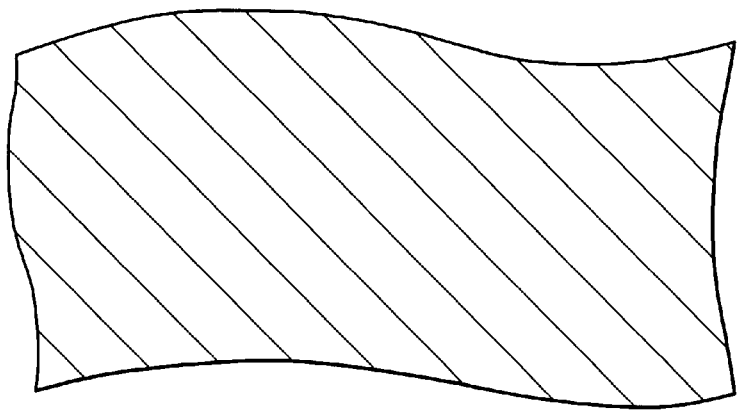
Figure 3F:
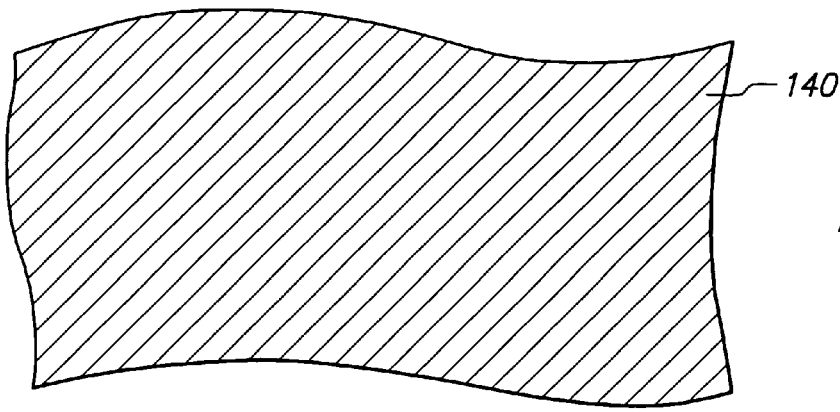

FIGS. 1F, 2F and 3F are cross-sectional, top and bottom views, respectively, of insulative adhesive 140 on bottom surface 124 of copper foil 120. Adhesive 140 covers bottom surface 124, fills the recessed portion that surrounds routing line 130, fills dimple 132, and contacts the bottom of the unetched 125 micron upper portion of copper foil 120. Adhesive 140 is applied as an adhesive paste such as Ablestik ABELBOND 961-2™ using a stencil.

Figure 1G:
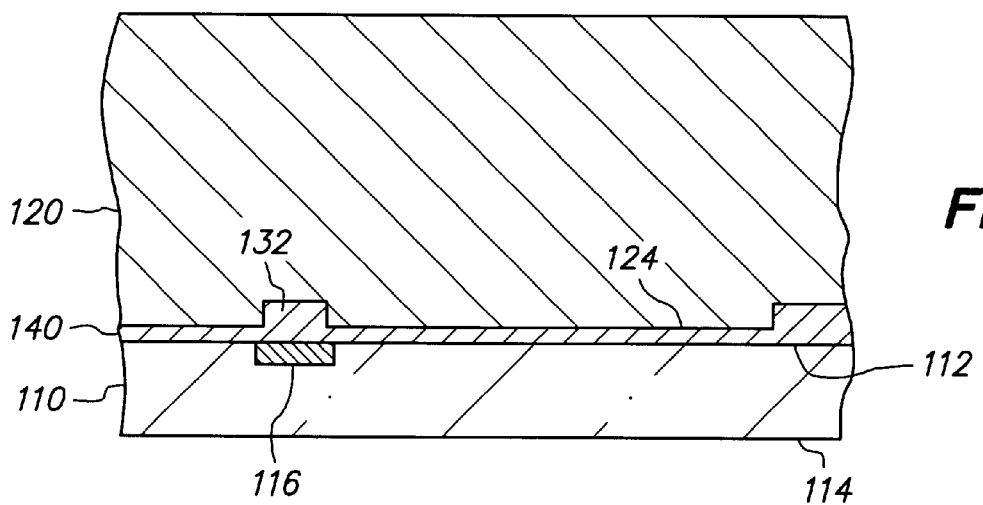
Figure 2G:
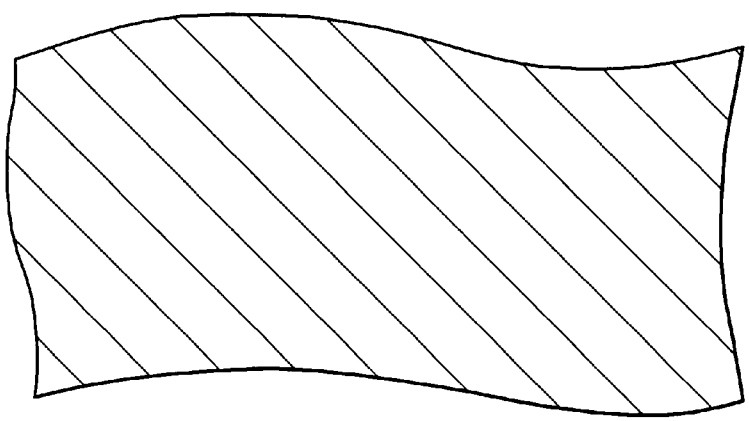
Figure 3G:
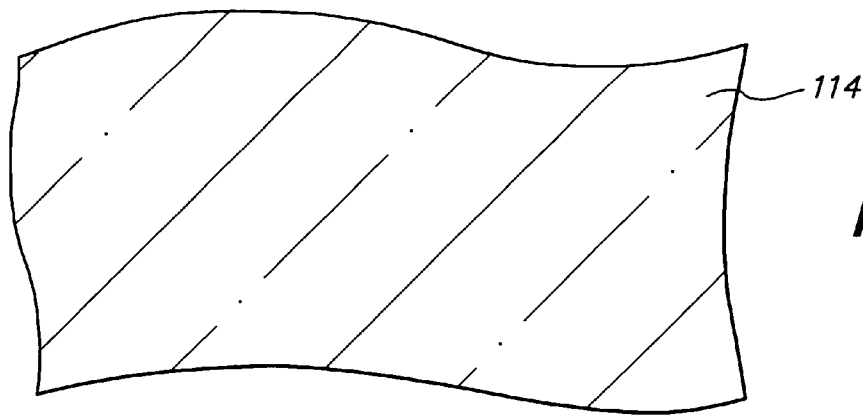

FIGS. 1G, 2G and 3G are cross-sectional, top and bottom views, respectively, of chip 110 mechanically attached to copper foil 120 by adhesive 140. Adhesive 140 is disposed between and contacts upper surface 112 of chip 110 and bottom surface 124 of copper foil 120. Thus, chip 110 and copper foil 120 do not contact one another. Preferably, adhesive 140 is sandwiched between upper surface 112 and bottom surface 124 using relatively low pressure while adhesive 140 is a paste. In addition, chip 110 and copper foil 120 are positioned relative to one another so that pad 116 is aligned with dimple 132. That is, at least a portion of pad 116, and preferably a majority of pad 116, is directly beneath dimple 132. Since the 60 micron length and width of pad 116 exceed the 50 micron diameter of dimple 132, all of pad 116 cannot be directly beneath dimple 132. Instead, a central portion of pad 116 is directly beneath dimple 132 and a peripheral portion of pad 116 is outside dimple 132. Pad 116 and dimple 132 can be aligned using an automated pattern recognition system. Thereafter, adhesive 140 is cured or hardened at relatively low temperature in the range of 100–300° C. to form a solid adhesive layer that is 10 microns thick between upper surface 112 and bottom surface 124 and mechanically fastens chip 110 to copper foil 120. At this stage, dimple 132 is covered from above by copper foil 120 and filled with and covered from below by adhesive 140, pad 116 is covered from above by adhesive 140, and pad 116 is separated from routing line 130 by the thickness of adhesive 140.

Figure 1H:
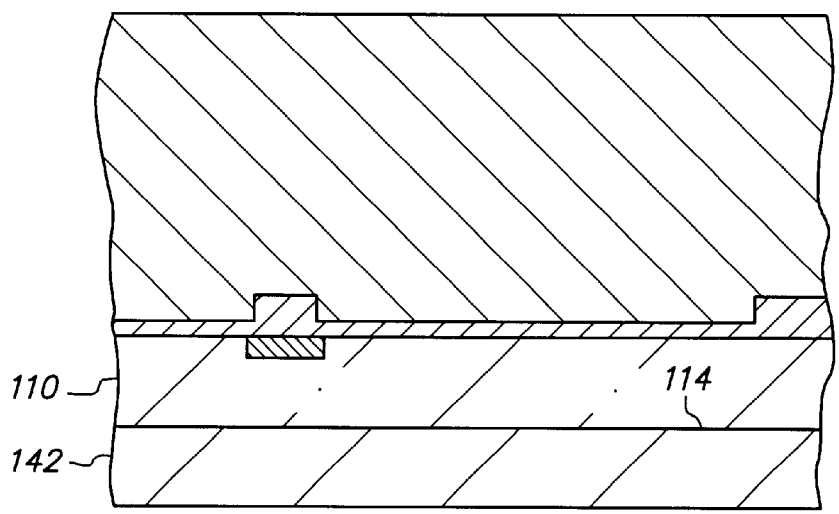
Figure 2H:
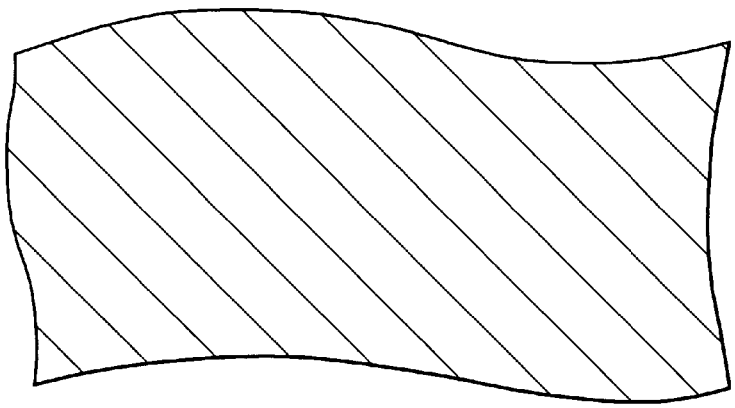
Figure 3H:
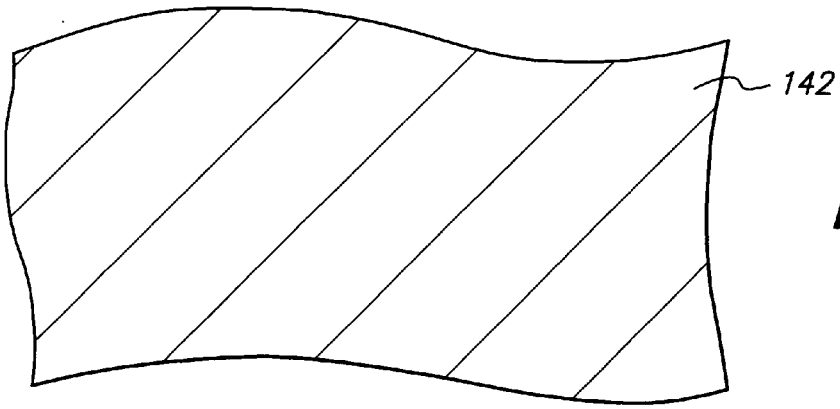

FIGS. 1H, 2H and 3H are cross-sectional, top and bottom views, respectively, of encapsulant 142 formed on lower surface 114 of chip 110. Preferably, encapsulant 142 is initially an epoxy in paste form that includes an epoxy resin, a curing agent, an accelerator and a filler. The filler is an inert material such as silica (powdered fused quartz) that provides thermal coefficient of expansion matching. The epoxy paste is coated onto lower surface 114 and then cured or hardened at relatively low temperature in the range of 100–250° C. to form a solid adherent protective layer. Encapsulant 142 provides back-side environmental protection such as moisture resistance and particle protection for chip 110 and has a thickness of 100 microns.

Figure 1I:
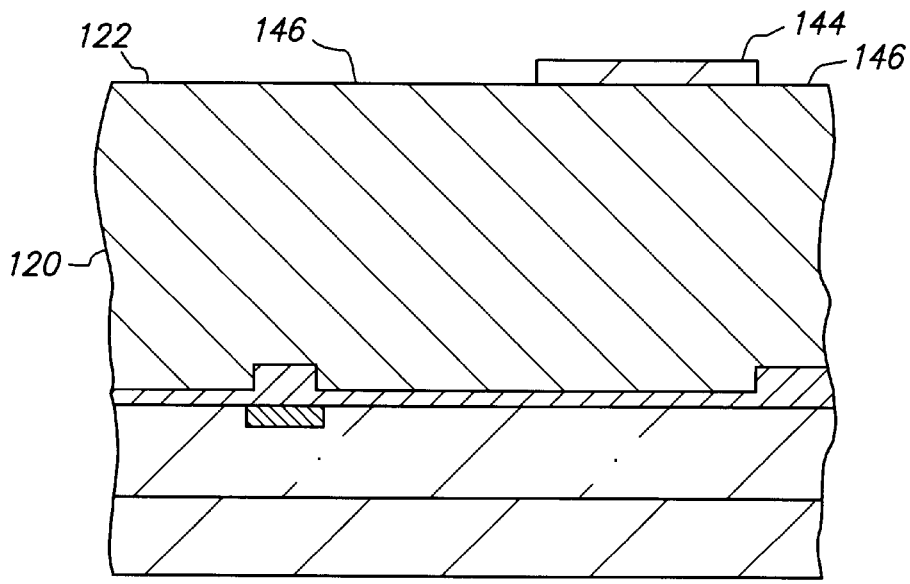
Figure 2I:
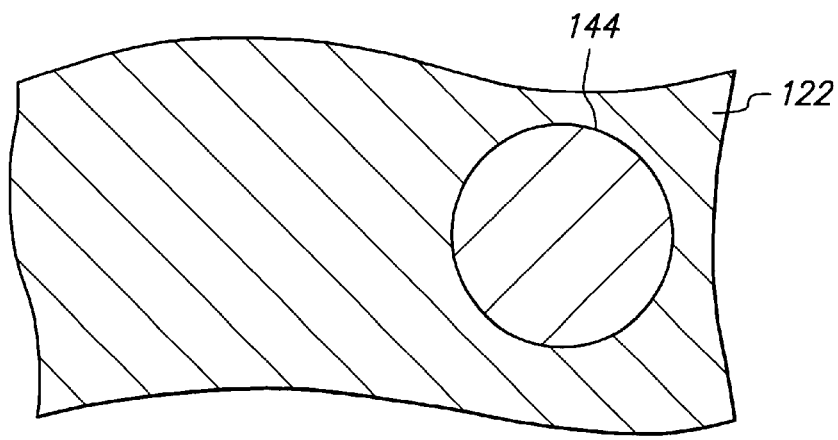
Figure 3I:
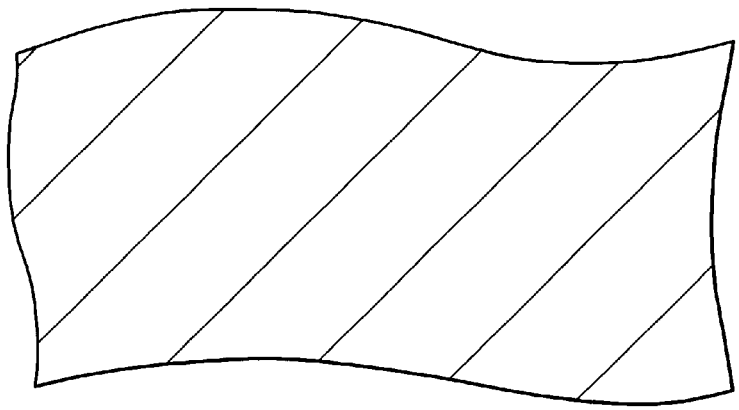

FIGS. 1I, 2I and 3I are cross-sectional, top and bottom views, respectively, of photoresist layer 144 formed on top surface 122 of copper foil 120. Photoresist layer 144 is deposited as a continuous layer and then patterned by selectively applying light through a reticle (not shown), applying a developer solution to remove the photoresist portions rendered soluble by the light, and then hard baking, as is conventional. As a result, photoresist layer 144 contains an opening that selectively exposes portion 146 of top surface 122. Photoresist layer 144 has a thickness of 10 microns.

Figure 1J:
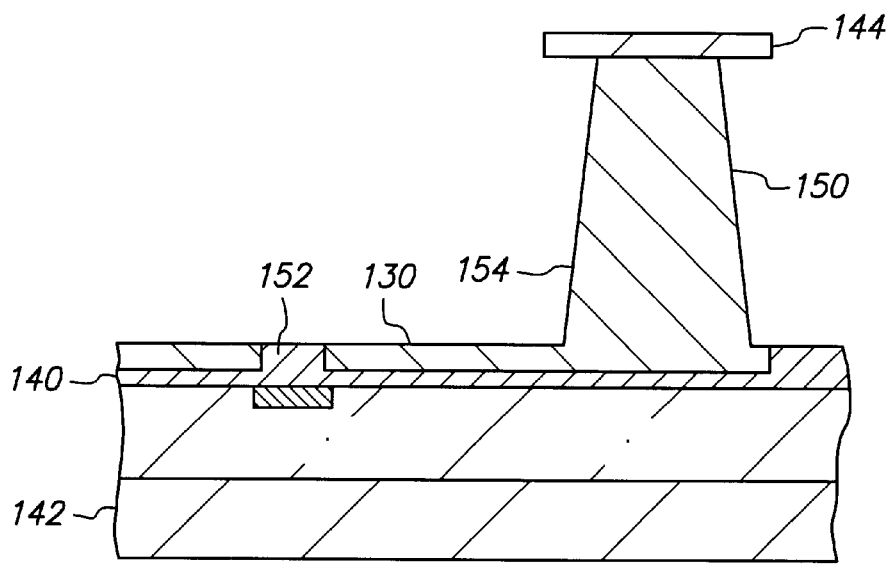
Figure 2J:
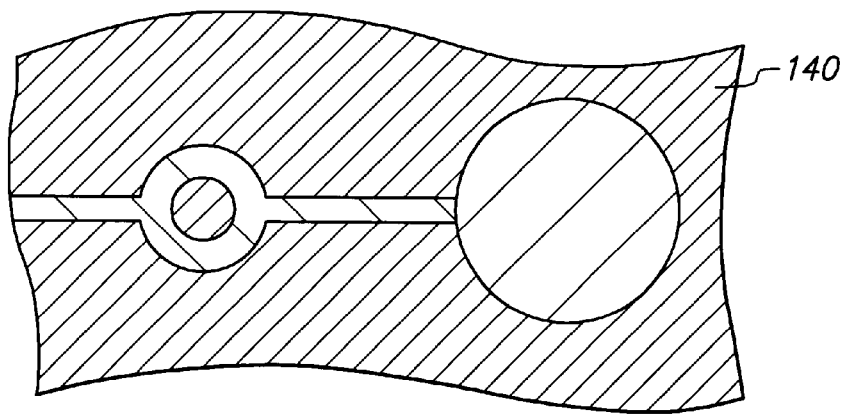
Figure 3J:
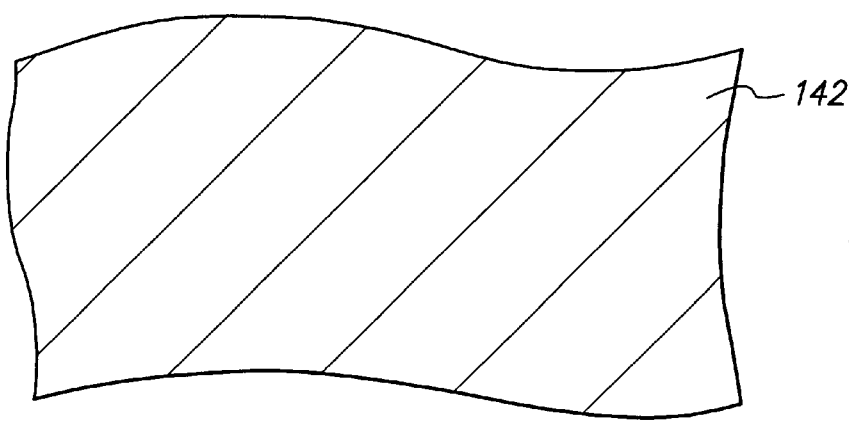

FIGS. 1J, 2J and 3J are cross-sectional, top and bottom views, respectively, of the partially completed assembly after pillar 150 is formed in copper foil 120, the top surface of routing line 130 is formed, and dimple 132 is converted into through-hole 152 in routing line 130. The top surface of routing line 130, pillar 150 and through-hole 152 are formed by applying a "front-side" wet chemical etch to portion 146 of top surface 122 without applying the wet chemical etch to the opposite or back-side of copper foil 120. For instance, the structure can be dipped in the wet chemical etch since the back-side is protected by encapsulant 142. Thus, pillar 150 is formed subtractively. The wet chemical etch is highly selective of copper with respect to epoxy. Therefore, no appreciable amount of encapsulant 142 is removed. Likewise, after the wet chemical etch etches through portion 146 of top surface 122 and contacts adhesive 140 outside routing line 130 and beneath through-hole 152, no appreciable amount of adhesive 140 is removed. A suitable wet chemical etch can be provided by a solution containing alkaline ammonia, sulfuric acid with hydrogen peroxide, chromic-sulfuric acid, phosphoric acid with ammonium persulfate, copper sulfate, copper chloride or ferric chloride.

The wet chemical etch does not etch completely through copper foil 120. Rather, the wet chemical etch etches partially through copper foil 120. In this instance, the wet chemical etch removes a 125 micron thick upper portion of copper foil 120—the same upper portion that was not reached by the earlier back-side etch. Similarly, the wet chemical etch has no appreciable affect on the 25 micron thick lower portion of copper foil 120—the same lower portion that was subjected to the earlier back-side etch. Since the recessed portion of copper foil 120 outside routing line 130 was 125 microns thick, the wet chemical etch removes the portions of copper foil 120 outside routing line 130. In addition, since the portion of copper foil 120 directly above routing line 130 and dimple 132 was 125 microns, the wet chemical etch forms a top surface of routing line 130 that is contiguous with the outer edges of routing line 130 and converts dimple 132 into through-hole 152 that extends between the top and bottom surfaces of routing line 130. Thus, routing line 130 and dimple 132 each have a thickness or height of 25 microns. Pillar 150 extends to top surface 122 whereas routing line 130 and through-hole 152 do not. Furthermore, since the wet chemical etch undercuts (i.e., laterally etches) copper foil 120 beneath photoresist layer 144, pillar 150 tapers inwardly with increasing height. A suitable taper is between 45 and slightly less than 90 degrees, such as approximately 75 degrees. Pillar 150 has a diameter of 400 microns at its base at enlarged circular region 136 that decreases with increasing height and is narrowest at top surface 122. Furthermore, pillar 150 has a flat top surface at what remains of top surface 122. The optimal etch time for exposing portion 146 of top surface 122 to the wet chemical etch in order to form routing line 130, pillar 150 and through-hole 152 with the desired dimensions can be established through trial and error.

Pillar 150 is horizontally offset from through-hole 152, and routing line 130 provides horizontal routing (fan-in or fan-out) between pillar 150 and through-hole 152. Routing line 130 and pillar 150 in combination provide conductive trace 154 that is adapted for providing horizontal and vertical routing between pad 116 and a terminal on a printed circuit board (not shown) above top surface 122 in a subsequent next level assembly. Advantageously, conductive trace 154 is a single continuous copper segment that is devoid of plated copper. At this stage, adhesive 140 provides critical mechanical support for conductive trace 154 which would otherwise be a dangling lead.

Figure 1K:
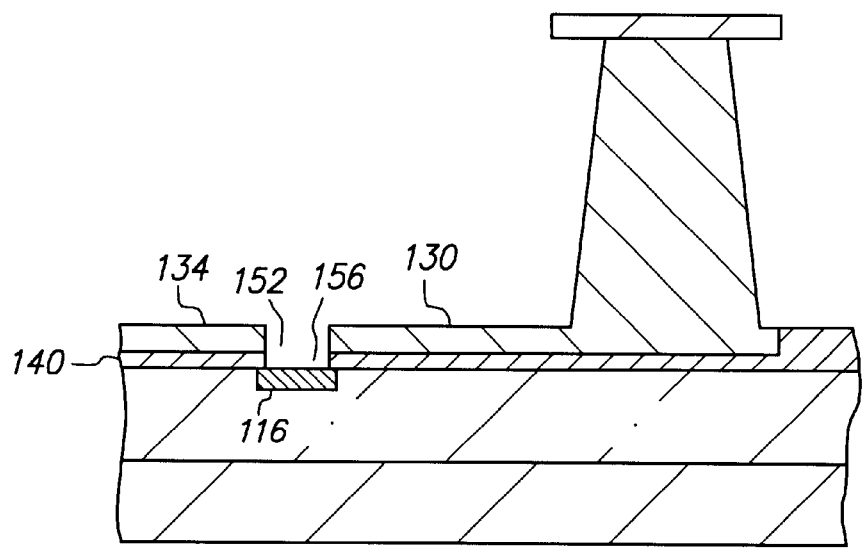
Figure 2K:
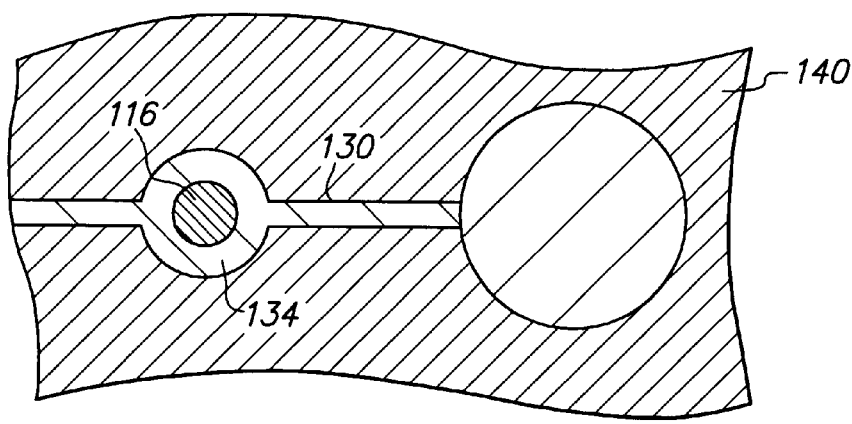
Figure 3K:
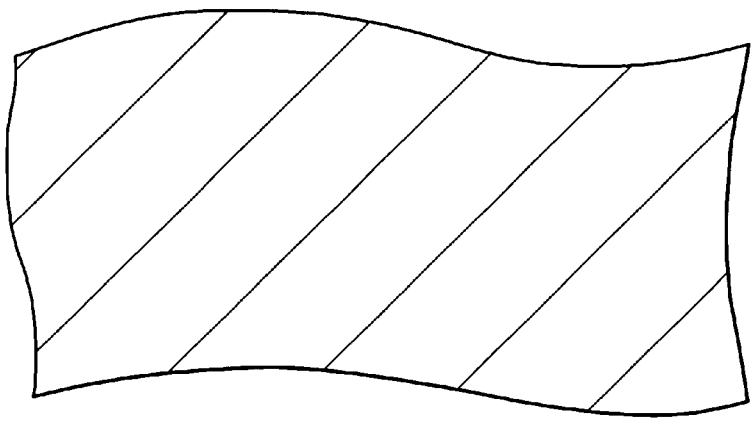

FIGS. 1K, 2K and 3K are cross-sectional, top and bottom views, respectively, of opening 156 formed in adhesive 140. In particular, any adhesive 140 in through-hole 152 is removed, and a portion of adhesive 140 directly below through-hole 152 is also removed to form opening 156. As a result, the combination of through-hole 152 and opening 156 extend through routing line 130 and adhesive 140, respectively, and expose pad 116. Opening 156 can be provided by applying a suitable etch that is highly selective of adhesive 140 with respect to pad 116 and conductive trace 154. The preferred etch depends on the thickness of adhesive 140.

In this instance, a selective laser etch is applied. Using projection laser ablation, a metal mask (not shown) is positioned above top surface 122 such that an opening in the metal mask is aligned with through-hole 152, and a laser is directed to the side of the metal mask opposite top surface 122. Accordingly, the metal mask targets the laser at through-hole 152. After the laser removes whatever adhesive 140 is inside or directly below through-hole 152, the laser strikes pad 116. In addition, the laser strikes a portion of the top surface of enlarged annular region 134 adjacent to through-hole 152 due to registration and alignment inaccuracies. However, the laser does not strike outside enlarged annular region 134, nor does the laser deform or remove an appreciable amount of pad 116 or enlarged annular region 134. Instead, pad 116 and enlarged annular region 134 provide an etch stop for the laser. As a result, the laser essentially provides an extension or pattern transfer of through-hole 152 through adhesive 140. Through-hole 152 and opening 156 have essentially identical diameters, are axially aligned with one another, and together expose pad 116.

Figure 1L:
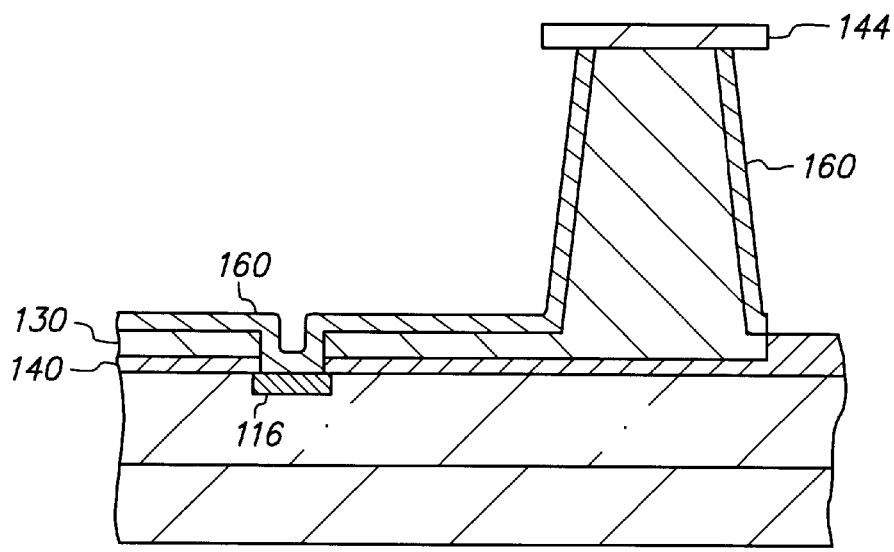
Figure 2L:
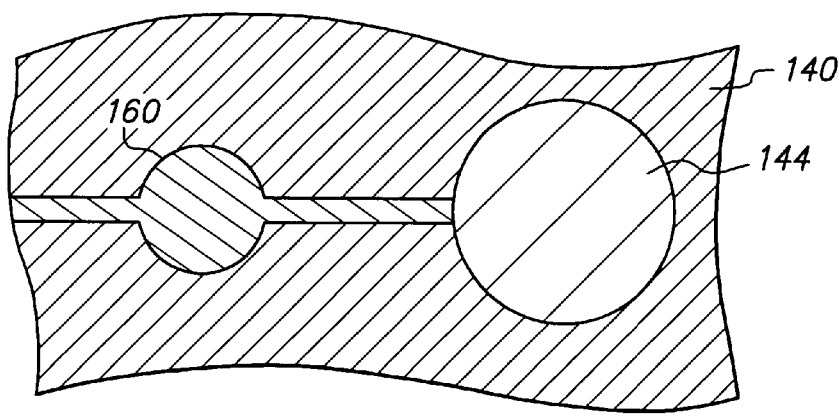
Figure 3L:
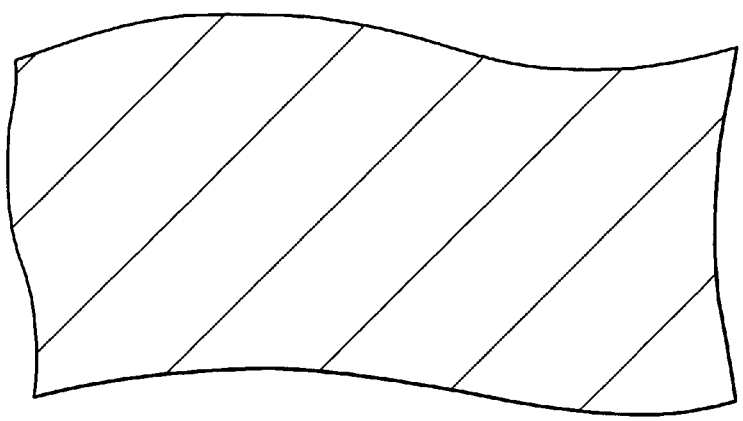

FIGS. 1L, 2L and 3L are cross-sectional, top and bottom views, respectively, of the partially completed assembly after connection joint 160 is formed. Connection joint 160 is formed in through-hole 152, extends through opening 156 in adhesive 140, and contacts pad 116 and routing line 130, thereby electrically connecting pad 116 and routing line 130. In particular, connection joint 160 contacts the central portion of pad 116 directly beneath through-hole 152, the sidewalls of through-hole 152, the top surface of routing line 130, and the sidewalls of pillar 150. However, photoresist layer 144 prevents connection joint 160 from contacting top surface 122.

For illustration purposes, connection joint 160 is formed by an electroplating operation. Initially, a plating bus (not shown) is connected to the portion of routing line 130 that extends from the side of enlarged annular region 134 opposite to enlarged circular region 136, current is applied to the plating bus from an external power source, and the assembly is submerged in an electrolytic copper plating bath such as Sel-Rex CUBATH M™ at room temperature. As a result, connection joint 160 begins to electroplate (or grow) on conductive trace 154, including inside through-hole 152, but not on pad 116 since it is not connected to the plating bus. However, as the electroplating operation continues, connection joint 160 extends through opening 156 in adhesive 140 and contacts pad 116, thereby connecting pad 116 to the plating bus. As a result, connection joint 160 also begins to plate on pad 116. Advantageously, after contact between connection joint 160 and pad 116 occurs, connection joint 160 begins to plate on the entire central region of pad 116 directly beneath through-hole 152. The electroplating operation continues until connection joint 160 has the desired thickness, such as 10 to 25 microns. After the electroplating operation is completed, connection joint 160 has a bowl-shape inside through-hole 152, is the only electrical conductor in through-hole 152, and provides a robust, permanent electrical connection between pad 116 and conductive trace 154. After the assembly is removed from the electrolytic bath it is rinsed in distilled water to remove contaminants.

Figure 1M:
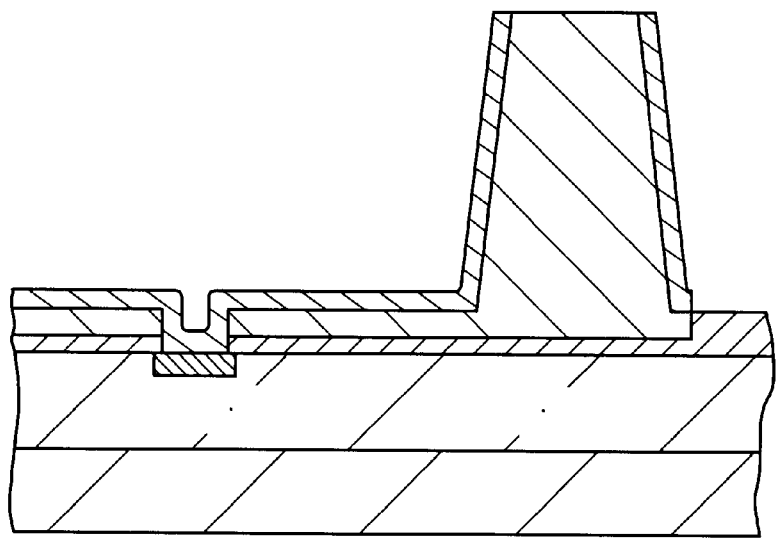
Figure 2M:
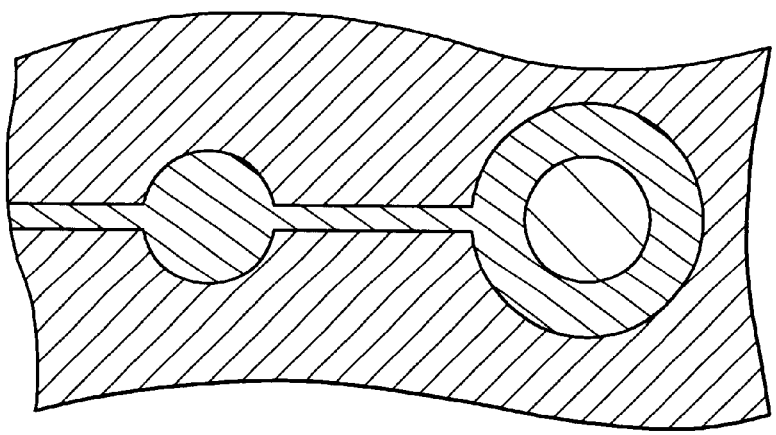
Figure 3M:
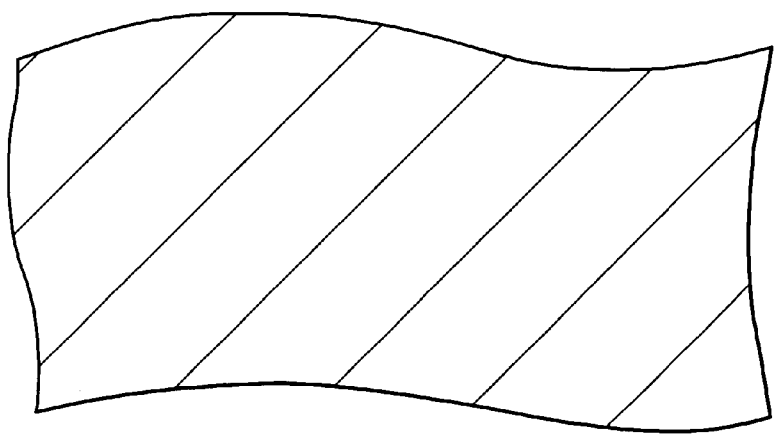

FIGS. 1M, 2M and 3M are cross-sectional, top and bottom views, respectively, of the partially completed assembly after photoresist layer 144 is stripped.

Figure 1N:
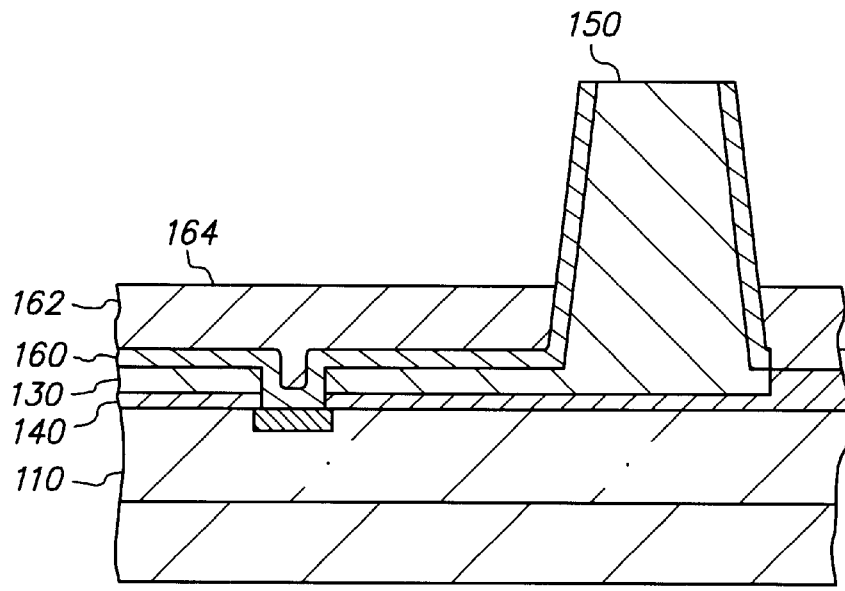
Figure 2N:
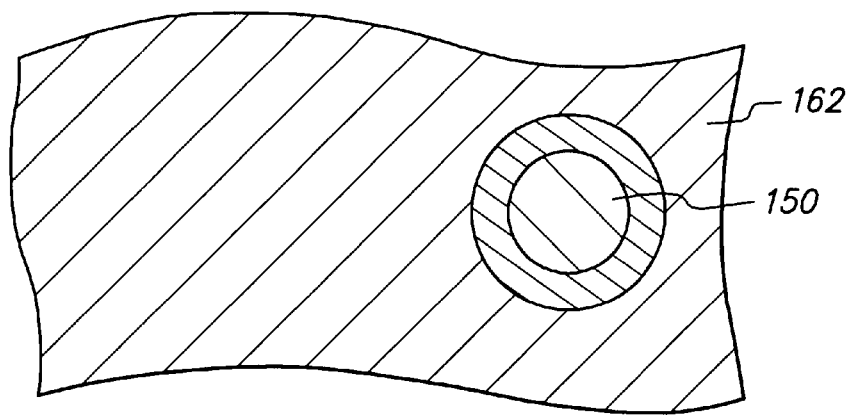
Figure 3N:
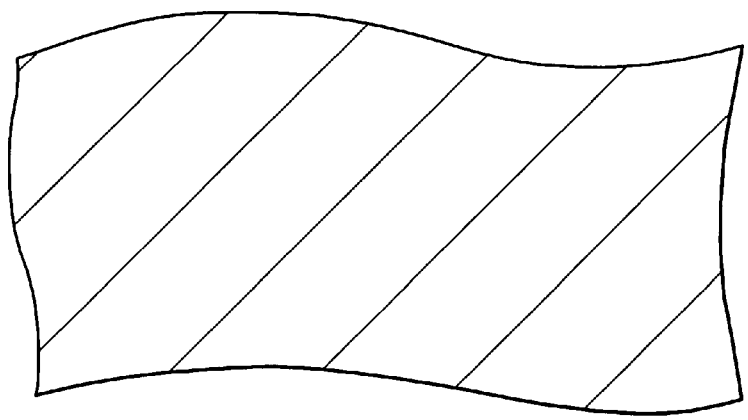
Figure 5A:
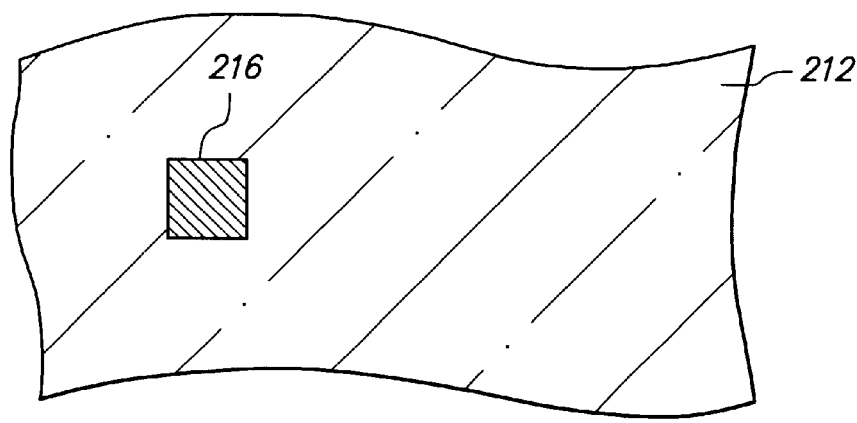
FIGS. 5A–5R are top plan views corresponding to FIGS. 4A–4R, respectively.
Figure 6A:
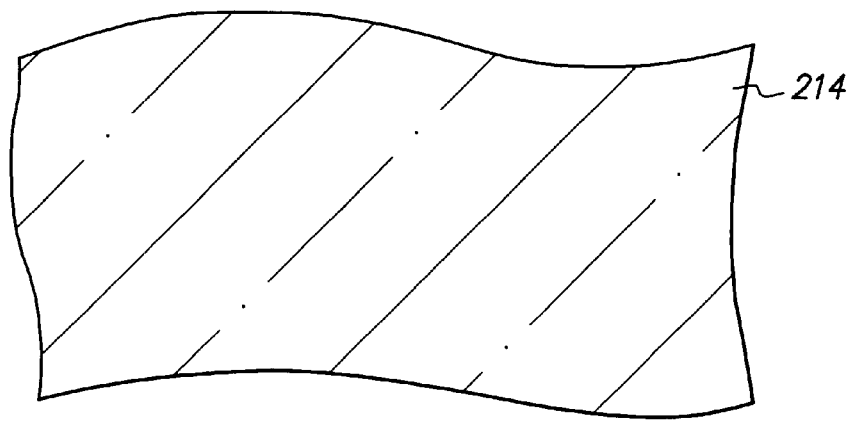
FIGS. 6A–6R are bottom plan views corresponding to FIGS. 4A–4R, respectively.
Figure 5B:
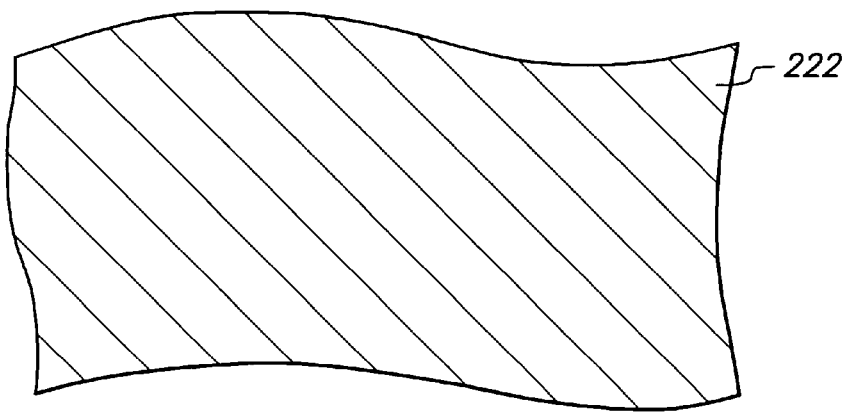
Figure 6B:
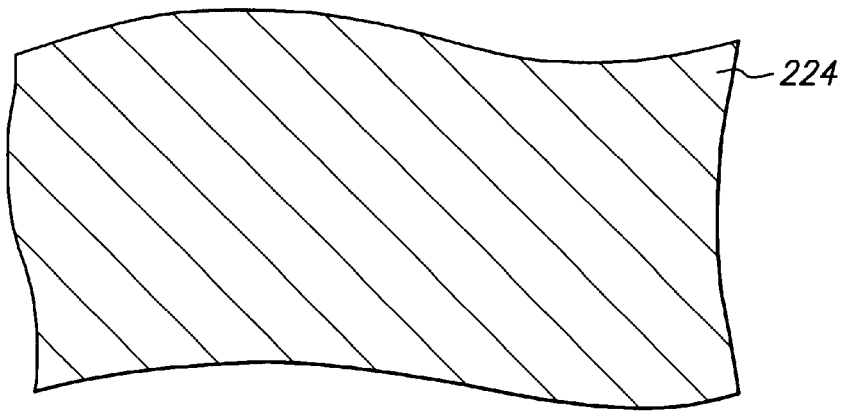
Figure 5C:
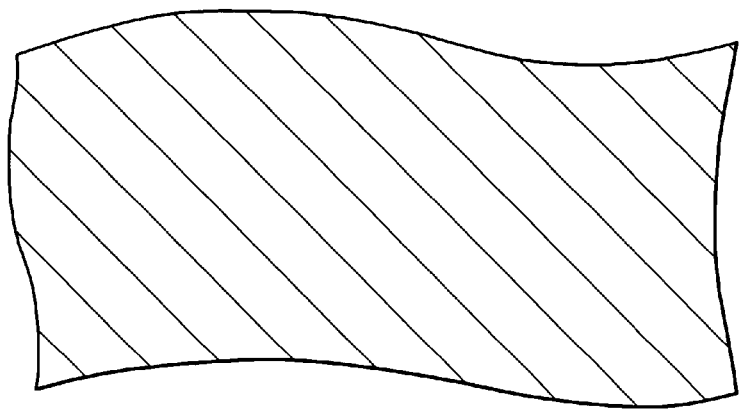
Figure 6C:
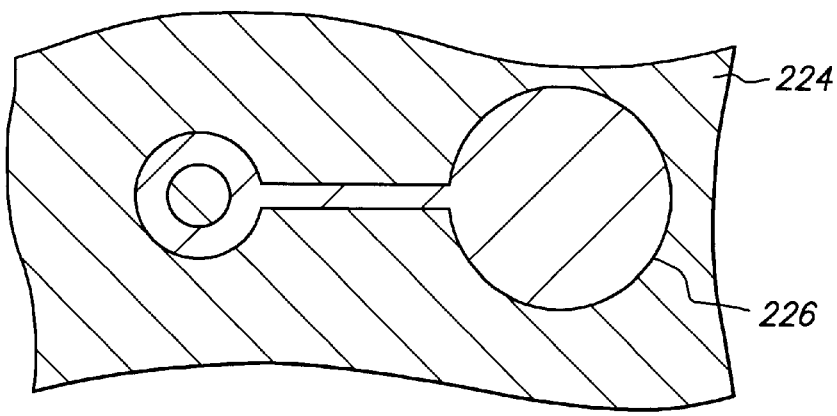
Figure 5D:
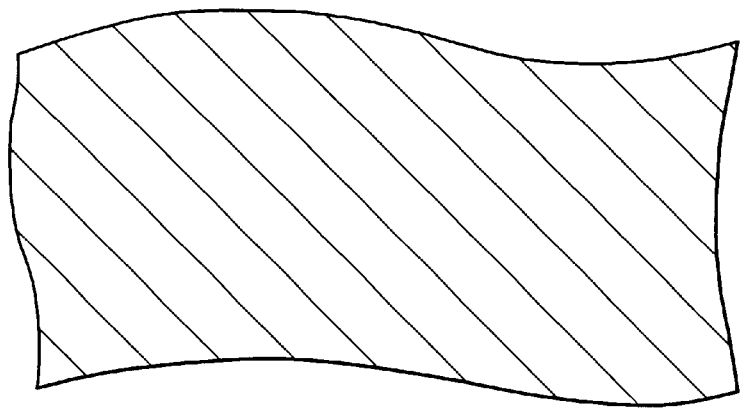
Figure 6D:
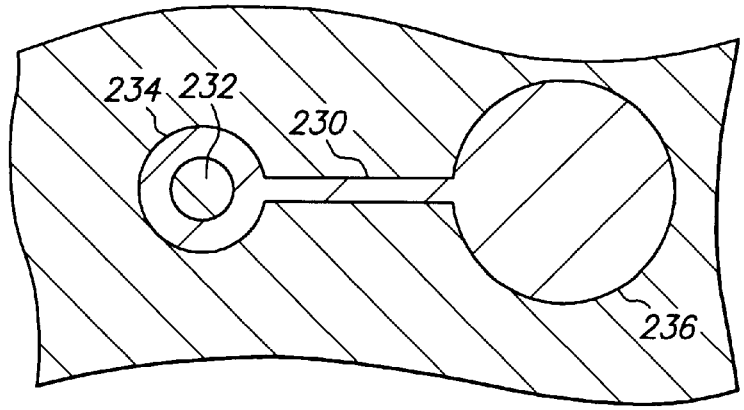
Figure 5E:
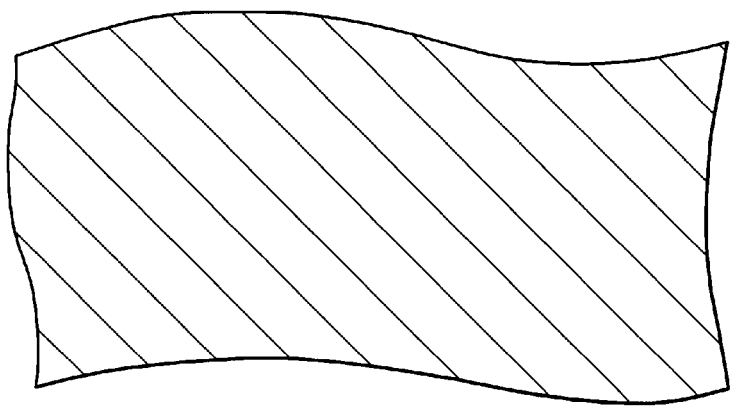
Figure 6E:
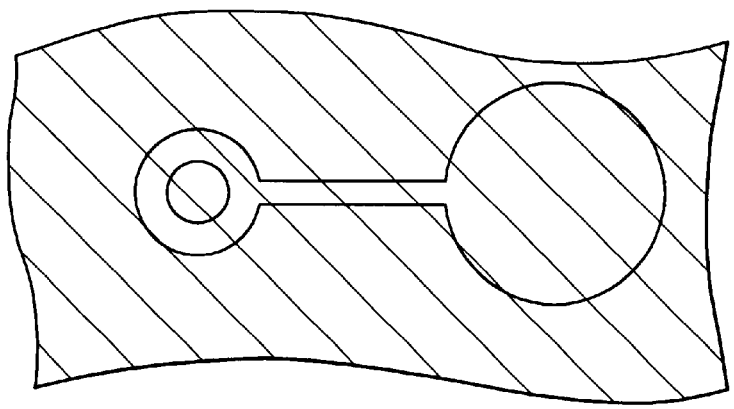
Figure 5F:
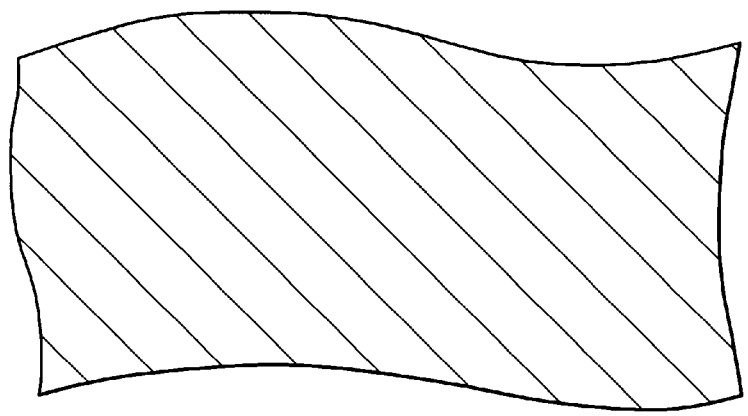
Figure 6F:
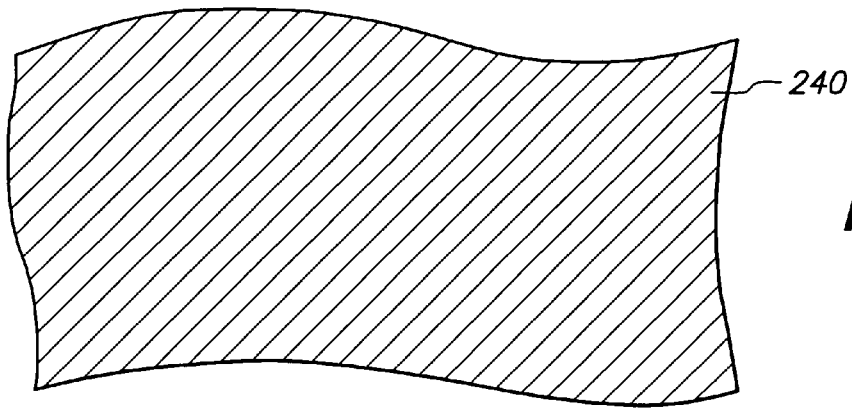
Figure 5G:
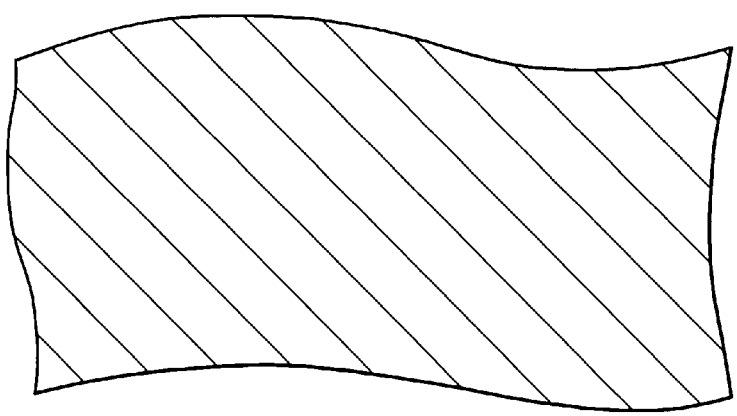
Figure 6G:
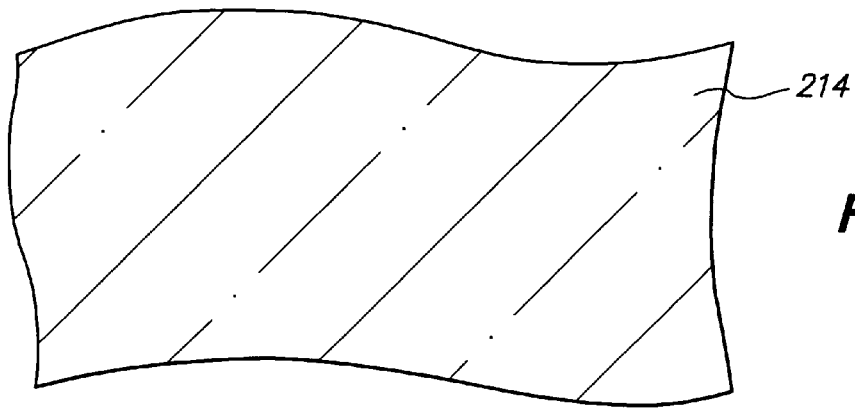
Figure 5H:
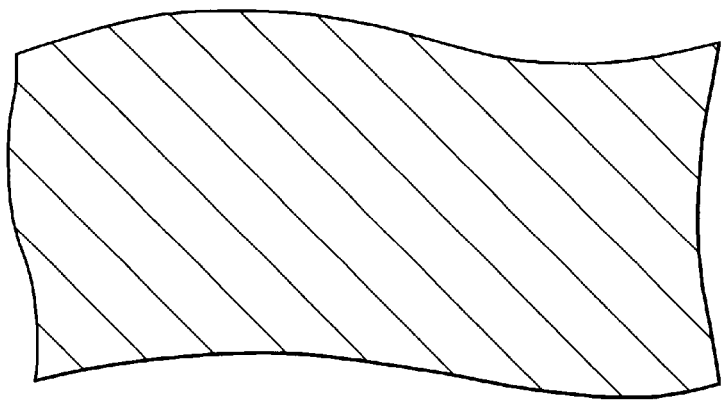
Figure 6H:
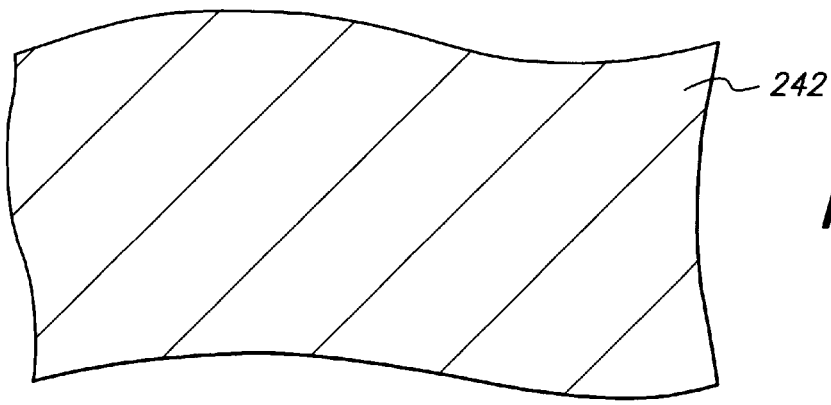

FIGS. 1N, 2N and 3N are cross-sectional, top and bottom views, respectively, of insulative base 162 formed over routing line 130 and through-hole 152. Insulative base 162 is relatively flat and has a thickness of 50 microns. Insulative base 162 contacts and adheres to adhesive 140 and connection joint 160. Although insulative base 162 covers routing line 130 and through-hole 152 and a lower portion of pillar 150, an upper portion of pillar 150 extends 75 microns above insulative base 162. Thus, insulative base 162 does not extend to top surface 122 or bottom surface 124. Preferably, insulative base 162 is initially an epoxy in paste form that includes an epoxy resin, a curing agent, an accelerator and a filler. The filler is an inert material, such as silica (powdered fused quartz), that improves thermal conductivity, thermal shock resistance, and thermal coefficient of expansion matching. The epoxy paste is selectively coated over routing line 130 but not top surface 122 using screen printing, and then the epoxy is cured or hardened at relatively low temperature in the range of 100–250° C. to form a solid adherent insulative layer that provides additional mechanical strength for the support circuit and protection for connection joint 160 in the vicinity of pad 116 and through-hole 152.

At this stage, the manufacture of support circuit 164, which includes conductive trace 154 and insulative base 162, can be considered complete. Support circuit 164 is mechanically and electrically coupled to chip 110 by adhesive 140 and connection joint 160, respectively, to form a semiconductor chip assembly. Support circuit 164 includes other conductive traces embedded in insulative base 162, and only a single conductive trace 154 is shown for convenience of illustration. The conductive traces are each connected to a respective pad on chip 110 by a respective connection joint in a respective through-hole. If desired, solder balls can be screen printed on the tops of the pillars to provide connections to the next level assembly. Finally, chip 110 is singulated from other chips on the wafer, thereby singulating, the assembly from other assemblies, so that the assembly forms a chip size package.

The conductive traces are electrically isolated from one another by insulative base 162. The conductive traces can be severed from one another during singulation if they are not connected by plating bus circuitry on chip 110. However, the plating bus and related circuitry on chip 110 can be disconnected or severed from conductive trace 154 after forming connection joint 160 but before forming insulative base 162 using an additional photolithography step in order to reduce stress at the interface of pad 116 and connection joint 160 that might otherwise occur if conductive trace 154 is severed at the edge of chip 110 during singulation.

FIGS. 4A–4R, 5A–5R and 6A–6R are cross-sectional, top and bottom views, respectively, of a method of manufacturing a semiconductor chip assembly in accordance with a second embodiment of the present invention. In this embodiment, the chip is singulated from other chips on the wafer before it is attached to the copper foil, and the semiconductor chip assembly is a grid array rather than a chip size package. For purposes of brevity, any description in the first embodiment is incorporated herein insofar as the same is applicable, and the same description need not be repeated. Likewise, elements of the second embodiment similar to those in the first embodiment have corresponding reference numerals indexed at two-hundred rather than one-hundred. For instance, chip 210 corresponds to chip 110, copper foil 220 corresponds to copper foil 120, etc.

FIGS. 4A–4H, 5A–5H and 6A–6H depict manufacturing steps generally similar to those in FIGS. 1A–1H, 2A–2H and 3A–3H, except as follows.

First, chip 210 is singulated from other chips on the wafer before it is mechanically attached to copper foil 220 by adhesive 240.

Second, routing line 230 does not extend from the side of enlarged annular region 234 opposite to enlarged circular region 236. In the first embodiment, routing line 130 extends from the side of enlarged annular region 134 opposite to enlarged circular region 136 to reach a plating bus so that connection joint 160 can be formed by electroplating. In the second embodiment, routing line 230 need not extend to an external plating bus since, as described below, conductive trace 254 is not separated from the other conductive traces in copper foil 220 when connection joint 260 is formed. In other words, when connection joint 260 is formed, the etch that forms the pillars and separates the conductive traces from one another has yet to be performed, the plating bus is connected to top surface 222 of copper foil 220, and the plating current is available to all regions of copper foil 220. As a result, the individual routing lines need not extend to a plating bus at the edge of chip 210 because the 125 micron thick upper portion of copper foil 220 is still integral with the routing lines when the connection joints are formed. Advantageously, routing line 230 need not extend to and be exposed at the edge of the assembly, or have a portion at the edge of the assembly removed by a separate photolithography step.

Third, chip 210 has a smaller surface area than that of copper foil 220 and is positioned within the surface area of copper foil 220 (or support circuit 264), as is conventional for BGA and LGA packages.

Fourth, encapsulant 242 contacts and protects the outer edges of chip 210. In the first embodiment, the four outer edges of chip 110 are not exposed until singulation occurs. In the second embodiment, the four outer edges of chip 210 between top surface 212 and bottom surface 214 are exposed when encapsulant 242 is applied, chip 210 is positioned within the surface area of copper foil 220, and encapsulant 242 contacts the outer edges and bottom surface 214 of chip 210 and the surface of adhesive 240 opposite to copper foil 220 and outside chip 210. Advantageously, encapsulant 242 provides environmental protection for the outer edges as well as bottom surface 214 of chip 210.

Figure 4A:
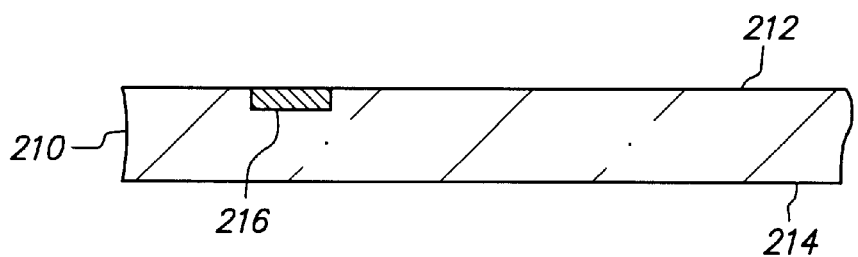
FIGS. 4A–4R are cross-sectional views showing a method of manufacturing a semiconductor chip assembly in accordance with a second embodiment of the present invention.
Figure 4B:
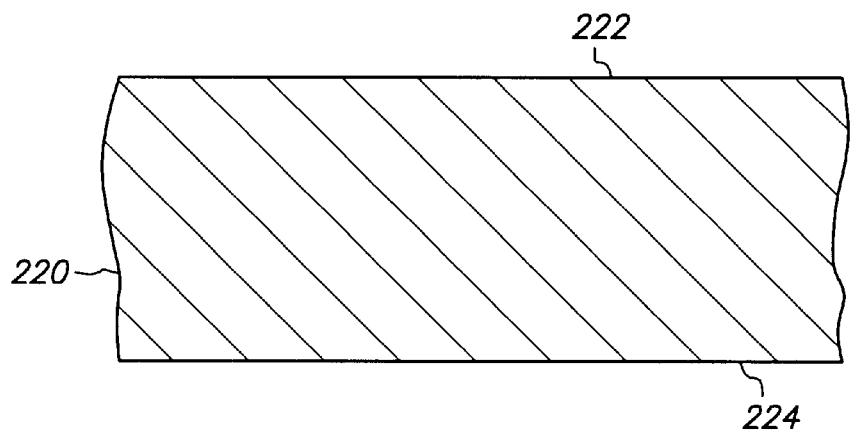
Figure 4C:
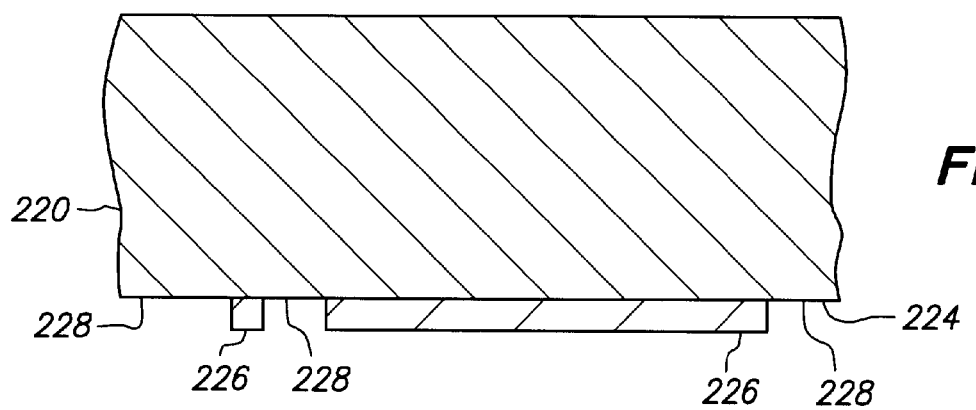
Figure 4D:
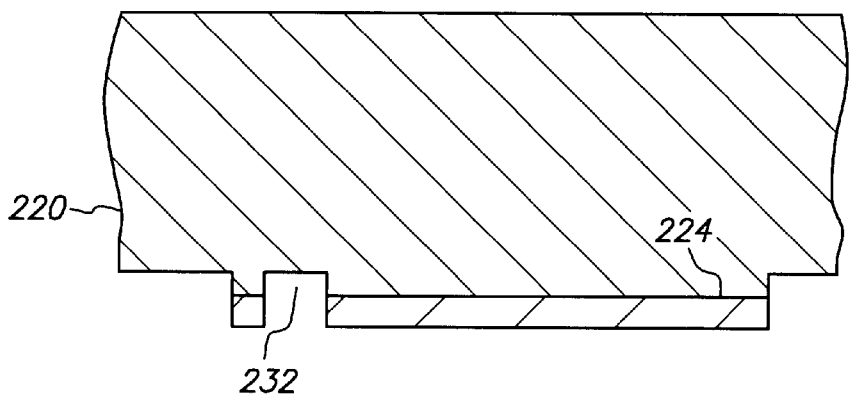
Figure 4E:
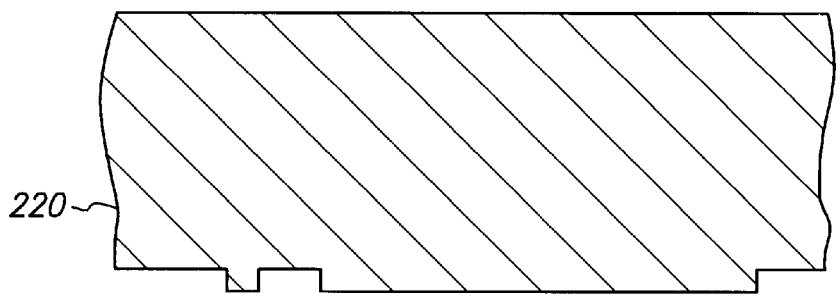
Figure 4F:
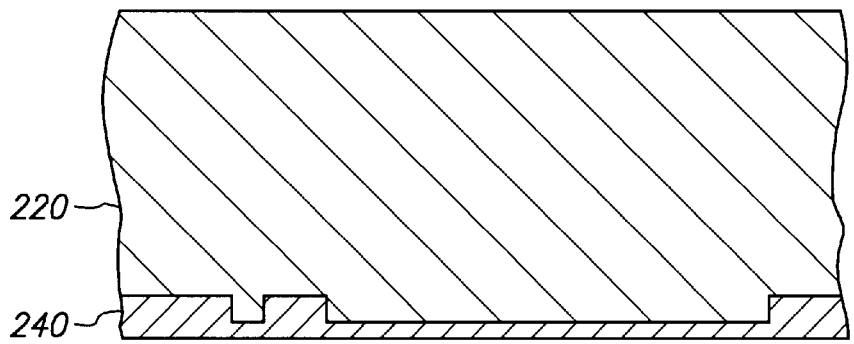
Figure 4G:
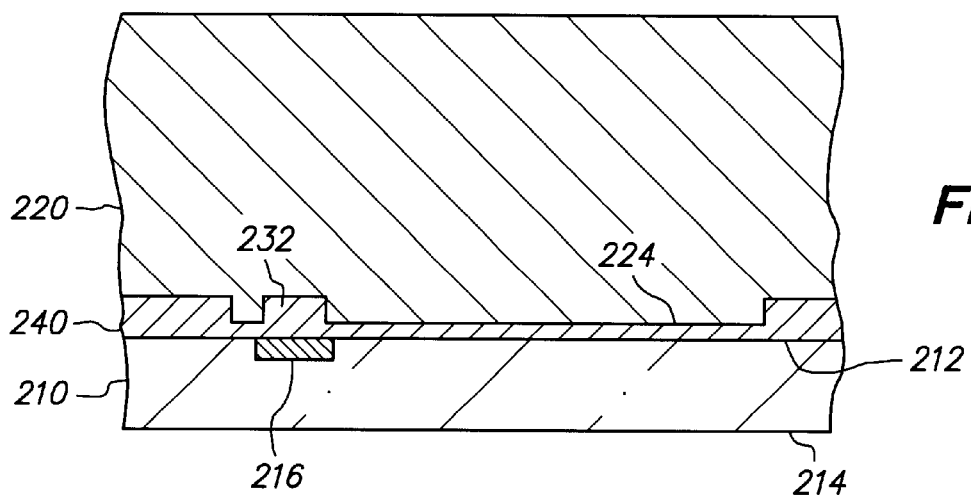
Figure 4H:
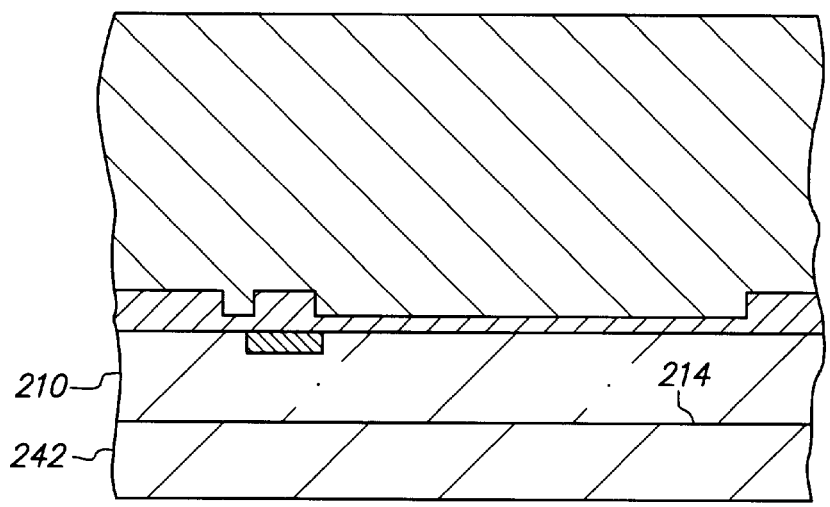
Figure 4I:
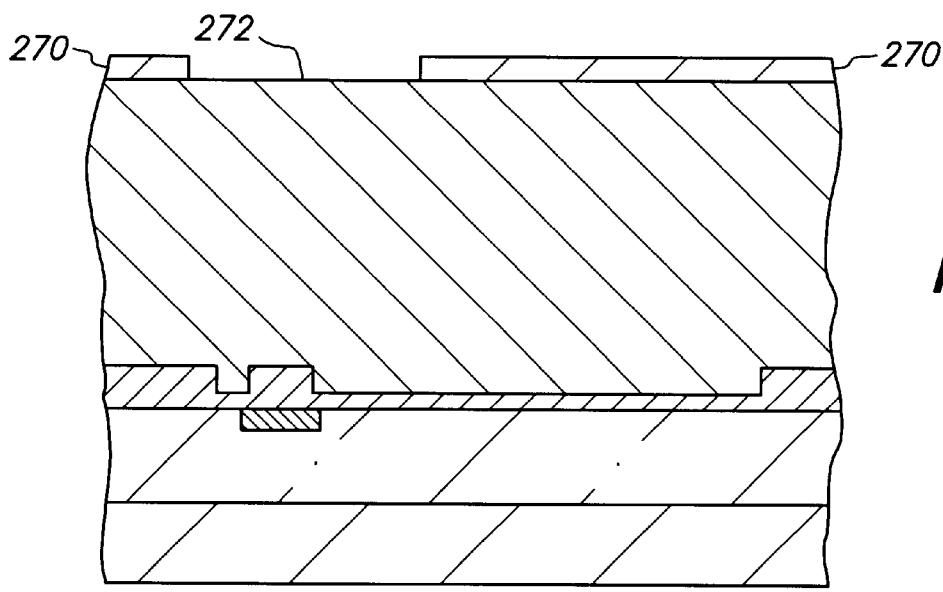
Figure 5I:
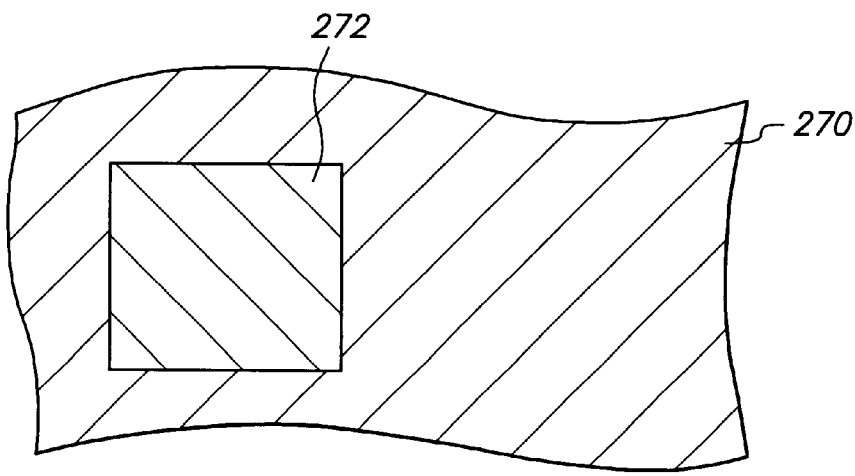
Figure 6I:
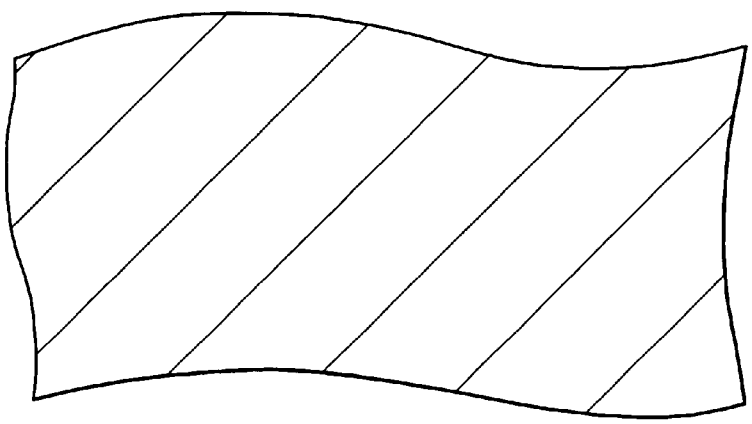

FIGS. 4I, 5I and 6I are cross-sectional, top and bottom views, respectively, of photoresist layer 270 formed on top surface 222 of copper foil 220. Photoresist layer 270 is deposited as a continuous layer and then patterned by selectively applying light through a reticle (not shown), applying a developer solution to remove the photoresist portions rendered soluble by the light, and then hard baking, as is conventional. As a result, photoresist layer 270 contains an opening that selectively exposes portion 272 of top surface 222. Photoresist layer 270 has a thickness of 10 microns.

Figure 4J:
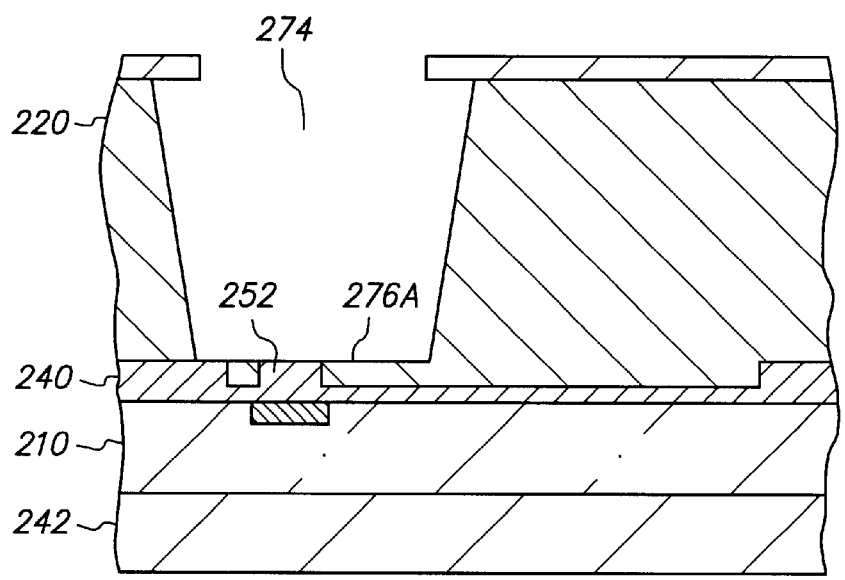
Figure 5J:
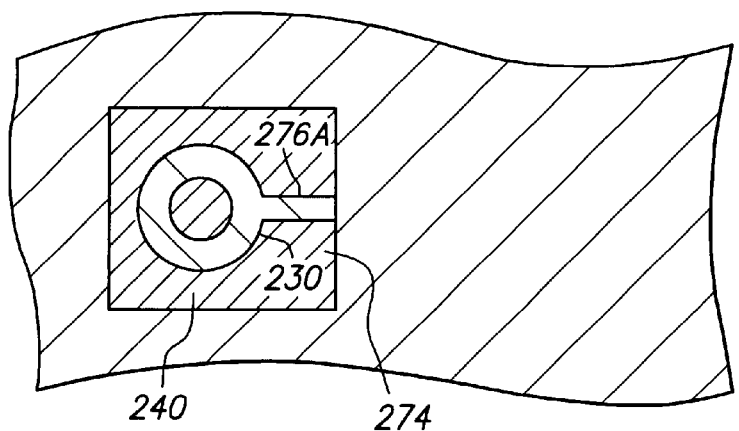
Figure 6J:
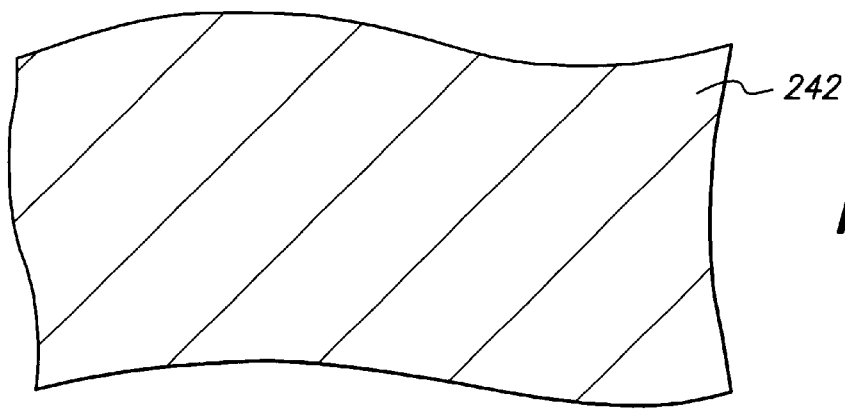

FIGS. 4J, 5J and 6J are cross-sectional, top and bottom views, respectively, of the partially completed assembly after opening 274 is formed in copper foil 220, first portion 276A of routing line 230 is formed, and dimple 232 is converted into through-hole 252 in routing line 230. First portion 276A of routing line 230 and through-hole 252 are formed by applying a front-side wet chemical etch to portion 272 of top surface 222 in a similar manner to the front-side wet chemical etch in the first embodiment. Therefore, no appreciable amount of adhesive 240 or encapsulant 242 is removed. Since the portion of copper foil 220 directly above first portion 276A of routing line 230 and dimple 232 was 125 microns, the wet chemical etch forms a top surface of first portion 276A of routing line 230 that is contiguous with the outer edges of routing line 230 and converts dimple 232 into through-hole 252 that extends between the top and bottom surfaces of routing line 230. Of importance, the wet chemical etch does not form separate conductive traces in copper foil 220. Rather, routing line 230 remains connected to and integral with the other regions of copper foil 220, including other routing lines with through-holes aligned with corresponding pads on chip 210.

Figure 4K:
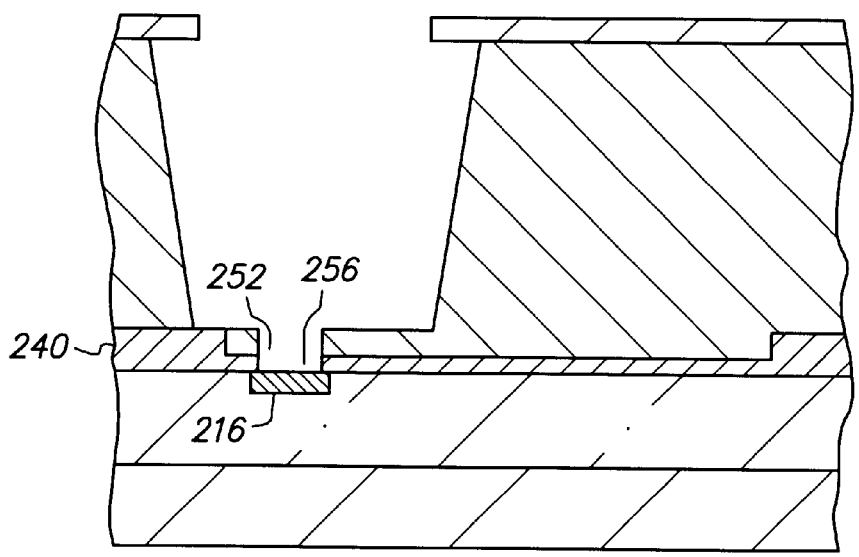
Figure 5K:
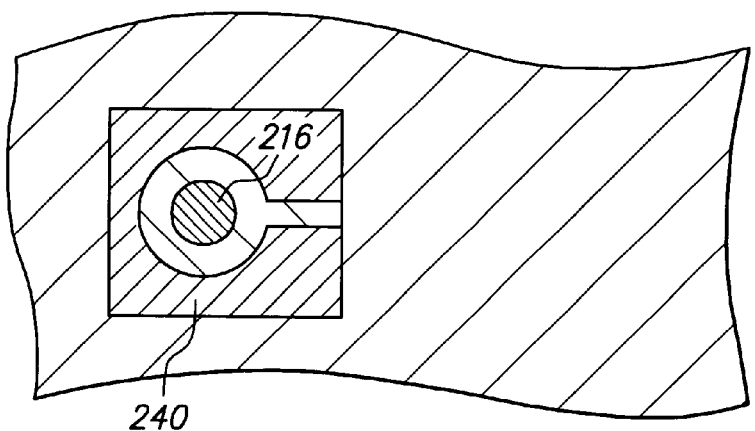
Figure 6K:
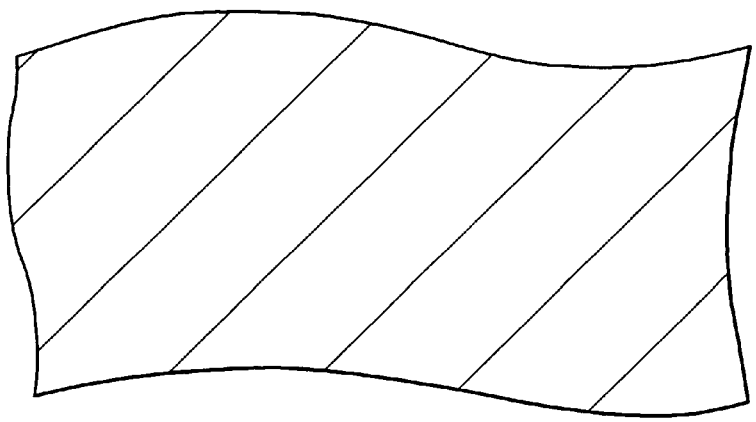

FIGS. 4K, 5K and 6K are cross-sectional, top and bottom views, respectively, of opening 256 formed in adhesive 240 by applying a selective laser etch. The combination of through-hole 252 and opening 256 expose pad 216.

Figure 4L:
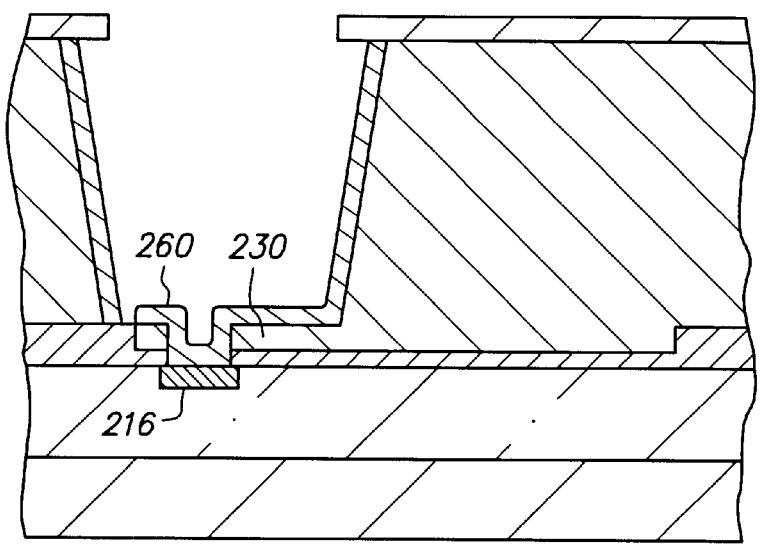
Figure 5L:
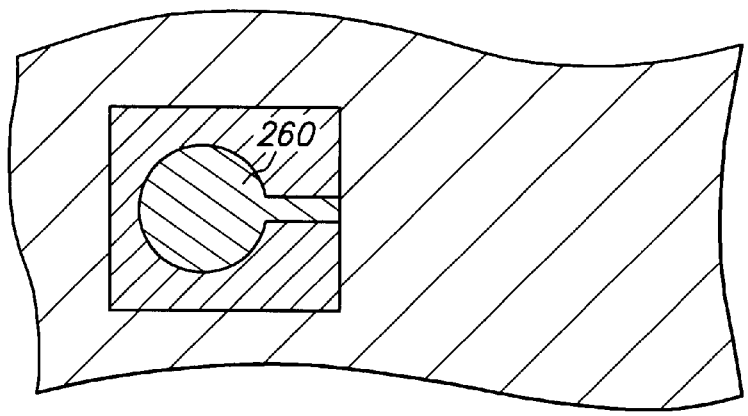
Figure 6L:
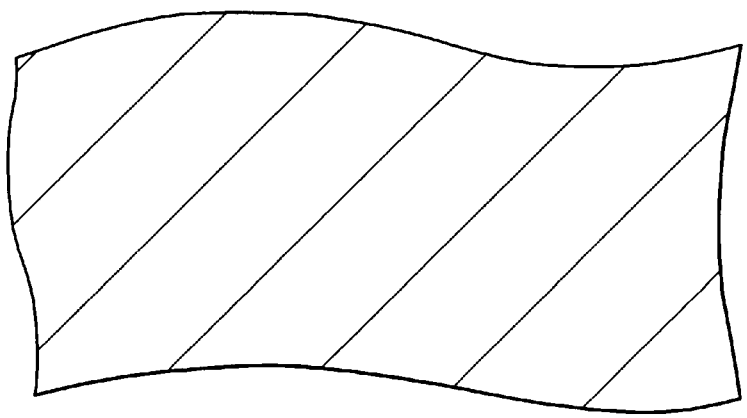

FIGS. 4L, 5L and 6L are cross-sectional, top and bottom views, respectively, of the partially completed assembly after connection joint 260 is formed by electroplating. Connection joint 260 is formed in through-hole 252 and opening 256, and contacts and electrically connects pad 216 and routing line 230. Connection joint 260 covers first portion 276A of routing line 230 and the sidewalls of opening 274.

Figure 4M:
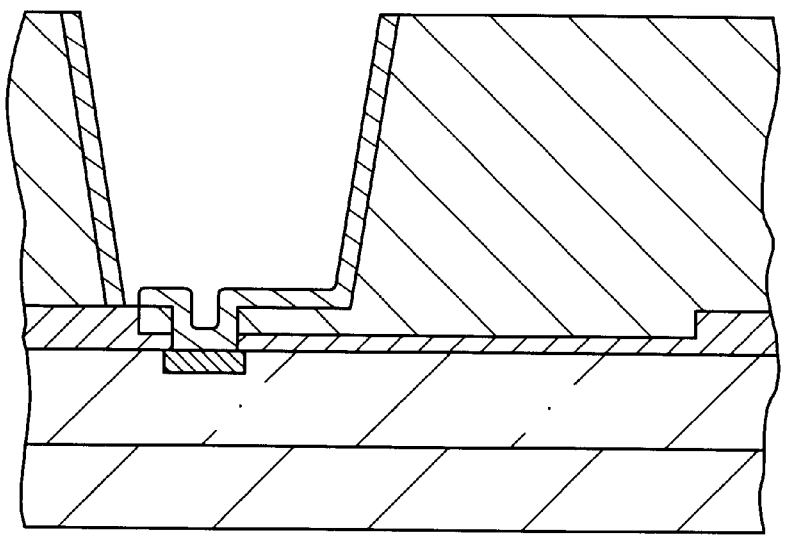
Figure 5M:
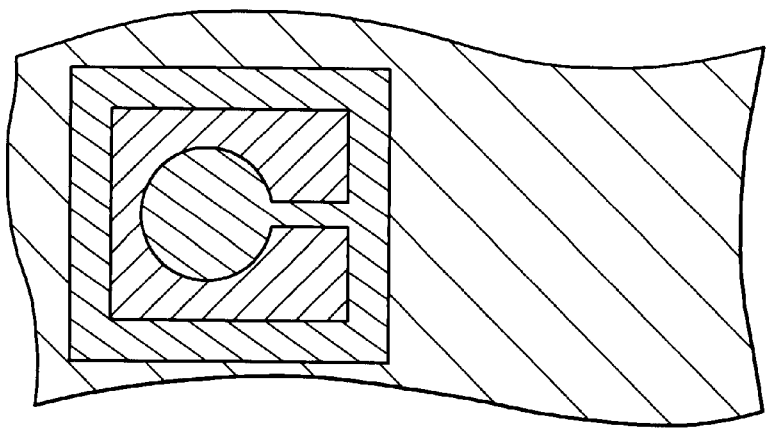
Figure 6M:
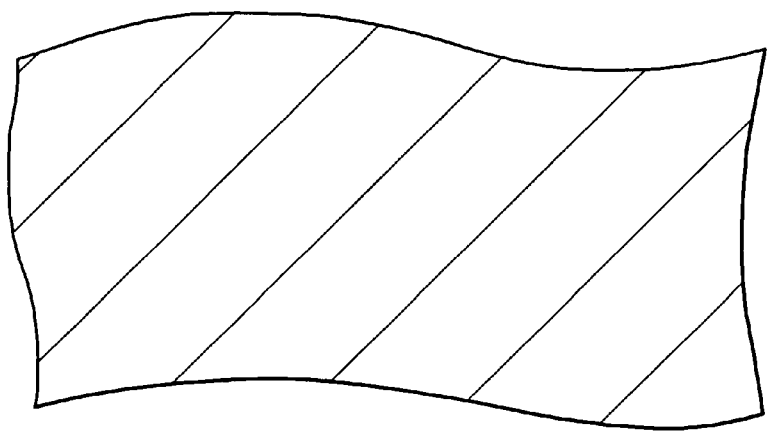

FIGS. 4M, 5M and 6M are cross-sectional, top and bottom views, respectively, of the partially completed assembly after photoresist layer 272 is stripped.

Figure 4N:
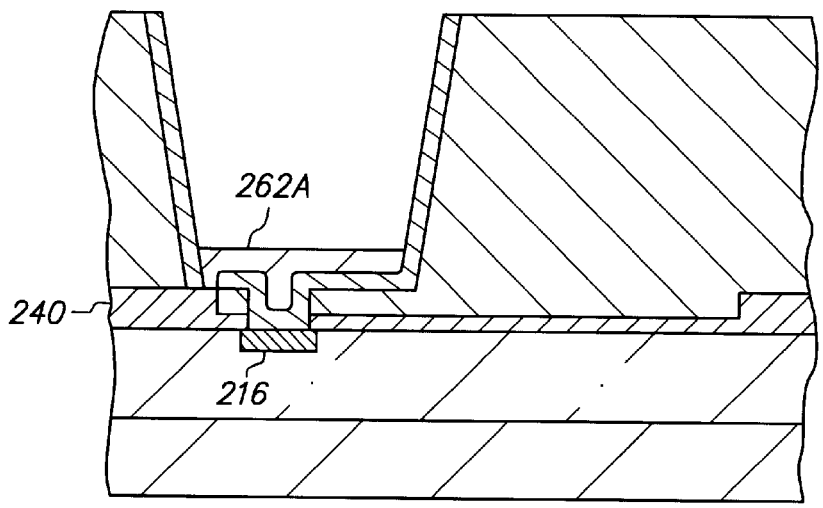
Figure 5N:
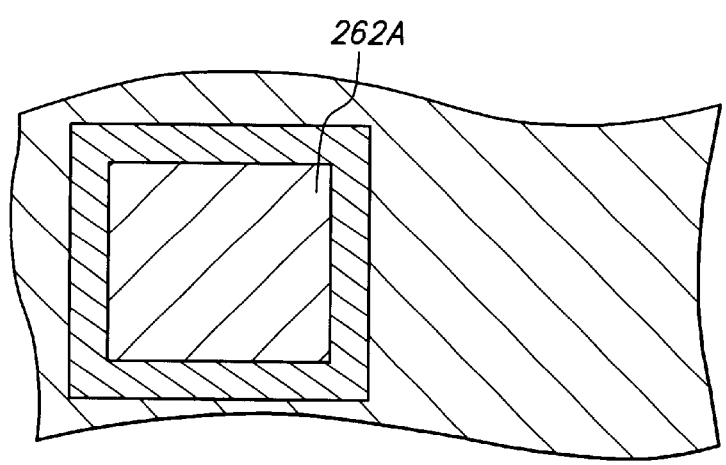
Figure 6N:
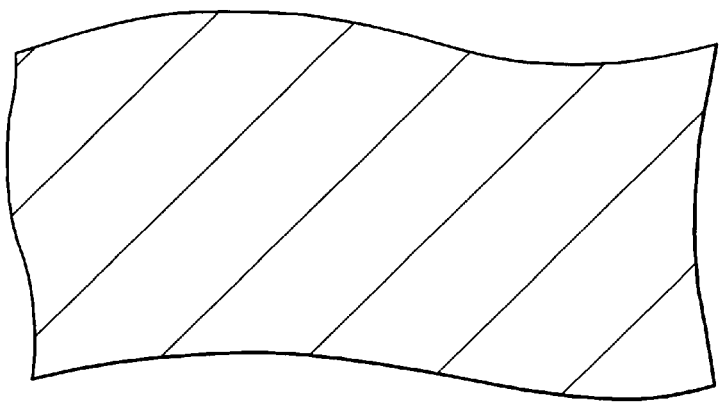

FIGS. 4N, 5N and 6N are cross-sectional, top and bottom views, respectively, of first insulative base portion 262A formed on the bottom of opening 274. First insulative base portion 262A is relatively flat and has a thickness of 20 microns. First insulative base portion 262A contacts and adheres to adhesive 240 and connection joint 260, and covers first portion 276A of routing line 230 and through-hole 252. However, first insulative base portion 262A does not extend to top surface 222 or bottom surface 224. Preferably, first insulative base portion 262A is initially an epoxy in paste form that includes an epoxy resin, a curing agent, an accelerator and a filler such as silica. The epoxy paste is selectively coated into opening 274 but not on top surface 222 using screen printing, and then the epoxy is cured or hardened at relatively low temperature in the range of 100–250° C. to form a solid adherent insulative layer that provides protection for connection joint 260 in the vicinity of pad 216 and through-hole 252.

Figure 4O:
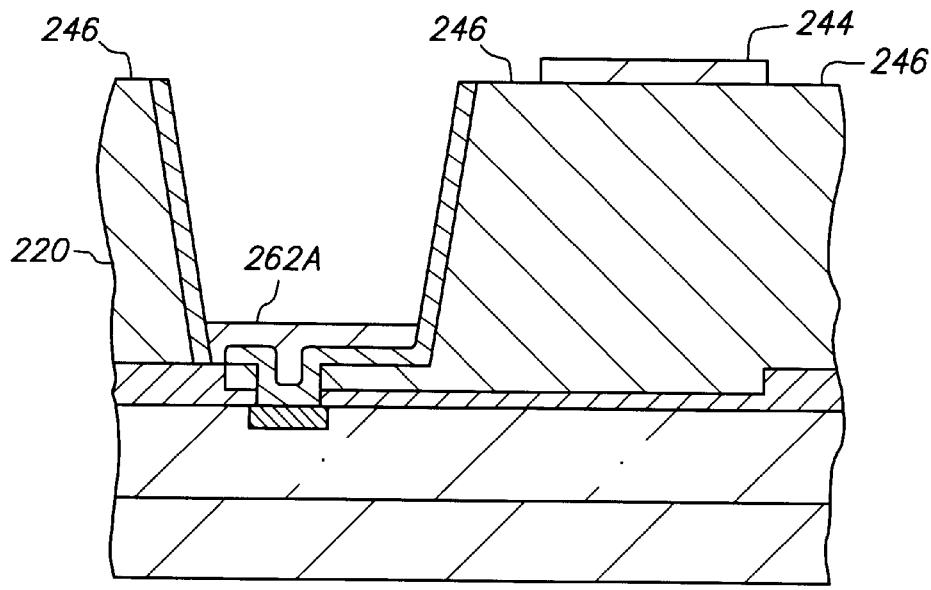
Figure 5O:
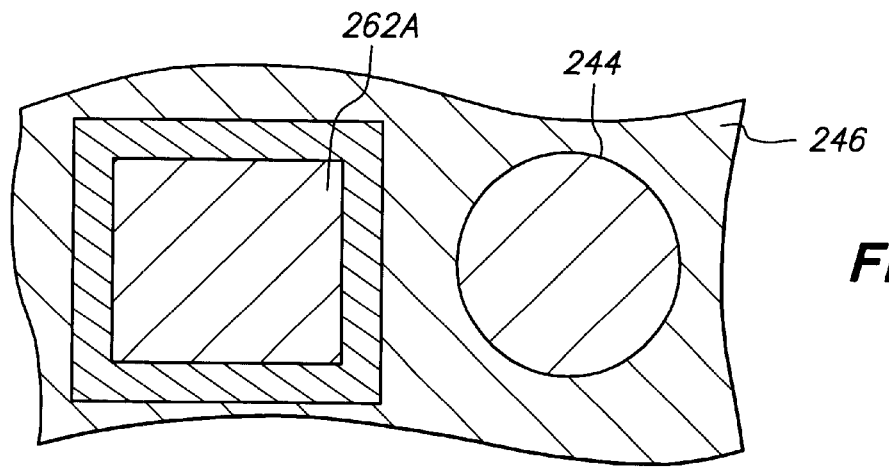
Figure 6O:
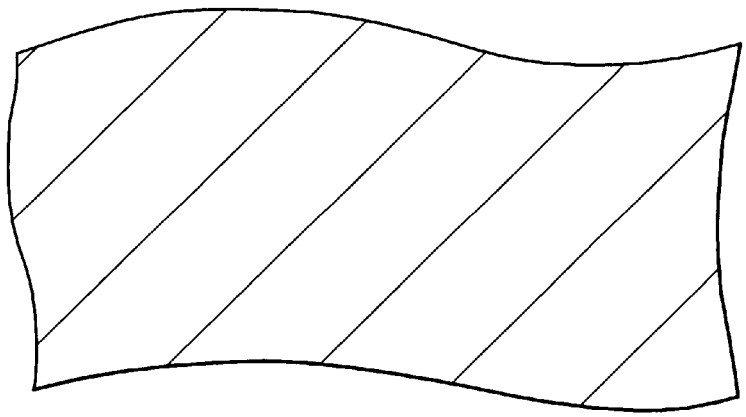

FIGS. 4O, 5O and 6O are cross-sectional, top and bottom views, respectively, of photoresist layer 244 formed on top surface 222 of copper foil 220. Photoresist layer 244 is deposited as a continuous layer and then patterned by selectively applying light through a reticle (not shown), applying a developer solution to remove the photoresist portions rendered soluble by the light, and then hard baking, as is conventional. As a result, photoresist layer 244 contains an opening that selectively exposes portion 246 of copper foil 220 and first insulative base portion 262A. Photoresist layer 244 has a thickness of 10 microns.

Figure 4P:
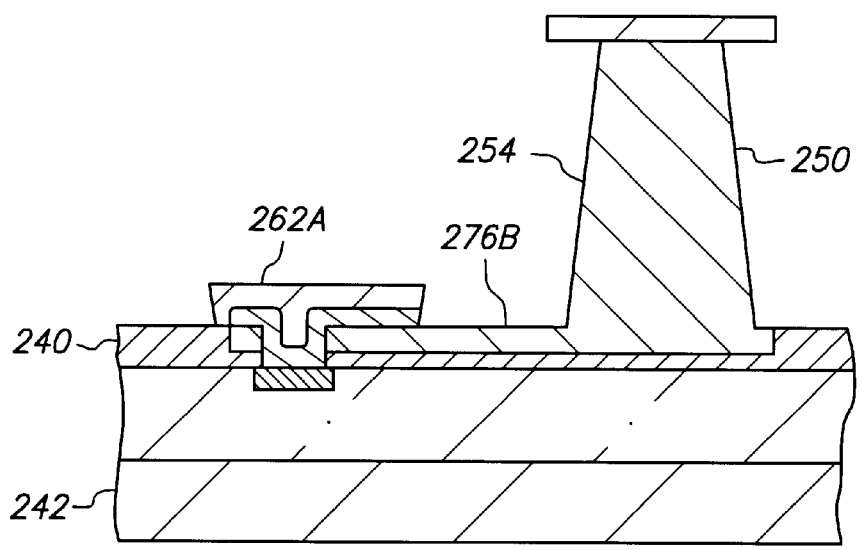
Figure 5P:
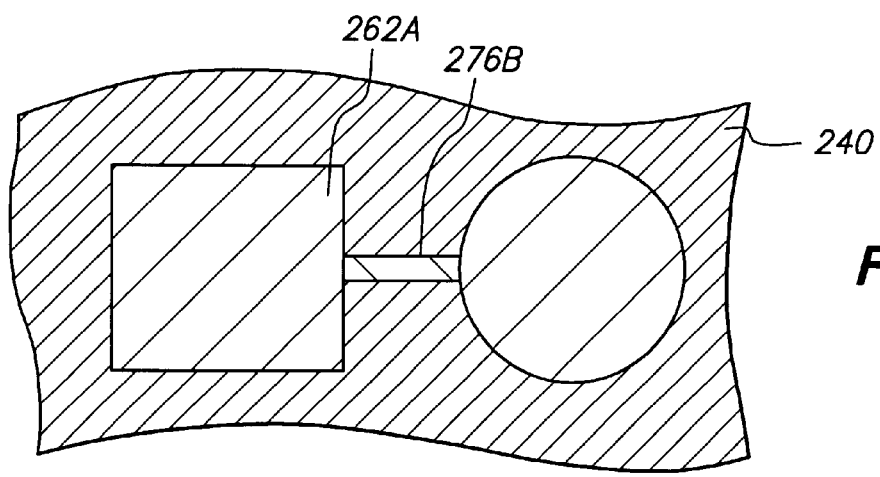
Figure 6P:
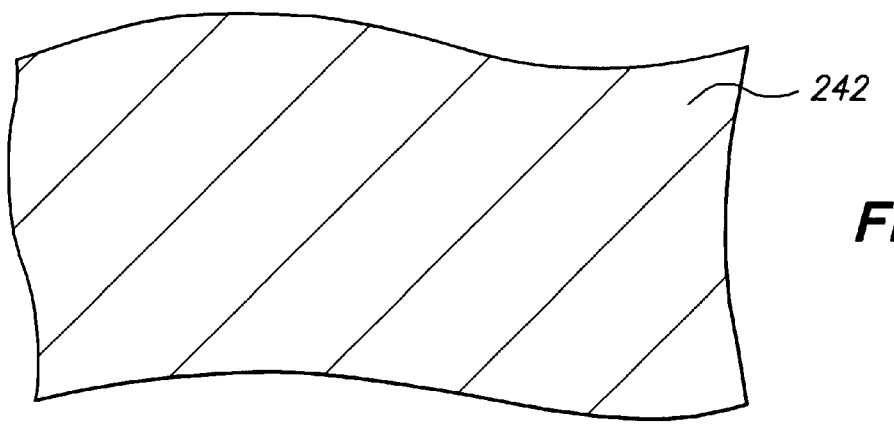

FIGS. 4P, 5P and 6P are cross-sectional, top and bottom views, respectively, of the partially completed assembly after pillar 250 is formed in copper foil 220, and second portion 276B of routing line 230 is formed. Pillar 250 and second portion 276B of routing line 230 are formed by applying a front-side wet chemical etch in a similar manner to the front-side wet chemical etch in the first embodiment. Therefore, no appreciable amount of adhesive 240, encapsulant 242 or first a insulative base portion 262A is removed. Since the portion of copper foil 220 directly above second portion 276B of routing line 230 was 125 microns, the wet chemical etch forms a top surface of second portion 276B of routing line 230 that is contiguous with the outer edges of routing line 230 and adjacent to pillar 250. Of importance, the wet chemical etch forms separate conductive traces in copper foil 220. Routing line 230 and pillar 250 form conductive trace 254 that is separate from and electrically isolated from other conductive traces in what remains of copper foil 220. Moreover, first insulative base portion 262A protects the underlying portion of connection joint 260 from the wet chemical etch, thereby assuring a robust metallurgical connection between pad 216 and routing line 230. Pillar 250 is horizontally offset from through-hole 252, and routing line 230 provides horizontal routing (fan-in or fan-out) between pillar 250 and through-hole 252 by first portion 276A, which is adjacent to through-hole 252, and second portion 276B, which is adjacent to pillar 250 and first portion 276A. At this stage, adhesive 240 provides critical mechanical support for conductive trace 254.

Figure 4Q:
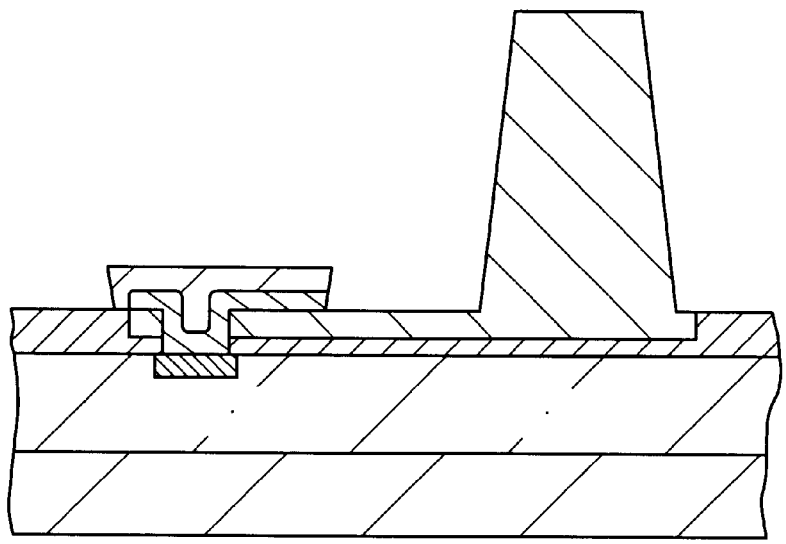
Figure 5Q:
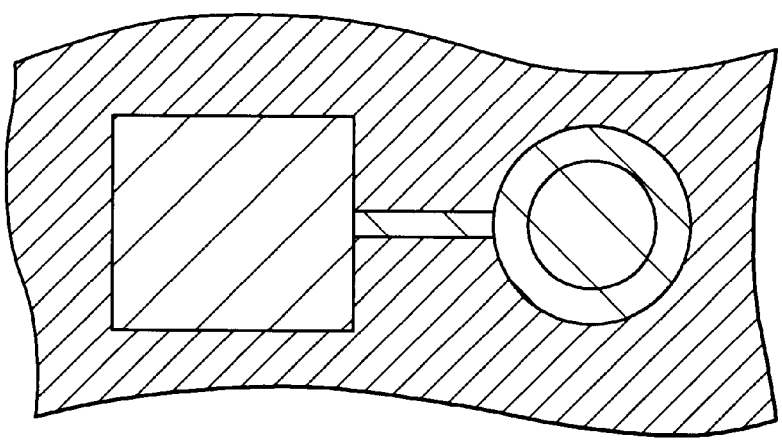
Figure 6Q:
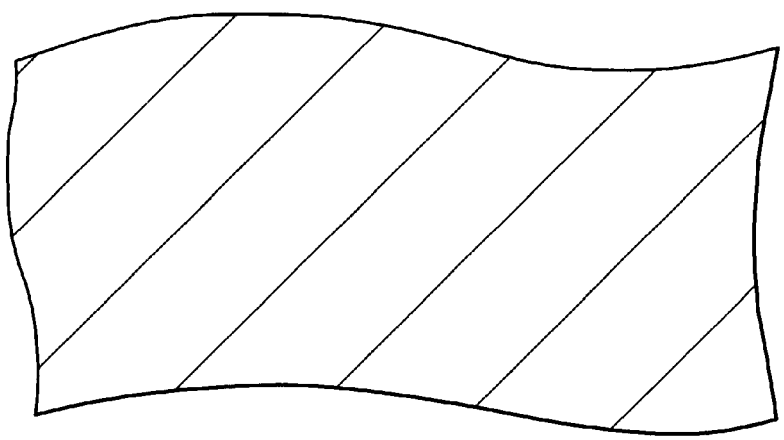

FIGS. 4Q, 5Q and 6Q are cross-sectional, top and bottom views, respectively, of the partially completed assembly after photoresist layer 244 is stripped.

Figure 4R:
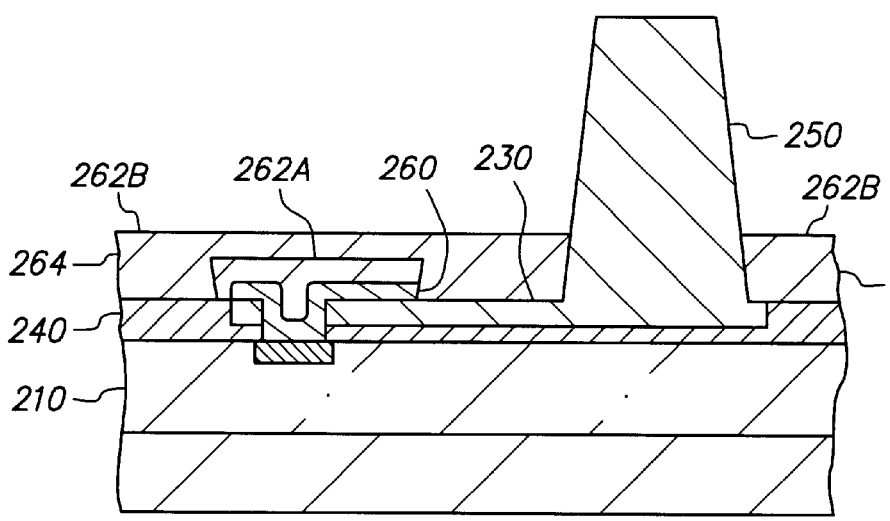
Figure 5R:
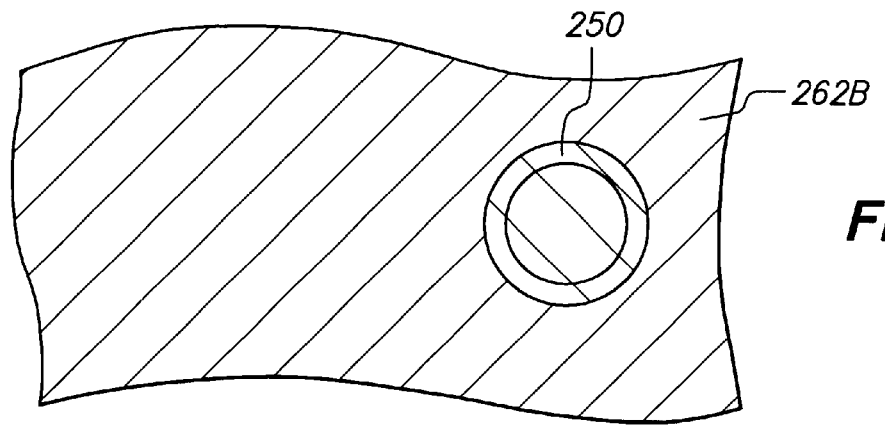
Figure 6R:
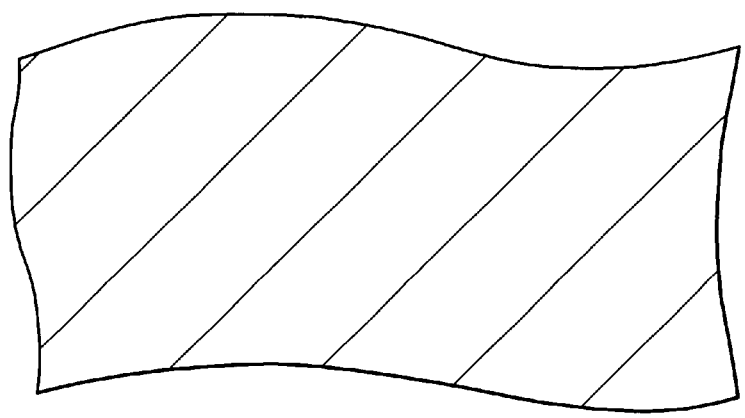
Figure 7A:
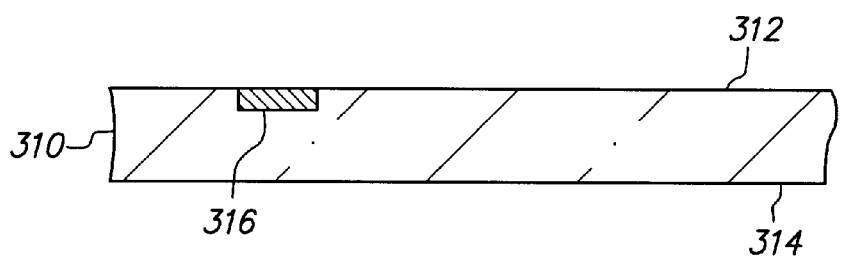
FIGS. 7A–7N are cross-sectional views showing a method of manufacturing a semiconductor chip assembly in accordance with a third embodiment of the present invention.
Figure 8A:
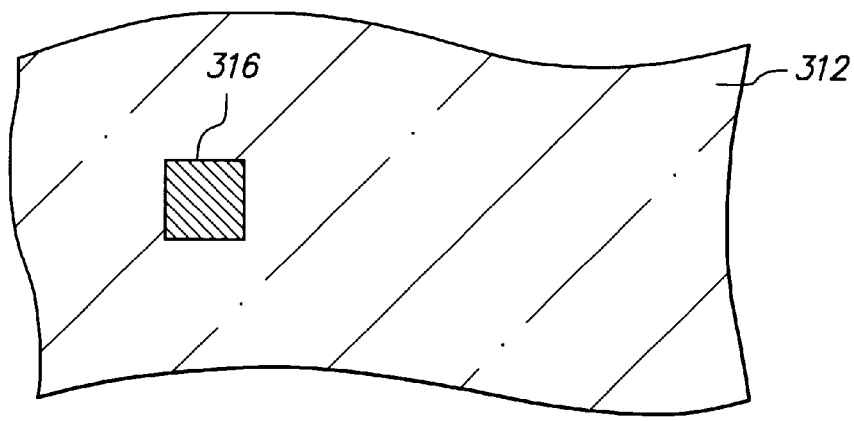
FIGS. 8A–8N are top plan views corresponding to FIGS. 7A–7N, respectively.
Figure 9A:
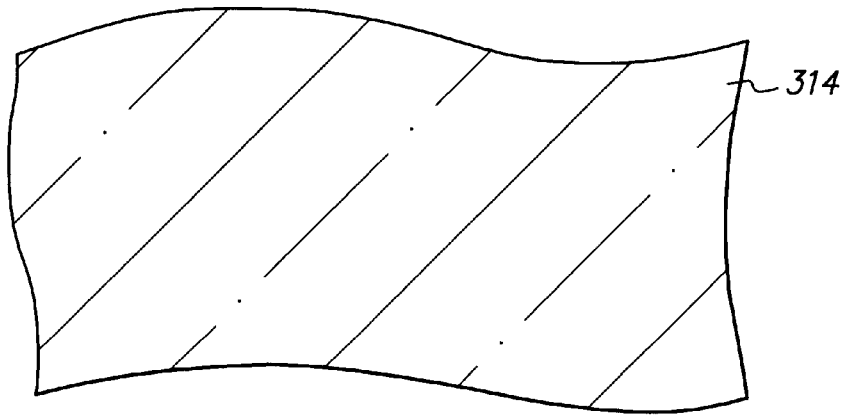
FIGS. 9A–9N are bottom plan views corresponding to FIGS. 7A–7N, respectively.
Figure 7B:
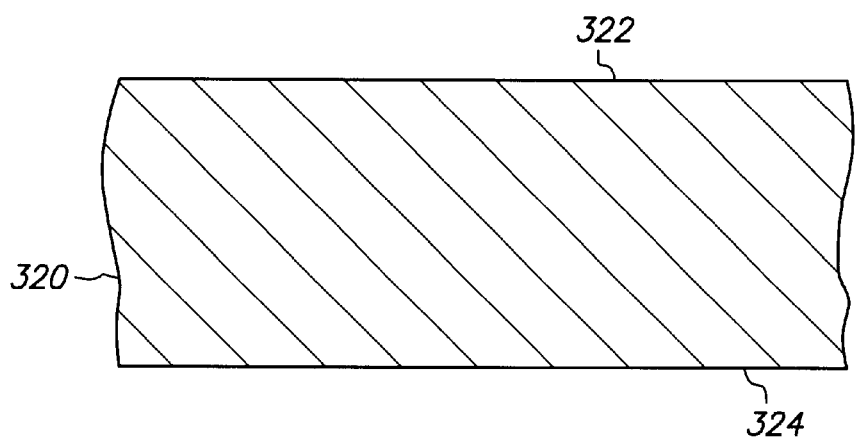
Figure 8B:
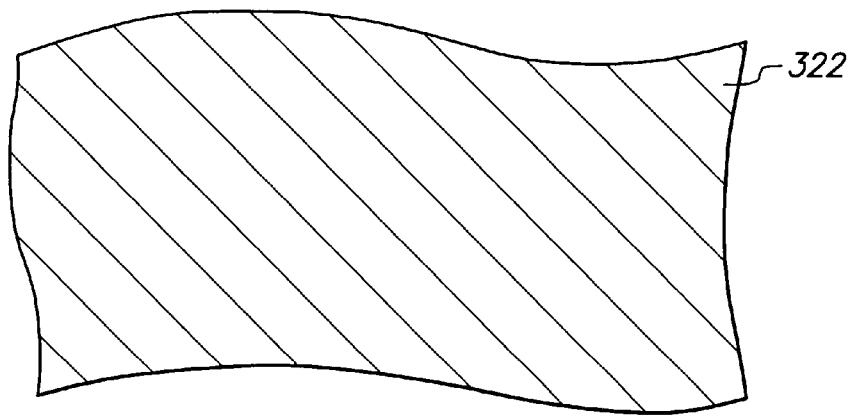
Figure 9B:
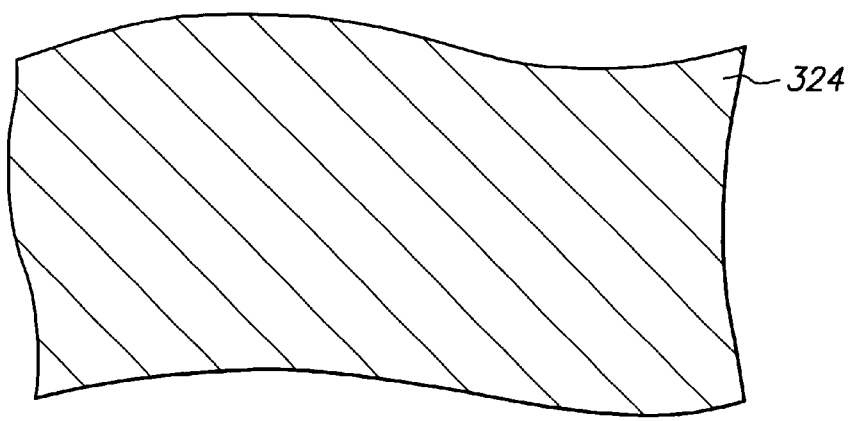
Figure 7C:
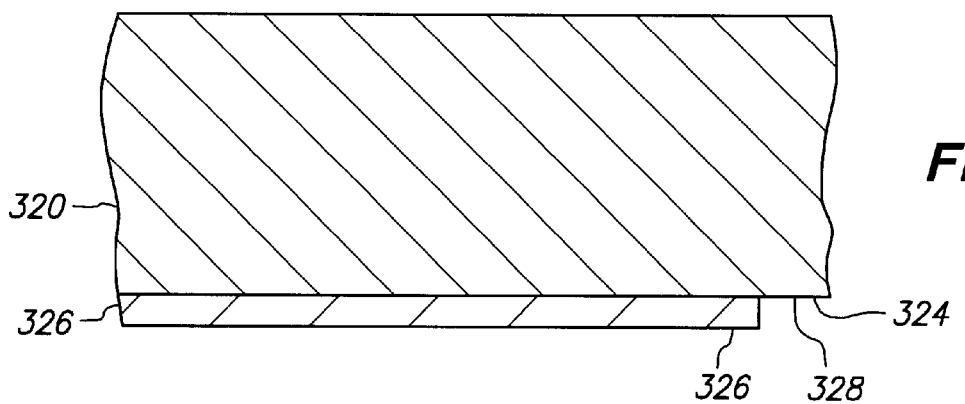
Figure 8C:
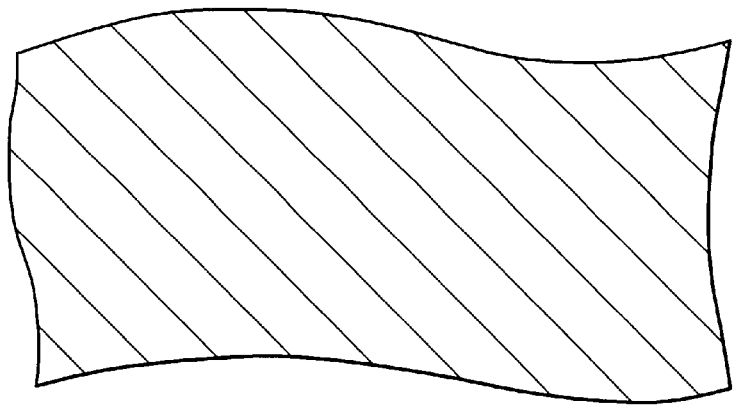
Figure 9C:
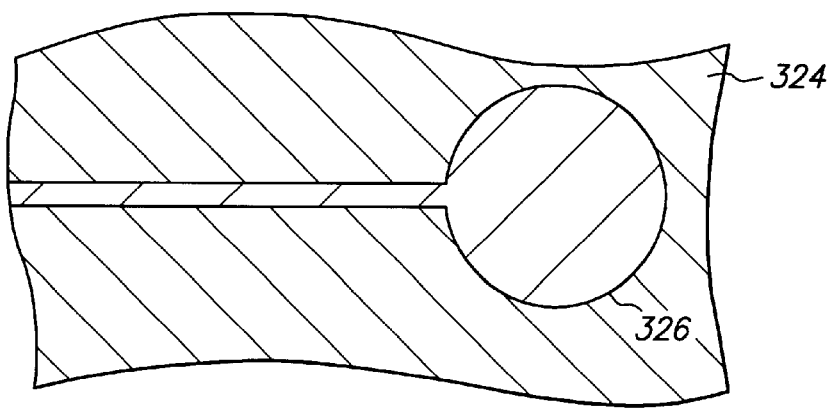
Figure 7D:
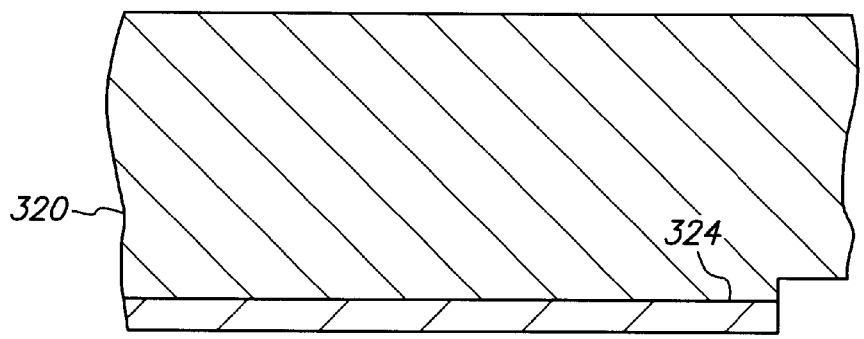
Figure 8D:
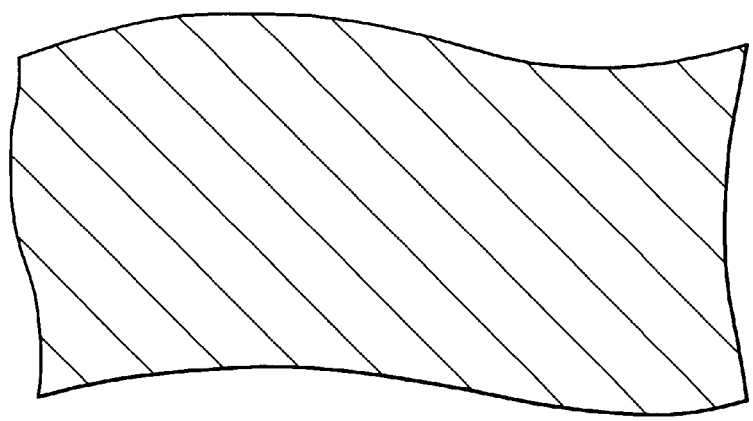
Figure 9D:
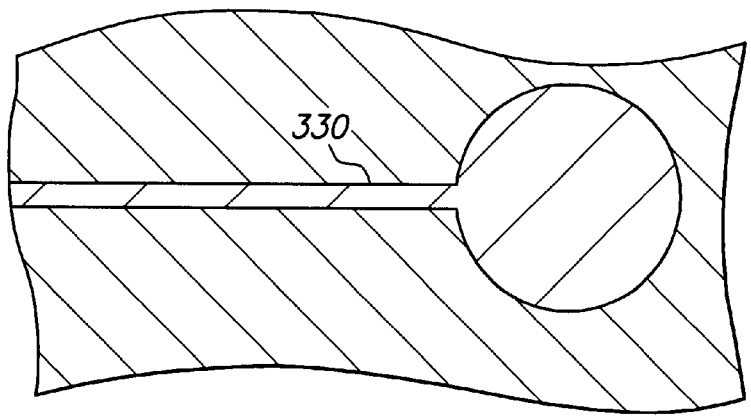
Figure 7E:
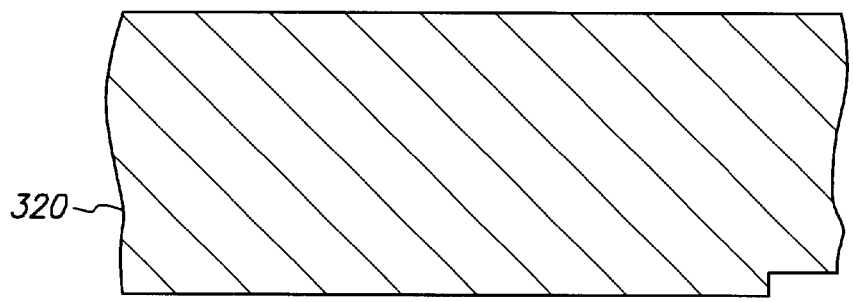
Figure 8E:
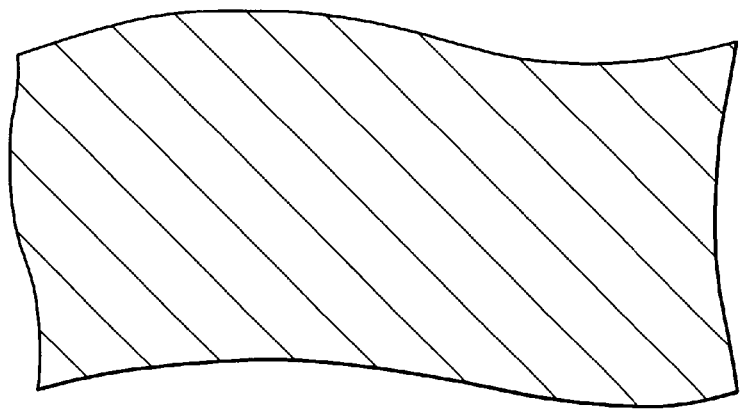
Figure 9E:
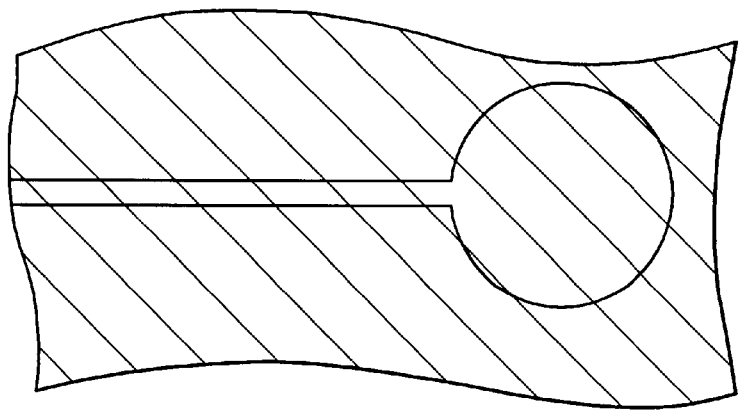
Figure 7F:
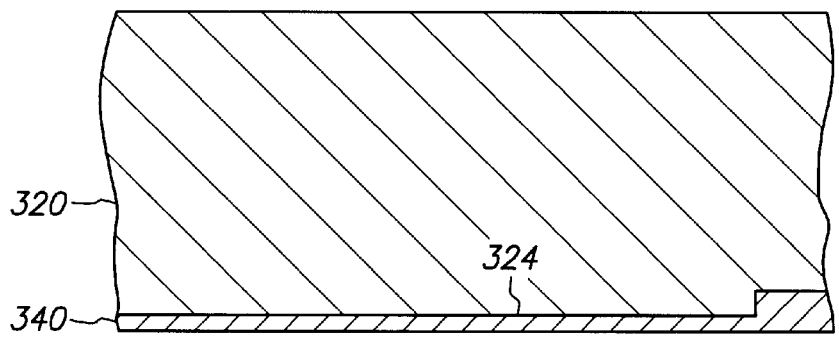
Figure 8F:
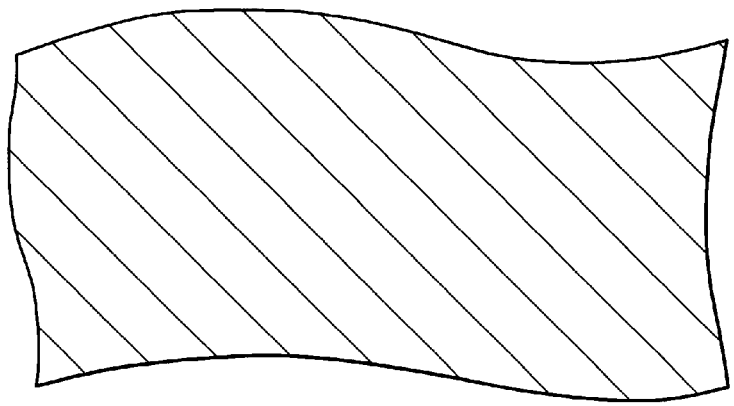
Figure 9F:
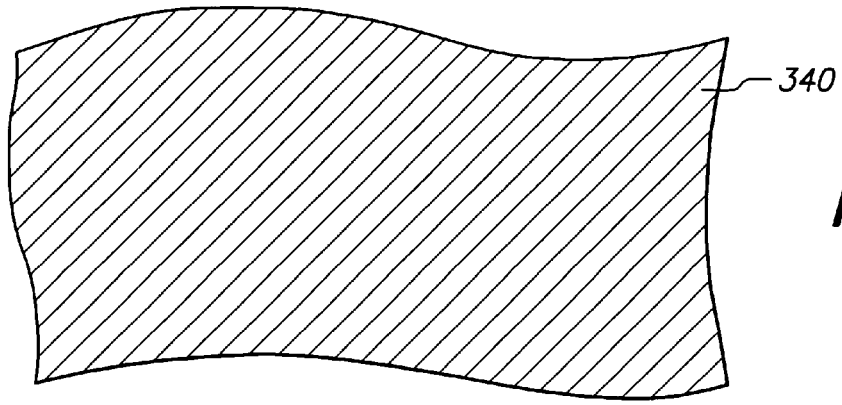
Figure 7G:
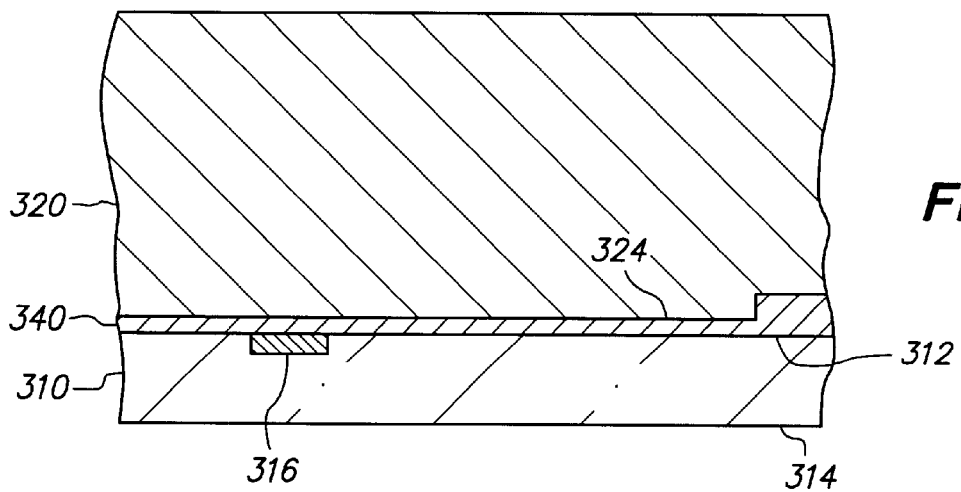
Figure 8G:
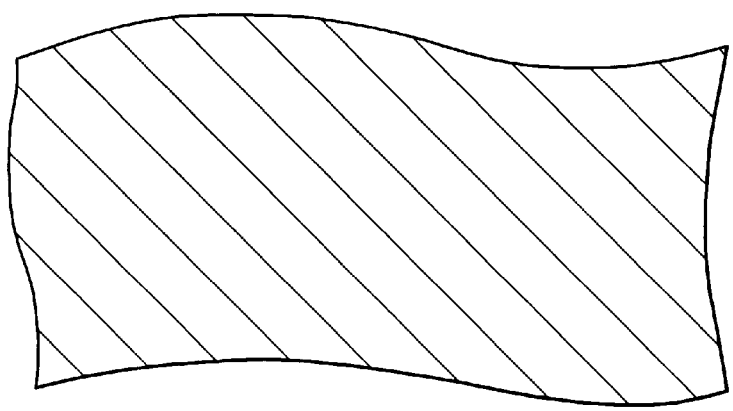
Figure 9G:
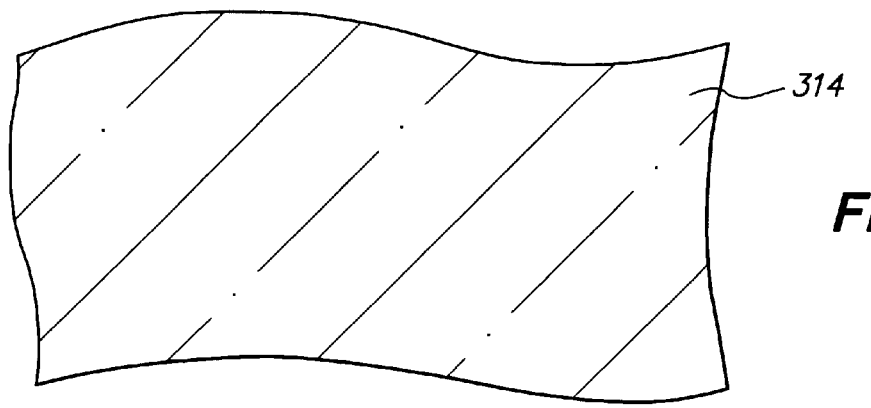
Figure 7H:
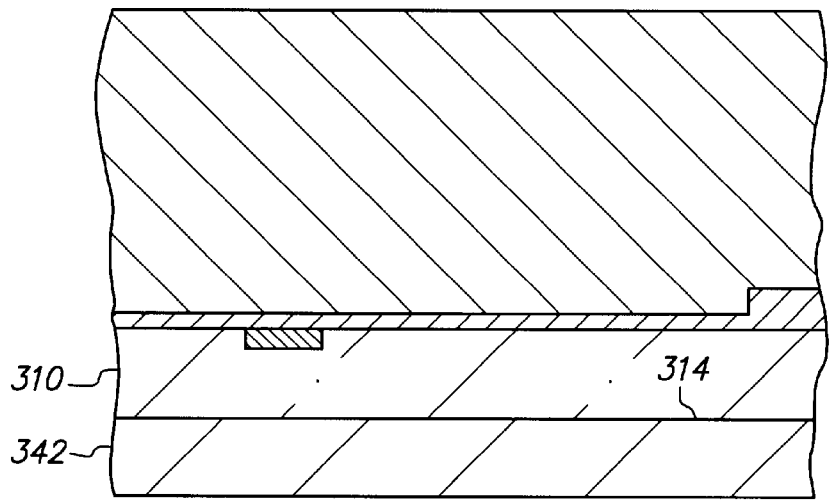
Figure 8H:
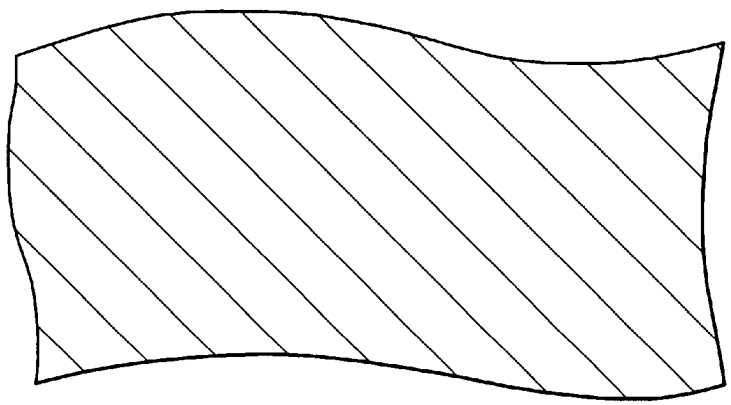
Figure 9H:
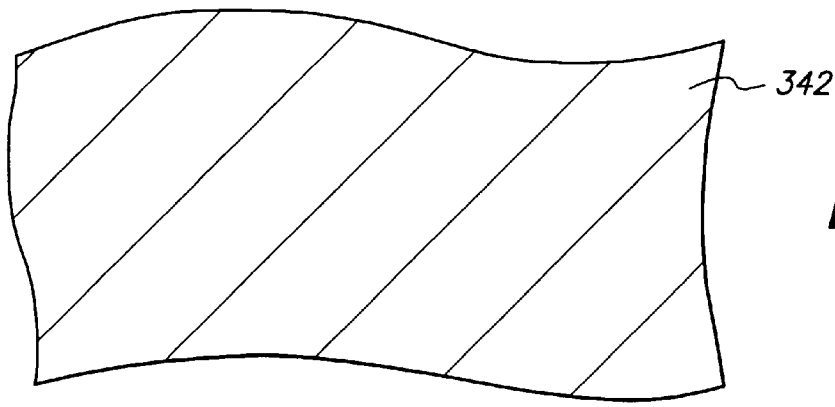
Figure 7I:
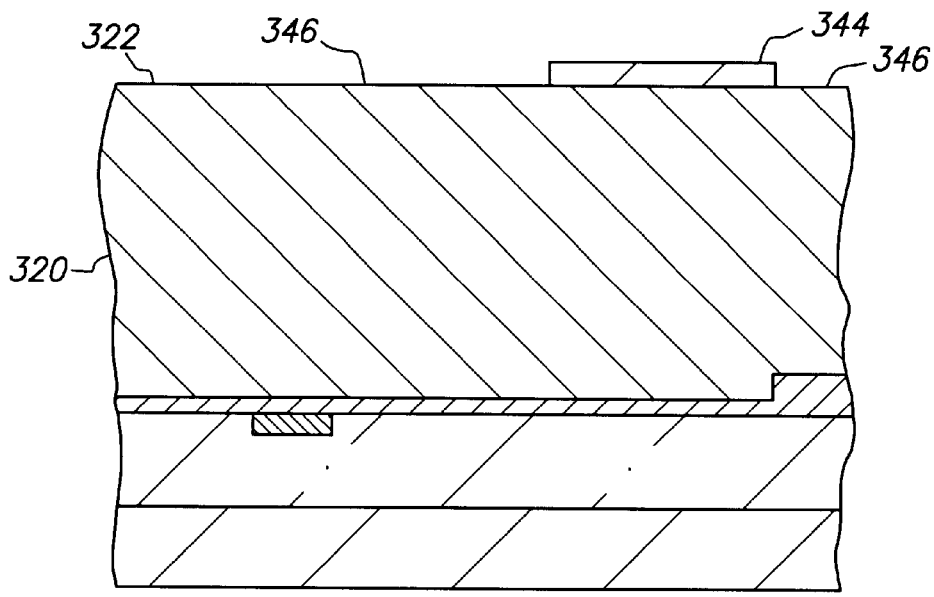
Figure 8I:
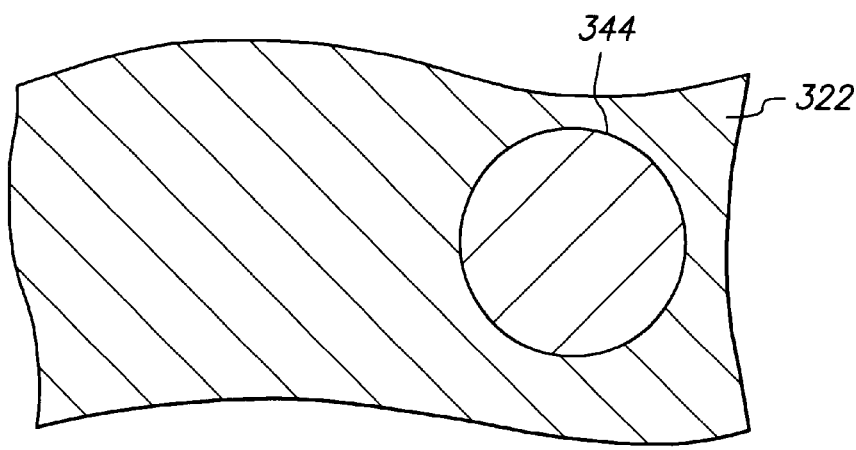
Figure 9I:
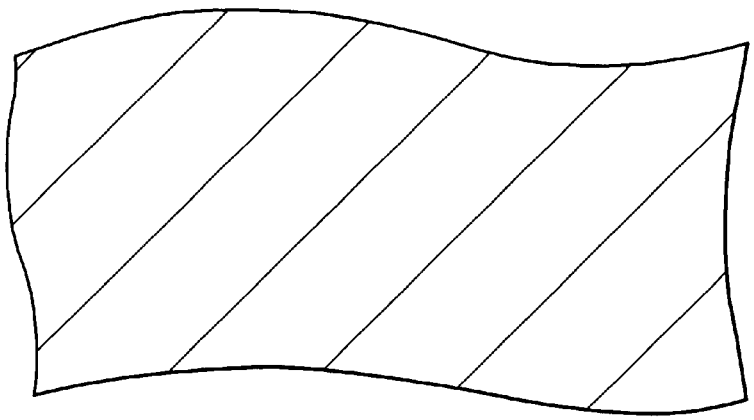
Figure 7J:
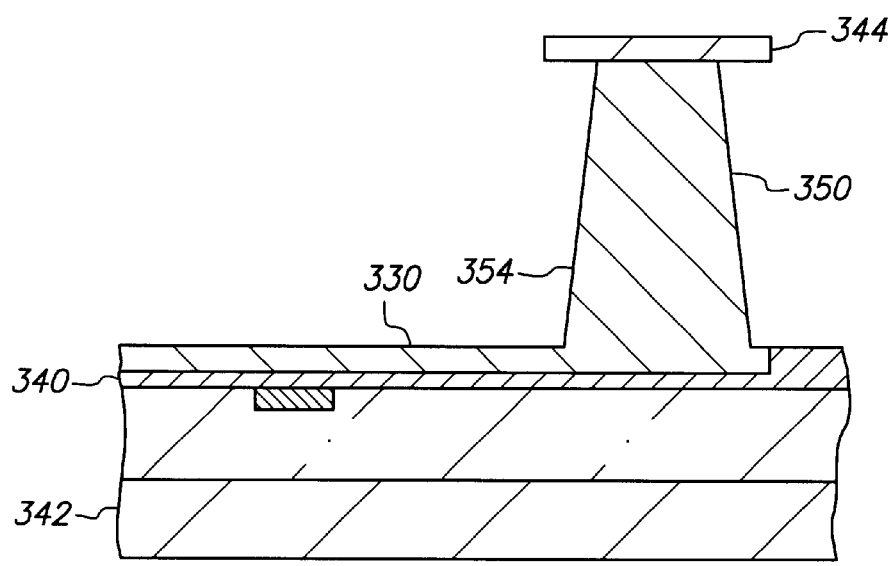
Figure 8J:
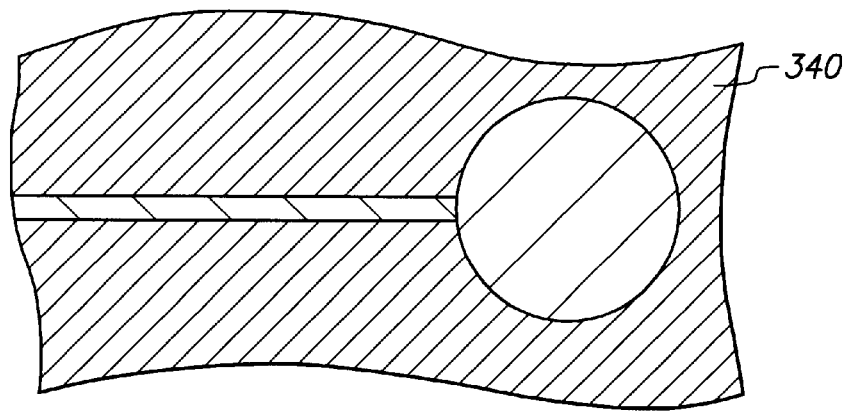
Figure 9J:
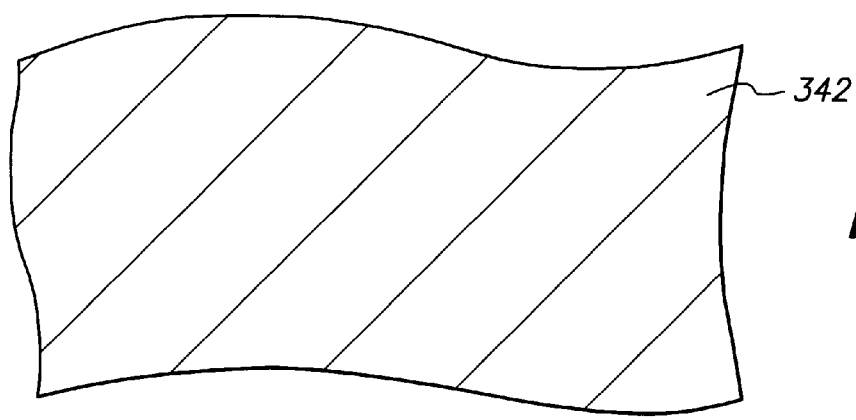
Figure 7K:
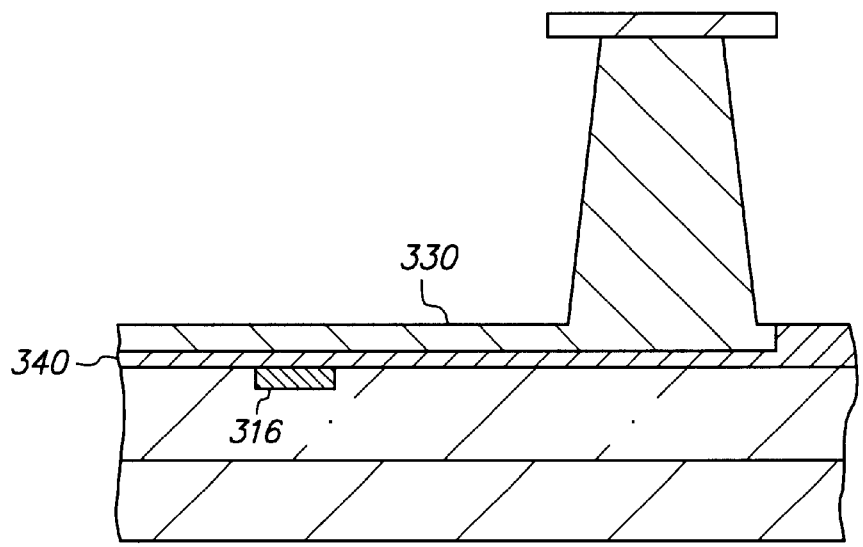
Figure 8K:
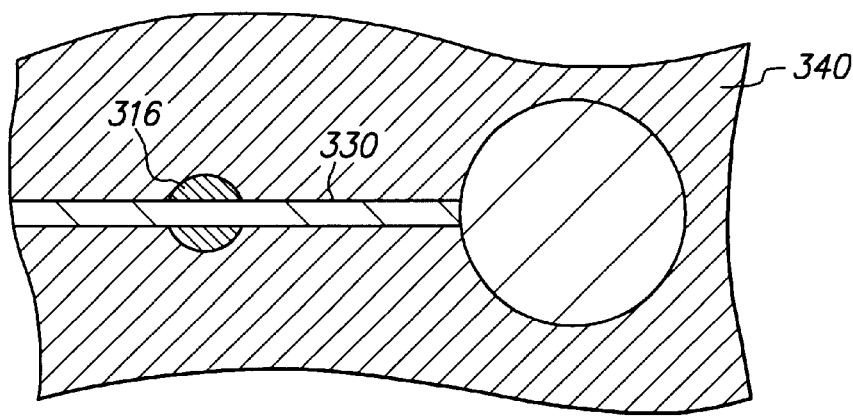
Figure 9K:
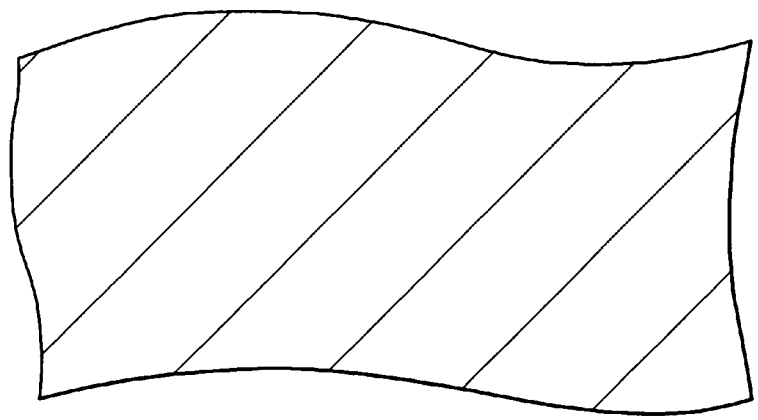
Figure 7L:
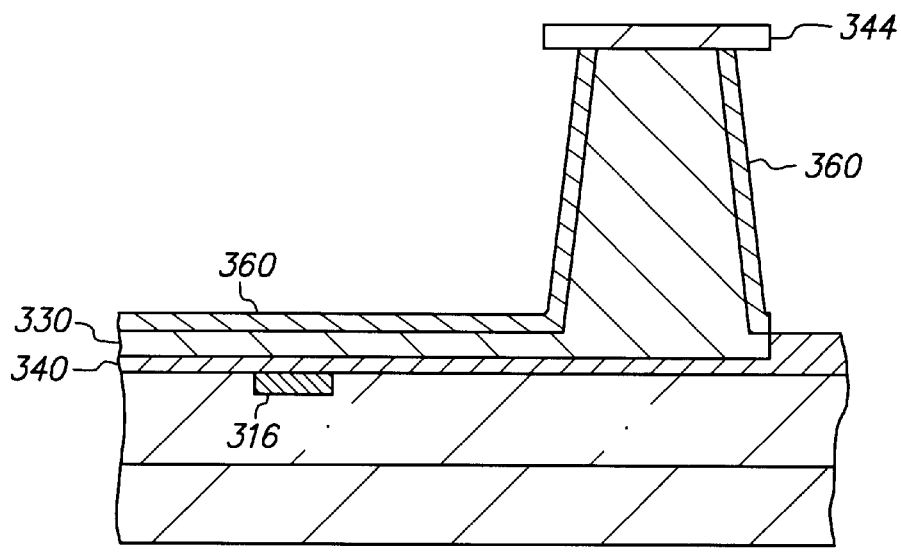
Figure 8L:
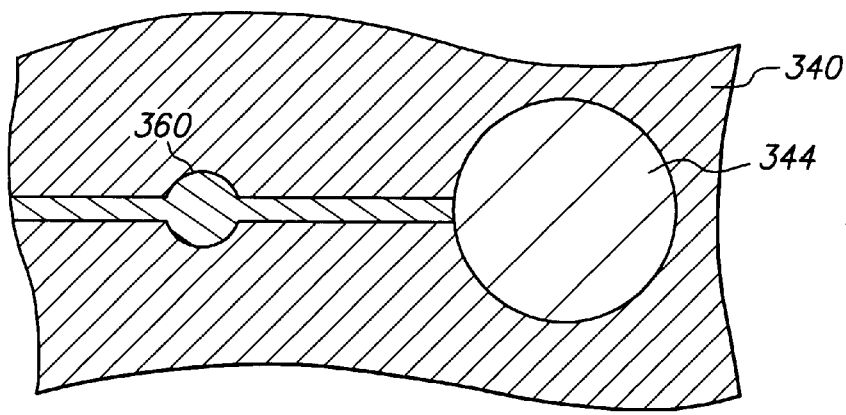
Figure 9L:
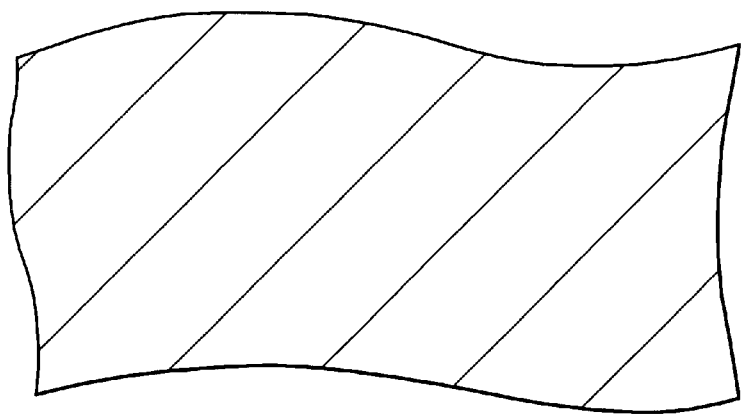
Figure 7M:
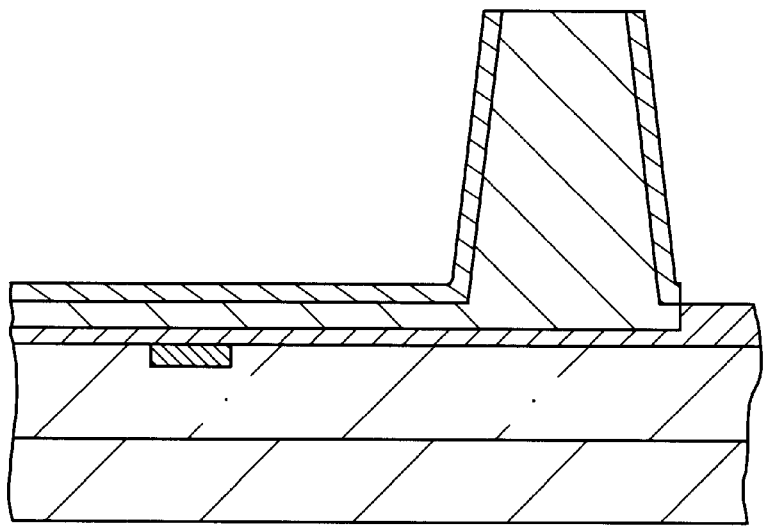
Figure 8M:
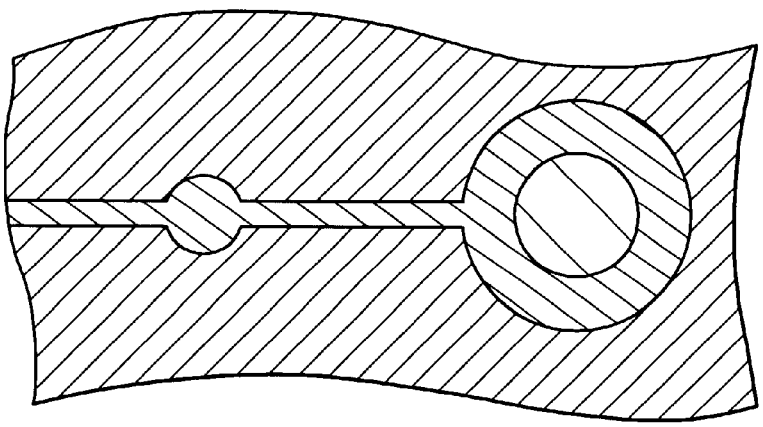
Figure 9M:
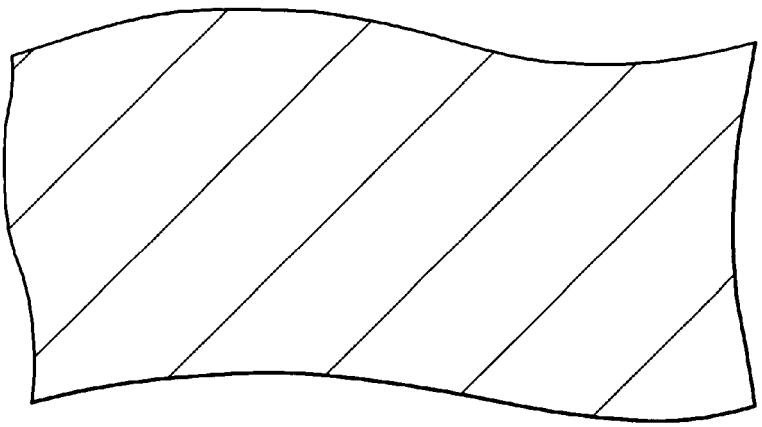
Figure 7N:
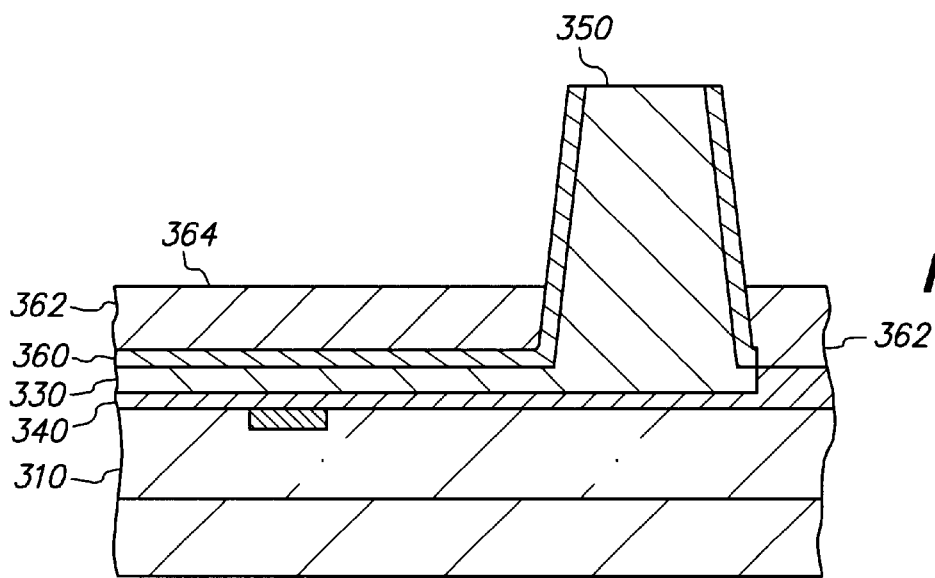
Figure 8N:
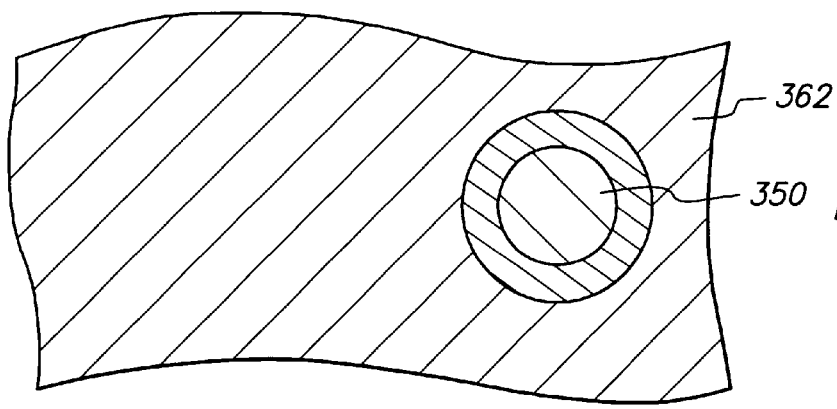
Figure 9N:
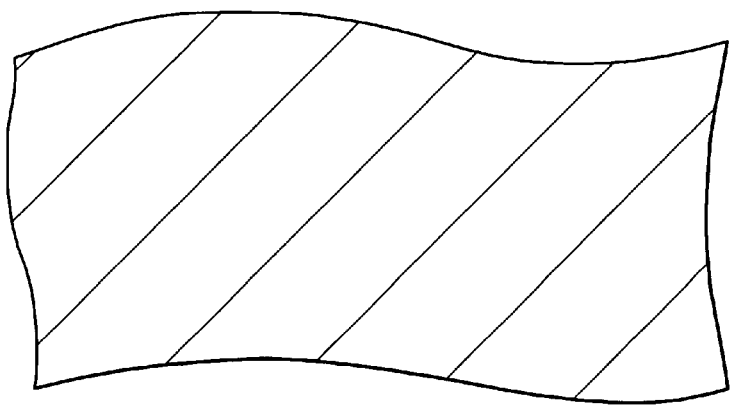

FIGS. 4R, 5R and 6R are cross-sectional, top and bottom views, respectively, of second insulative base portion 262B formed on first insulative base portion 262A, second portion 276B of routing line 230, and a lower portion of pillar 250 but not an upper portion of pillar 250. The combination of first and second insulative base portions 262A and 262B form insulative base 262 which is relatively flat, has a thickness of 50 microns, and does not extend to top surface 222 or bottom surface 224. Preferably, second insulative base portion 262B is initially an epoxy in paste form that includes an epoxy resin, a curing agent, an accelerator and a filler such as silica. The epoxy paste is selectively coated onto routing line 230 but not top surface 222 using screen printing, and then the epoxy is cured or hardened at relatively low temperature in the range of 100–250° C. to form a solid adherent insulative layer that provides additional mechanical strength for the support circuit.

At this stage, the manufacture of support circuit 264, which includes conductive trace 254 and insulative base 262, can be considered complete. Support circuit 264 is mechanically and electrically coupled to chip 210 by adhesive 240 and connection joint 260, respectively, to form a semiconductor chip assembly. If desired, solder balls can be screen printed on the tops of the pillars to provide connections to the next level assembly.

Figure 10A:
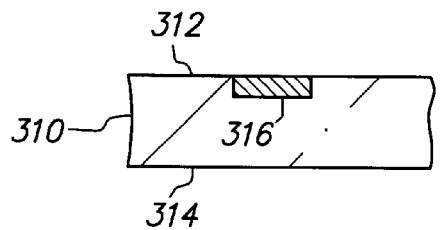
FIGS. 10A–10N are cross-sectional views corresponding to FIGS. 7A–7N, respectively.
Figure 10B:
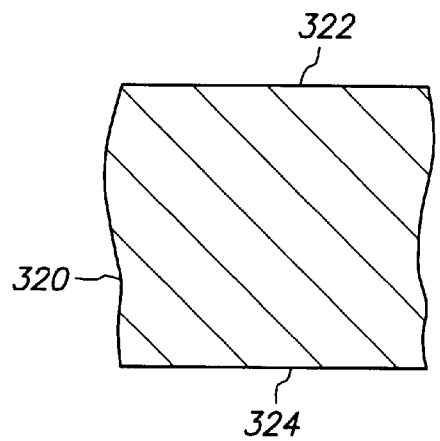
Figure 10C:
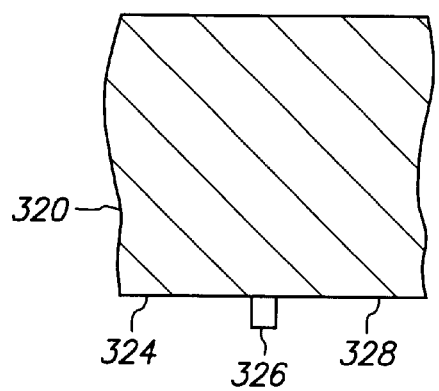
Figure 10D:
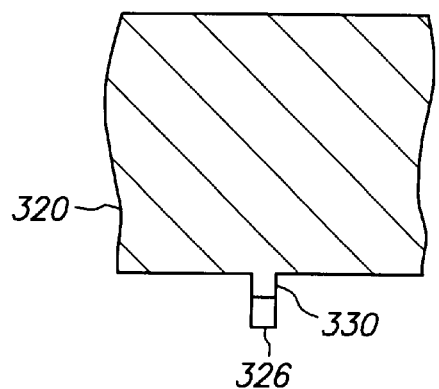
Figure 10E:
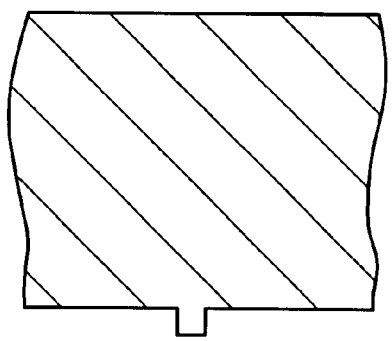
Figure 10F:
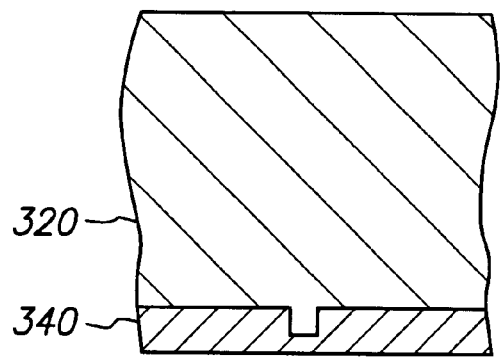
Figure 10G:
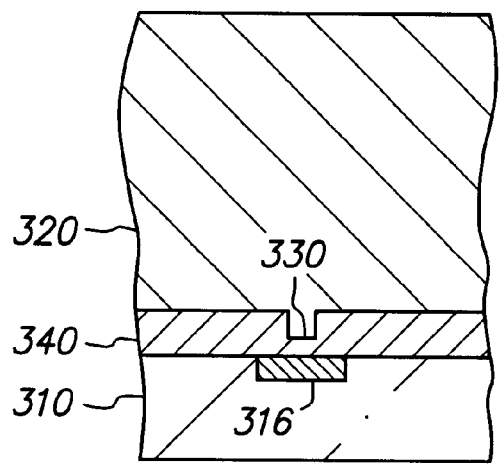
Figure 10H:
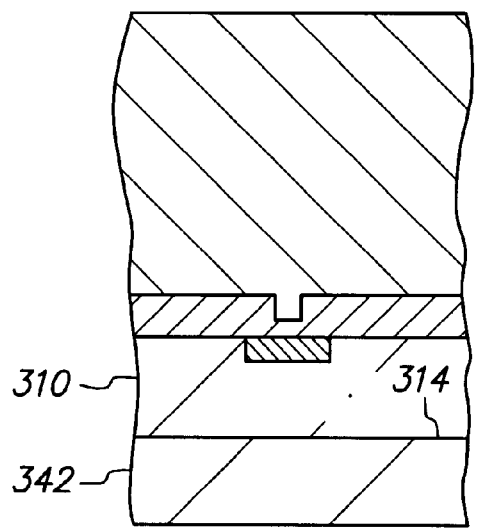
Figure 10I:
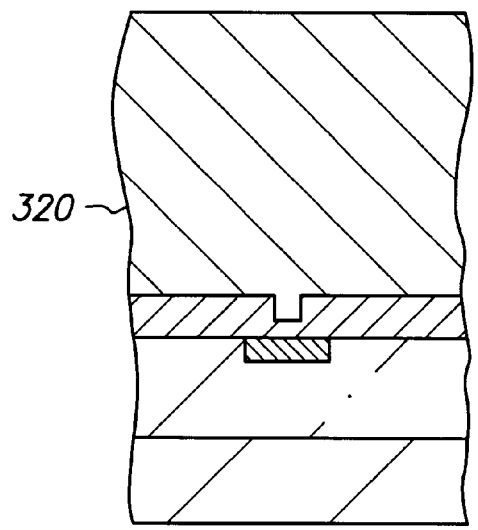
Figure 10J:
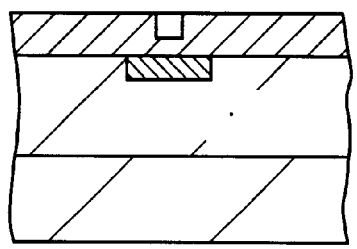
Figure 10K:
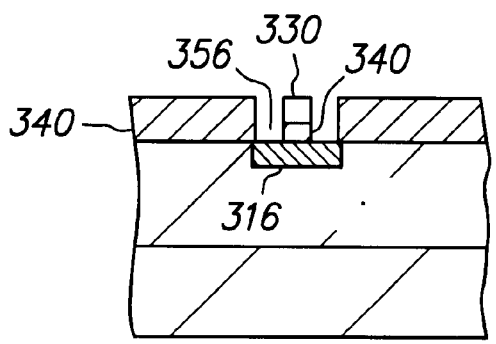
Figure 10L:
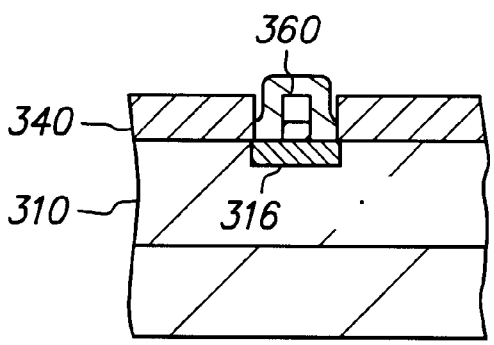
Figure 10M:
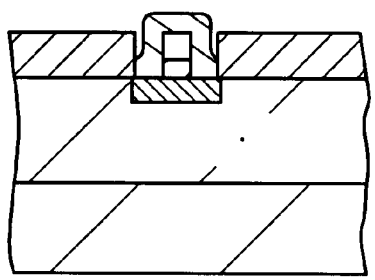
Figure 10N:
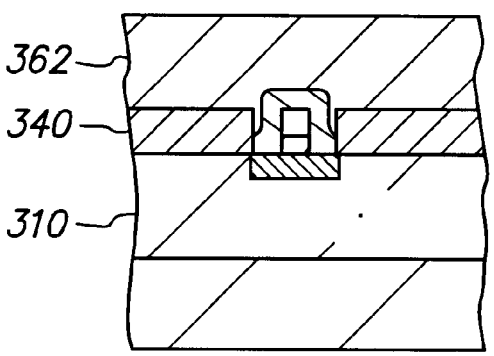

FIGS. 7A–7N, 8A–8N, 9A–9N and 10A–10N are cross-sectional, top, bottom and cross-sectional views, respectively, of a method of manufacturing a semiconductor chip assembly in accordance with a third embodiment of the present invention. FIGS. 10A–10N are oriented orthogonally with respect to FIGS. 7A–7N and depict FIGS. 7A–7N as viewed from left-to-right. In the third embodiment, the routing line does not contain a through-hole, a dimple that is converted into a through-hole or an enlarged annular region that surrounds a dimple or through-hole. Instead, the routing line outside the pillar has a uniform width. The chip and the conductive metal are mechanically attached using the adhesive and positioned relative to one another so that the routing line is disposed above and overlaps the pad, an etch is applied that exposes the top surface of the routing line and the adhesive above the pad and outside the routing line, another etch is applied that forms an opening in the adhesive that exposes the pad, and then the connection joint is formed in the opening and on the routing line and the pad. For purposes of brevity, any description in the first embodiment is incorporated herein insofar as the same is applicable, and the same description, need not be repeated. Likewise, elements of the third embodiment similar to those in the first embodiment have corresponding reference numerals indexed at three-hundred rather than one-hundred. For instance, chip 310 corresponds to chip 110, copper foil 320 corresponds to copper foil 120, etc.

FIGS. 7A, 8A, 9A and 10A are cross-sectional, top, bottom and cross-sectional views, respectively, of semiconductor chip 310 that includes upper surface 312, lower surface 314 and pad 316.

FIGS. 7B, 8B, 9B and 10B are cross-sectional, top, bottom and cross-sectional views, respectively, of copper foil 320 that includes top surface 322 and bottom surface 324.

FIGS. 7C, 8C, 9C and 10C are cross-sectional, top, bottom and cross-sectional views, respectively, of photoresist layer 326 formed on bottom surface 324 of copper foil 320. Photoresist layer 326 contains an opening that selectively exposes portion 328 of bottom surface 324.

FIGS. 7D, 8D, 9D and 10D are cross-sectional, top, bottom and cross-sectional views, respectively, of the outer edges of routing line 330 formed in copper foil 320 by applying a back-side wet chemical etch to exposed portion 328 of bottom surface 324 without applying the wet chemical etch to the opposite or front-side (top surface 322) of copper foil 320.

FIGS. 7E, 8E, 9E and 10E are cross-sectional, top, bottom and cross-sectional views, respectively, of copper foil 320 after photoresist layer 326 is stripped.

FIGS. 7F, 8F, 9F and 10F are cross-sectional, top, bottom and cross-sectional views, respectively, of insulative adhesive 340 on bottom surface 324 of copper foil 320. Adhesive 340 is applied as an adhesive paste.

FIGS. 7G, 8G, 9G and 10G are cross-sectional, top, bottom and cross-sectional views, respectively, of chip 310 mechanically attached to copper foil 320 by adhesive 340. Adhesive 340 is disposed between and contacts upper surface 312 of chip 310 and bottom surface 324 of copper foil 320. In addition, chip 310 and copper foil 320 are positioned relative to one another so that routing line 330 is disposed above and overlaps and is electrically isolated from pad 316. Thereafter, adhesive 340 is cured or hardened to form a solid adhesive layer that mechanically fastens chip 310 to copper foil 320. At this stage, routing line 330 is integral with and covered from above by copper foil 320 and covered from below by adhesive 340, pad 316 is covered from above by adhesive 340, and pad 316 is separated from routing line 330 by the thickness of adhesive 340.

FIGS. 7H, 8H, 9H and 10H are cross-sectional, top, bottom and cross-sectional views, respectively, of encapsulant 342 formed on lower surface 314 of chip 310.

FIGS. 7I, 8I, 9I and 10I are cross-sectional, top, bottom and cross-sectional views, respectively, of photoresist layer 344 formed on top surface 322 of copper foil 320. Photoresist layer 344 contains an opening that selectively exposes portion 346 of top surface 322.

FIGS. 7J, 8J, 9J and 10J are cross-sectional, top, bottom and cross-sectional views, respectively, of pillar 350 formed in copper foil 320 and the top surface of routing line 330 formed by applying a front-side wet chemical etch to portion 346 of top surface 322 without applying the wet chemical etch to the opposite or back-side of copper foil 320. Routing line 330 and pillar 350 form conductive trace 354.

FIGS. 7K, 8K, 9K and 10K are cross-sectional, top, bottom and cross-sectional views, respectively, of opening 356 formed in adhesive 340 by applying a selective laser etch. The laser etch removes a portion of adhesive 340 above pad 316 and outside routing line 330. That is, routing line 330 shields the underlying adhesive 340 from the laser etch. Opening 356 is formed in adhesive 340 without damaging pad 316 or routing line 330 and exposes pad 316.

FIGS. 7L, 8L, 9L and 10L are cross-sectional, top, bottom and cross-sectional views, respectively, of connection joint 360 formed by electroplating. Connection joint 360 is formed in opening. 356 in adhesive 340 and contacts and electrically connects pad 316 and routing line 330. Connection joint 360 has an inverted U-like shape that contacts and covers the portions of pad 316 beneath opening 356 in adhesive 340 and outside routing line 330 and the portions of routing line 330 above pad 316. Thus, connection joint 360 provides a robust, permanent electrical connection between pad 316 and routing line 330. Connection joint 360 is the only electrical conductor external to chip 310 that contacts pad 316, adhesive 340 and connection joint 360 are the only materials external to chip 310 that contact pad 316, and adhesive 340 and connection joint 360 are the only materials that contact both pad 316 and routing line 330.

FIGS. 7M, 8M, 9M and 10M are cross-sectional, top, bottom and cross-sectional views, respectively, of the partially completed assembly after photoresist layer 344 is stripped.

FIGS. 7N, 8N, 9N and 10N are cross-sectional, top, bottom and cross-sectional views, respectively, of insulative base 362 formed over routing line 330. At this stage, the manufacture of support circuit 364, which includes conductive trace 354 and insulative base 362, can be considered complete. Support circuit 364 is mechanically and electrically coupled to chip 310 by adhesive 340 and connection joint 360, respectively, to form a semiconductor chip assembly. If desired, solder balls can be screen printed on the tops of the pillars to provide connections to the next level assembly.

The semiconductor chip assemblies described above are merely exemplary. Numerous other embodiments are contemplated. For instance, various aspects of the first, second and third embodiments can be combined with one another.

Figure 11:
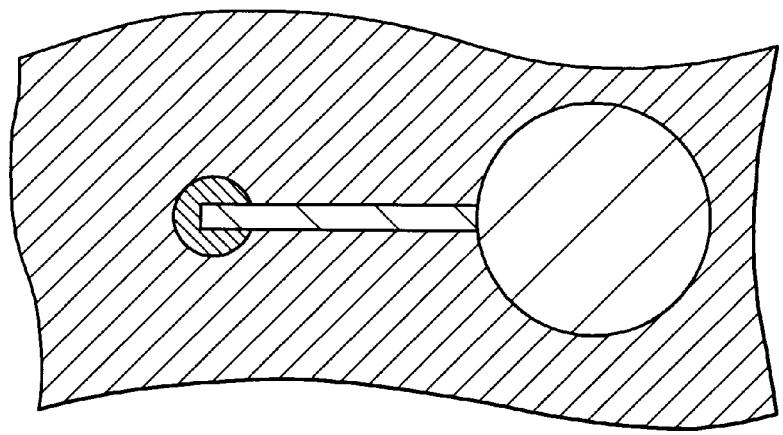
FIGS. 11–14 are top plan views of routing line variations in the third embodiment of the present invention.
Figure 12:
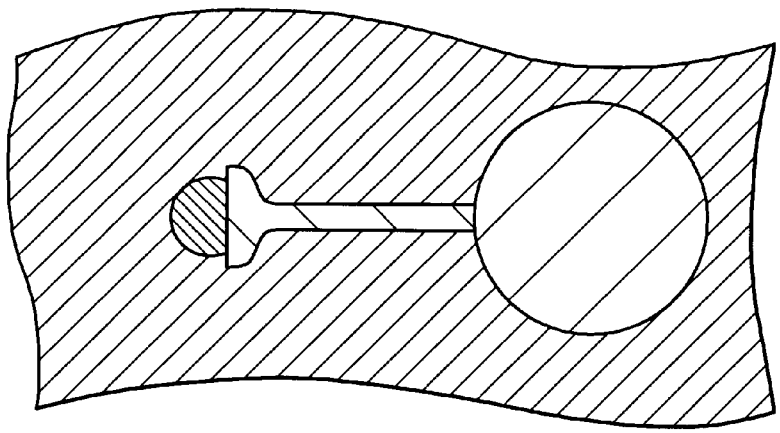
Figure 13:
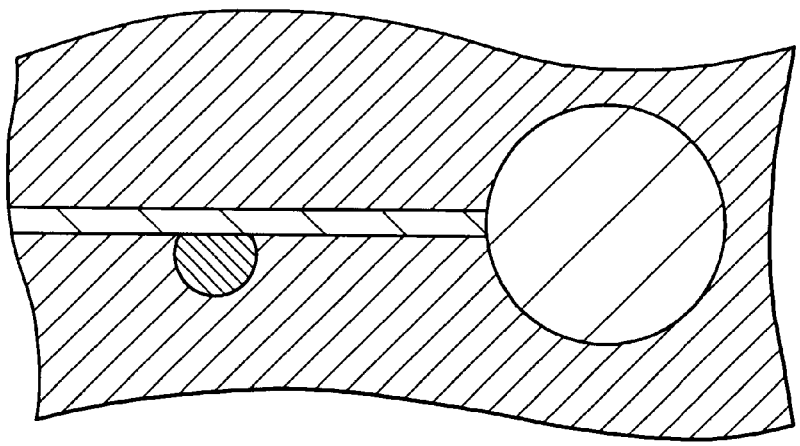
Figure 14:
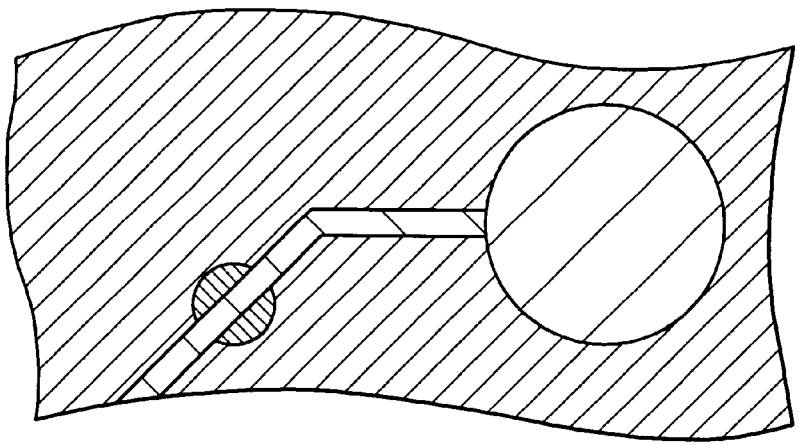

The conductive trace can have various shapes and sizes. The conductive trace can overlap various portions of the pad, such as four peripheral edges but not the center of the pad (FIGS. 2K and 5K), two opposing peripheral edges and the center of the pad (FIG. 8K), one peripheral edge and the center of the pad (FIG. 11), three peripheral edges but not the center of the pad (FIGS. 12 and 13), or two corners and the center of the pad (FIG. 14).

The conductive trace can have various shapes and sizes and can be various conductive metals including copper, gold, nickel, aluminum, tin, combinations thereof, and alloys thereof. Of common metallic materials, copper has especially low resistivity and cost. Furthermore, those skilled in the art will understand that in the context of a support circuit, a copper conductive trace is typically a copper alloy that is mostly copper but not pure elemental copper, such copper-zirconium (99.9% copper), copper-silver-phosphorus-magnesium (99.7% copper), or copper-tin-iron-phosphorus (99.7% copper). If desired, the conductive trace can be spot plated near the through-hole to make it compatible with receiving the connection joint. The conductive trace may function as a signal, power or ground layer depending on the purpose of the associated chip pad. The conductive trace need not necessarily extend above the top surface of the insulative base, and the top portion of the conductive trace can be a ball, a pad, or a pillar (columnar post). A pillar is particularly well-suited for reducing thermal mismatch related stress in the next level assembly.

The pad can have numerous shapes including a flat rectangular shape and a bumped shape. For instance, a bump-shaped pad may extend into the through-hole and may even extend above the routing line. The pad can either be partially or completely exposed prior to forming the connection joint. The pad can have a length and width that are larger than, equal to, or smaller than the diameter of the through-hole or opening in the adhesive. Preferably, the pad, through-hole or opening have the same or similar size, and essentially all of the pad is directly beneath the through-hole or opening.

The pillar and the through-hole can have a circular, ovular, square, rectangular or other shape (as viewed from the top surface of the support circuit). The through-hole and opening may be aligned with and expose a single pad or a plurality of pads. Furthermore, the pillar and through-hole sidewalls may have a wide variety of shapes and slopes including vertical sidewalls, tapered sidewalls, continuous sidewalls and stepped sidewalls.

Preferably, the insulative base has a thickness of 25 to 50 microns, the routing line has a width of 10 to 100 microns and a thickness of 10 to 40 microns, the pillar has a diameter of 300 to 500 microns that decreases with increasing height, a height of 150 to 300 microns and extends 50 to 250 microns above the insulative base, and the through-hole has a diameter of 50 to 100 microns. Of course, other dimensions are suitable.

The insulative base may be rigid or flexible, and may be formed from numerous organic or inorganic insulators such as tape (polyimide), epoxy, silicone, glass (aramid) and ceramic. Organic insulators are preferred for low cost, high dielectric applications, whereas inorganic insulators are preferred when high thermal dissipation and a matched thermal coefficient of expansion are important. The insulative base can be deposited only on the routing line, or alternatively, deposited over the pillar and the routing line and then etched back so that a top portion of the pillar is exposed.

Numerous adhesives can be applied between the chip and the support circuit. For instance, the adhesive can be applied as a paste, a laminated layer, or a liquid applied by screen-printing, spin-on, or spray-on. If a paste or liquid adhesive is applied, the adhesive may fill the dimple or through-hole and be subsequently removed. If a laminated adhesive is applied then no appreciable amount of adhesive may reside inside the dimple or through-hole. Thermosetting adhesive liquids and pastes are generally suitable. Likewise, thermoplastic adhesives such as a polyamic acid liquid resin that is cured to form a polyimide film are generally suitable.

Numerous etches can be applied to form the routing line and the pillar as well as the dimple, the through-hole and the opening in the adhesive. For instance, the opening in the adhesive can be formed by laser direct write (without a mask) or a blanket plasma etch that removes portions of the adhesive not covered by the conductive trace. In addition, these etches can be performed in various sequences. For instance, the front-side etch that forms the pillar can be applied before or after the connection joint is formed.

The connection joint can be formed from a wide variety of materials including copper, gold, nickel, palladium, tin, alloys thereof, and combinations thereof, can be formed by a wide variety of processes including electroplating, electroless plating, ball bonding and solder reflow, and can have a wide variety of shapes and sizes. The choice between a connection joint that partially or completely fills the through-hole and the shape of the connection joint depends on design and reliability considerations. Further details regarding an electroplated connection joint are disclosed in U.S. application Ser. No. 09/865,367 filed May 24, 2001 by Charles W. C. Lin entitled "Semiconductor Chip Assembly with Simultaneously Electroplated Contact Terminal and Connection Joint" which is incorporated by reference. Further details regarding an electrolessly plated connection joint are disclosed in U.S. application Ser. No. 09/864,555 filed May 24, 2001 by Charles W. C. Lin entitled "Semiconductor Chip Assembly with Simultaneously Electrolessly Plated Contact Terminal and Connection Joint" which is incorporated by reference. Further details regarding a ball bond connection joint are disclosed in U.S. application Ser. No. 09/864,773 filed May 24, 2001 by Charles W. C. Lin entitled "Semiconductor Chip Assembly with Ball Bond Connection Joint" which is incorporated by reference.

After the connection joint is formed, if a plating bus exists then it is disconnected from the conductive trace. The plating bus can be disconnected by mechanical sawing, laser cutting, chemical etching, and combinations thereof. If the plating bus is disposed about the periphery of the assembly but is not integral to the assembly, then the plating bus can be disconnected when the assembly is singulated from other assemblies. However, if the plating bus is integral to the assembly, then prior to singulation a photolithography step can be added to selectively cut related circuitry on the assembly that is dedicated to the plating bus since this circuitry would otherwise short the conductive traces together.

After the insulative base is formed, further encapsulation can be performed but is generally not necessary. In particular, it is usually not necessary to deposit an insulator over the insulative base. However, in the event the insulative base is thin or omitted, it may be desirable to provide an encapsulant to enhance the mechanical strength of the support circuit.

After the insulative base is formed, a soldering material or solder ball can be deposited over the pillar by plating or printing or placement techniques if required for the next level assembly. However, the next level assembly may not require that the semiconductor chip assembly contain solder. For instance, in land grid array (LGA) packages, the soldering material is normally provided by the panel rather than the contact terminals on the semiconductor chip assembly.

The "upper" and "lower" surfaces of the chip and the "top" and "bottom" surfaces of the support circuit do not depend on the orientation of the assembly, as will be readily apparent to those skilled in the art. For instance, the upper surface of the chip includes the pad and faces the bottom surface of the support circuit, and the top surface of the support circuit faces away from the chip, regardless of whether the assembly is inverted and/or mounted on a printed circuit board. Similarly, the support circuit is disposed "above" the chip when the bottom surface of the support circuit faces the upper surface of the chip regardless of whether the assembly is inverted. Likewise, the support circuit is shown with the pillar above the routing line and the support circuit is shown above the chip with a single orientation throughout the drawings for ease of comparison between the figures, although the support circuit and the assembly may be inverted at various manufacturing stages.

The working format for the semiconductor chip assembly can be a single chip, a wafer, a strip or a panel based on the manufacturing design. For instance, when the working format is a wafer, numerous support circuits are simultaneously batch manufactured on a single wafer and then separated from one another during singulation. As another example, when the working format is a strip (or reel-to-reel) form, the chips are individually attached to the strip. Semiconductor chip assemblies manufactured using a strip can be chip scale packages, chip size packages, ball grid arrays, or other structures. The wafer-based approach employs fewer steps and is less time consuming than the strip-based approach, however the strip-based approach is easier to control and has better dimensional stability than the wafer-based approach since aligning the routing lines with the pads involves a single chip rather than the entire wafer.

Advantageously, the semiconductor chip assembly of the present invention is reliable and inexpensive. The insulative base protects the conductive trace from handling damage, provides a known dielectric barrier for the conductive trace, and prevents solder reflow at the top surface of the support circuit from contacting or electrically shorting the underlying routing line. The tapered pillar yields enhanced reliability for the next level assembly that exceeds that of conventional BGA packages. The mode of the connection shifts from the initial mechanical coupling to metallurgical coupling to assure sufficient metallurgical bond strength. Furthermore, the support circuit can be mechanical and metallurgical coupled to the chip without TAB, flip-chip bonding, polishing, or solder joints. As a result, the assembly of the present invention significantly enhances throughput, yield and performance characteristics compared to conventional packaging techniques. Moreover, the assembly of the present invention is well-suited for use with materials compatible with copper chip and lead-free environmental requirements. Various changes and modifications to the presently preferred embodiments described herein will be apparent to those skilled in the art. For instance, the materials, dimensions and shapes described above are merely exemplary. Such changes and modifications may be made without departing from the spirit and scope of the present invention as defined in the appended claims.

I claim:

1. A method of manufacturing a semiconductor chip assembly, comprising:
   providing a semiconductor chip and a conductive metal, wherein the chip includes a conductive pad, the conductive metal is a single metallic material that includes a routing line, and the routing line is disposed above and overlaps the pad; then
   etching the conductive metal on a side opposite the routing line, thereby exposing the routing line; and then
   forming a connection joint that contacts and electrically connects the routing line and the pad.

2. The method of claim 1, including mechanically attaching the chip to the conductive metal using an insulative adhesive before etching the conductive metal.

3. The method of claim 2, including etching the adhesive thereby exposing the pad after etching the conductive metal and before forming the connection joint.

4. The method of claim 3, wherein the adhesive contacts and is sandwiched between the conductive metal and the pad, and the conductive metal and the pad are electrically isolated from one another after etching the adhesive and before forming the connection joint.

5. The method of claim 1, including etching the conductive metal to form the routing line before etching the conductive metal on the opposite side.

6. The method of claim 1, including etching the conductive metal on the opposite side to form a pillar that is connected to and extends above the routing line and does not overlap the pad.

7. The method of claim 6, including forming the connection joint before forming the pillar.

8. The method of claim 6, including forming the connection joint after forming the pillar.

9. The method of claim 1, wherein the conductive metal is a continuous strip of copper.

10. The method of claim 1, wherein the chip includes a plurality of conductive pads, the conductive metal includes a plurality of routing lines, the routing lines are disposed above and overlap the pads, the routing lines are covered by the conductive metal before etching the conductive metal, and the routing lines are exposed by etching the conductive metal.

11. A method of manufacturing a semiconductor chip assembly, comprising:
    providing a semiconductor chip that includes a conductive pad;
    providing a conductive metal that includes a routing line and a base, wherein the base is disposed above and covers and is wider than and is integral with and is the same metallic material as the routing line, and the routing line includes outer edges that are covered by the base and extend between a bottom surface of the base and a bottom surface of the routing line; then
    disposing an adhesive between the chip and the conductive metal, thereby mechanically attaching the chip to the conductive metal such that the routing line is disposed above and overlaps the pad; then
    etching partially but not completely through the conductive metal on a side opposite the routing line, thereby removing a portion of the conductive metal directly above the routing line and forming a recessed portion in the conductive metal that provides a top surface for the routing line and is contiguous with the outer edges of the routing line; then
    etching the adhesive, thereby exposing the pad while the routing line is disposed above and overlaps the pad; and then
    forming a connection joint that contacts and electrically connects the routing line and the pad.

12. The method of claim 11, wherein etching the adhesive includes applying a laser to the adhesive.

13. The method of claim 11, wherein the routing line overlaps only one peripheral edge of the pad.

14. The method of claim 11 wherein the routing line overlaps only two peripheral edges of the pad, and the two peripheral edges are opposite one another.

15. The method of claim 11, wherein the connection joint contacts a surface of the routing line that is disposed above and overlaps and faces away from the pad.

16. The method of claim 11, wherein the connection joint is the only electrical conductor external to the chip that contacts the pad.

17. The method of claim 11, wherein the connection joint and the adhesive are the only materials external to the chip that contact the pad.

18. The method of claim 11, wherein the connection joint and the adhesive are the only materials that contact both the conductive trace and the pad.

19. The method of claim 11, including encapsulating the chip after mechanically attaching the chip to the conductive metal and before etching the conductive metal.

20. The method of claim 11, including etching the conductive metal on the opposite side to form a pillar that is connected to and extends above the routing line and does not overlap the pad, and forming an insulative base over the routing line and a lower portion of the pillar but not over an upper portion of the pillar.

21. The method of claim 20, including forming the recessed portion and the pillar simultaneously.

22. The method of claim 20, including forming the recessed portion before forming the pillar.

23. The method of claim 20, including forming the connection joint before forming the pillar.

24. The method of claim 20, including forming the connection joint after forming the pillar.

25. The method of claim 20, wherein the pillar has a flat top surface and a diameter that is narrowest at the top surface.

26. The method of claim 20, wherein the pillar extends a first distance above the recessed portion, the insulative base extends a second distance above the recessed portion, and the first distance is at least twice the second distance.

27. The method of claim 20, wherein the pillar extends at least 100 microns above the insulative base.

28. The method of claim 20, wherein the conductive metal is copper and the insulative base is epoxy.

29. The method of claim 11, wherein the assembly is devoid of wire bonds, TAB leads and solder joints.

30. The method of claim 11, wherein the chip includes a plurality of conductive pads, the conductive metal includes a plurality of routing lines, the base is disposed above and covers and is wider than and is integral with and is the same metallic material as the routing lines, the routing lines are disposed above and overlap the pads, the routing lines are covered by the base before etching the conductive metal, and the routing lines are exposed by etching the conductive metal.

31. A method of manufacturing a semiconductor chip assembly, comprising the following steps in the sequence set forth:

disposing an insulative adhesive between a chip and a conductive metal, thereby mechanically attaching the chip to the conductive metal, wherein the chip includes upper and lower surfaces, the upper surface includes a pad, the conductive metal is a single metallic material that includes top, middle and bottom surfaces, the top surface faces in an opposite direction to the middle and bottom surfaces, the routing line is a protrusion that is integral with the middle surface and extends beneath the middle surface to the bottom surface, the routing line is disposed above and overlaps the pad, the upper and middle surfaces face one another, the upper and bottom surfaces face one another, and the adhesive contacts the upper and bottom surfaces;

applying an etch to a portion of the top surface, thereby etching partially but not completely through a thickness of the conductive metal and removing a portion of the conductive metal directly above the routing line and forming a top surface of the routing line proximate to the middle surface;

applying an etch to the adhesive, thereby exposing the pad;

forming a connection joint that contacts and electrically connects the routing line and the pad; and forming an insulative base over the routing line.

32. The method of claim 31, including applying an etch that forms a pillar in the opposite side of the conductive metal that extends to the top surface and is connected to and extends above the routing line and does not overlap the pad.

33. The method of claim 32, including forming the pillar before forming the connection joint.

34. The method of claim 32, including forming the pillar after forming the connection joint.

35. The method of claim 32, including forming the pillar before forming the insulative base, wherein forming the insulative base includes simultaneously disposing the insulative base over the routing line and a lower portion of the pillar without disposing the insulative base over an upper portion of the pillar.

36. The method of claim 32, including forming the pillar after partially forming the insulative base, wherein forming the insulative base includes disposing a first portion of the insulative base over the routing line after forming the connection joint and before forming the pillar, and then disposing a second portion of the insulative base over the first portion of the insulative base and a lower portion of the pillar without disposing the second portion of the insulative base over an upper portion of the pillar.

37. The method of claim 31, including applying an etch to a portion of the bottom surface, thereby etching partially but not completely through a thickness of the conductive metal to form outer edges of the routing line that extend between the middle and bottom surfaces.

38. The method of claim 31, including encapsulating the chip using an encapsulant that contacts the lower surface of the chip after mechanically attaching the chip to the conductive metal and before applying the etch to the portion of the top surface.

39. The method of claim 31, wherein the assembly is devoid of wire bonds, TAB leads and solder joints.

40. The method of claim 31, wherein the chip includes a plurality of conductive pads, the conductive metal includes a plurality of routing lines, the routing lines are disposed above and overlap the pads, the routing lines are covered from above by the conductive metal before etching the conductive metal, and the routing lines are exposed by etching the conductive metal.

41. A method of manufacturing a semiconductor chip assembly, comprising:

providing a conductive metal layer with top and bottom surfaces, wherein the conductive metal layer is a single metallic material;

providing a bottom etch mask under the bottom surface, wherein the bottom etch mask includes an opening that exposes a portion of the bottom surface;

applying an etch to the exposed portion of the bottom surface through the opening in the bottom etch mask, thereby etching partially but not completely through the conductive metal layer to form outer edges of a routing line that extends to the bottom surface;

mechanically attaching a chip to the conductive metal layer using an insulative adhesive, wherein the chip includes upper and lower surfaces, the upper surface includes a pad, the routing line is disposed above and overlaps the pad, the upper and bottom surfaces face one another, and the adhesive contacts the upper and bottom surfaces;

providing a top etch mask over the top surface, wherein the top etch mask includes an opening that exposes a portion of the top surface; then applying an etch to the exposed portion of the top surface through the opening in the top etch mask, thereby etching partially but not completely through the conductive metal layer and removing a portion of the conductive metal layer above the routing line and the pad to (i) form a top surface of the routing line contiguous with the outer edges of the routing line and (ii) expose the adhesive above the pad and outside the routing line;

applying an etch to the adhesive, thereby exposing the pad; and forming a connection joint that contacts and electrically connects the routing line and the pad.

42. The method of claim 41, wherein applying the etch to the exposed portion of the bottom surface removes a first thickness of the conductive metal layer, applying the etch to the exposed portion of the top surface removes a second thickness of the conductive metal layer, and the second thickness is at least twice the first thickness.

43. The method of claim 41, wherein applying the etch to the adhesive includes applying a laser that ablates the adhesive.

44. The method of claim 41, wherein the routing line overlaps only one peripheral edge of the pad.

45. The method of claim 41 wherein the routing line overlaps only two peripheral edges of the pad, and the two peripheral edges are opposite one another.

46. The method of claim 41, wherein the connection joint contacts a surface of the routing line that is disposed above and overlaps and faces away from the pad.

47. The method of claim 41, wherein the connection joint is the only electrical conductor external to the chip that contacts the pad.

48. The method of claim 41, wherein the connection joint and the adhesive are the only materials external to the chip that contact the pad.

49. The method of claim 41, wherein the connection joint and the adhesive are the only materials that contact both the conductive trace and the pad.

50. The method of claim 41, wherein the steps are performed in the sequence set forth.

51. A method of manufacturing a semiconductor chip assembly, comprising:

providing a conductive metal layer with top and bottom surfaces, wherein the conductive metal layer is a single metallic material;

providing a bottom etch mask under the bottom surface, wherein the bottom etch mask includes an opening that exposes a portion of the bottom surface;

applying an etch to the exposed portion of the bottom surface through the opening in the bottom etch mask, thereby etching partially but not completely through the conductive metal layer to form outer edges of a routing line;

mechanically attaching a chip to the conductive metal layer using an insulative adhesive, wherein the chip includes upper and lower surfaces, the upper surface includes a pad, the routing line is disposed above and overlaps the pad, the upper and bottom surfaces face one another, and the adhesive contacts the upper and bottom surfaces;

providing a top etch mask over the top surface, wherein the top etch mask includes an opening that exposes a portion of the top surface; then applying an etch to the exposed portion of the top surface through the opening in the top etch mask, thereby etching partially but not completely through the conductive metal layer and removing a portion of the conductive metal layer above the routing line and the pad to (i) form a top surface of the routing line that is contiguous with the outer edges of the routing line, (ii) expose the adhesive above the pad and outside the routing line and (iii) form a pillar that is connected to the routing line and extends above the routing line and does not overlap the pad;

applying an etch to the adhesive, thereby exposing the pad; and forming a connection joint that contacts and electrically connects the routing line and the pad.

52. The method of claim 51, wherein applying the etch to the exposed portion of the bottom surface removes a first thickness of the conductive metal layer, applying the etch to the exposed portion of the top surface removes a second thickness of the conductive metal layer, and the second thickness is at least twice the first thickness.

53. The method of claim 51, wherein applying the etch to the adhesive includes applying a laser that ablates the adhesive.

54. The method of claim 51, wherein the routing line overlaps only one peripheral edge of the pad.

55. The method of claim 51 wherein the routing line overlaps only two peripheral edges of the pad, and the two peripheral edges are opposite one another.

56. The method of claim 51, wherein the connection joint contacts a surface of the routing line that is disposed above and overlaps and faces away from the pad.

57. The method of claim 51, wherein the connection joint is the only electrical conductor external to the chip that contacts the pad.

58. The method of claim 51, wherein the connection joint and the adhesive are the only materials external to the chip that contact the pad.

59. The method of claim 51, wherein the connection joint and the adhesive are the only materials that contact both the conductive trace and the pad.

60. The method of claim 51, wherein the steps are performed in the sequence set forth.

61. A method of manufacturing a semiconductor chip assembly, comprising:

providing a conductive metal layer with top and bottom surfaces, wherein the conductive metal layer is a single metallic material;

providing a bottom etch mask under the bottom surface, wherein the bottom etch mask includes an opening that exposes a portion of the bottom surface;

applying an etch to the exposed portion of the bottom surface through the opening in the bottom etch mask, thereby etching partially but not completely through the conductive metal layer to form outer edges of a routing line;

mechanically attaching a chip to the conductive metal layer using an insulative adhesive, wherein the chip includes upper and lower surfaces, the routing line is disposed above and overlaps the pad, the upper and bottom surfaces face one another, and the adhesive contacts the upper and bottom surfaces;

providing a first top etch mask over the top surface, wherein the first top etch mask includes an opening that exposes a first portion of the top surface; then applying an etch to the exposed first portion of the top surface through the opening in the first top etch mask, thereby etching partially but not completely through the conductive metal layer and removing a portion of the conductive metal layer above the routing line and the pad to (i) form a first portion of a top surface of the routing line that is contiguous with the outer edges of the routing line and (ii) expose the adhesive above the pad and outside the routing line;

applying an etch to the adhesive, thereby exposing the pad;

forming a connection joint in the opening in the adhesive that contacts and electrically connects the routing line and the pad;

forming a first portion of an insulative base over the first portion of the top surface of the routing line;

providing a second top etch mask over the top surface of the conductive metal layer, wherein the second top etch mask includes an opening that exposes a second portion of the top surface of the conductive metal layer;

applying an etch to the exposed second portion of the top surface of the conductive metal layer through the opening in the second top etch mask, thereby etching partially but not completely through the conductive metal layer and removing a portion of the conductive metal layer above the routing line to (i) form a pillar that is connected to the routing line and extends above the routing line and does not overlap the pad and (ii) form a second portion of a top surface of the routing line that extends between the pillar and the first portion of the top surface of the routing line and is contiguous with the outer edges of the routing line; and forming a second portion of the insulative base over the first portion of the insulative base and the second portion of the top surface of the routing line and a lower portion of the pillar and not over an upper portion of the pillar.

62. The method of claim 61, wherein applying the etch to the exposed portion of the bottom surface removes a first thickness of the conductive metal layer, applying the etch to the exposed portion of the top surface removes a second thickness of the conductive metal layer, and the second thickness is at least twice the first thickness.

63. The method of claim 61, wherein applying the etch to the adhesive includes applying a laser that ablates the adhesive.

64. The method of claim 61, wherein the routing line overlaps only one peripheral edge of the pad.

65. The method of claim 61 wherein the routing line overlaps only two peripheral edges of the pad, and the two peripheral edges are opposite one another.

66. The method of claim 61, wherein the connection joint contacts a surface of the routing line that is disposed above and overlaps and faces away from the pad.

67. The method of claim 61, wherein the connection joint is the only electrical conductor external to the chip that contacts the pad.

68. The method of claim 61, wherein the connection joint and the adhesive are the only materials external to the chip that contact the pad.

69. The method of claim 61, wherein the connection joint and the adhesive are the only materials that contact both the conductive trace and the pad.

70. The method of claim 61, wherein the steps are performed in the sequence set forth.

71. A method of manufacturing a semiconductor chip assembly, comprising:

providing a semiconductor chip, a conductive metal and an adhesive, wherein the chip includes a conductive pad, the conductive metal is a single metallic material that includes a routing line, the routing line is disposed above and overlaps the pad, and the adhesive contacts and is sandwiched between the routing line and the pad; then etching the conductive metal on a side opposite the routing line, thereby exposing the routing line;

etching the adhesive, thereby exposing the chip; and electrically connecting the routing line and the pad.

72. The method of claim 71, wherein etching the conductive metal removes a portion of the conductive metal that is above the routing line and overlaps the pad.

73. The method of claim 72, wherein etching the conductive metal exposes a portion of the adhesive that is outside the routing line and overlaps the pad.

74. The method of claim 73, wherein the conductive metal and the pad are electrically isolated from one another after etching the conductive metal and etching the adhesive and before electrically connecting the routing line and the pad.

75. The method of claim 71, including etching the conductive metal to form the routing line before etching the conductive metal on the opposite side.

76. The method of claim 71, including etching the conductive metal on the opposite side to form a pillar that is connected to and extends above the routing line and does not overlap the pad.

77. The method of claim 76, including electrically connecting the routing line and the pad before forming the pillar.

78. The method of claim 76, including electrically connecting the routing line and the pad after forming the pillar.

79. The method of claim 71, wherein the conductive metal is a continuous strip of copper.

80. The method of claim 71, wherein the chip includes a plurality of conductive pads, the conductive metal includes a plurality of routing lines, the routing lines are disposed above and overlap the pads, the routing lines are covered by the conductive metal before etching the conductive metal, and the routing lines are exposed by etching the conductive metal.

81. A method of manufacturing a semiconductor chip assembly, comprising:

providing a semiconductor chip that includes a conductive pad;

providing a conductive metal that includes a routing line and a base, wherein the base is disposed above and covers and is wider than and is integral with and is the same metallic material as the routing line, and the routing line includes outer edges that are covered by the base and extend between a bottom surface of the base and a bottom surface of the routing line; then disposing an adhesive between the chip and the conductive metal, thereby mechanically attaching the chip to the conductive metal such that the routing line is disposed above and overlaps the pad and the adhesive contacts and is sandwiched between the routing line and the pad;

etching partially but not completely through the conductive metal on a side opposite the routing line, thereby removing a portion of the conductive metal directly above the routing line and forming a recessed portion in the conductive metal that provides a top surface for the routing line and is contiguous with the outer edges of the routing line while the routing line is disposed above and overlaps the pad and the adhesive contacts and is sandwiched between the routing line and the pad;

etching the adhesive, thereby exposing the chip while the routing line is disposed above and overlaps the pad and the adhesive contacts and is sandwiched between the routing line and the pad; and electrically connecting the routing line and the pad.

82. The method of claim 81, wherein etching the adhesive includes applying a laser to the adhesive.

83. The method of claim 81, wherein the routing line overlaps only one peripheral edge of the pad.

84. The method of claim 81 wherein the routing line overlaps only two peripheral edges of the pad, and the two peripheral edges are opposite one another.

85. The method of claim 81, wherein electrically connecting the routing line and the pad includes forming a connection joint that contacts a surface of the routing line that is disposed above and overlaps and faces away from the pad.

86. The method of claim 85, wherein the connection joint is the only electrical conductor external to the chip that contacts the pad.

87. The method of claim 85, wherein the connection joint and the adhesive are the only materials external to the chip that contact the pad.

88. The method of claim 85, wherein the connection joint and the adhesive are the only materials that contact both the conductive trace and the pad.

89. The method of claim 81, including encapsulating the chip after mechanically attaching the chip to the conductive metal and before etching the conductive metal.

90. The method of claim 81, including etching the conductive metal on the opposite side to form a pillar that is connected to and extends above the routing line and does not overlap the pad, and forming an insulative base over the routing line and a lower portion of the pillar but not over an upper portion of the pillar.

91. The method of claim 90, including forming the recessed portion and the pillar simultaneously.

92. The method of claim 90, including forming the recessed portion before forming the pillar.

93. The method of claim 90, including electrically connecting the routing line and the pad before forming the pillar.

94. The method of claim 90, including electrically connecting the routing line and the pad after forming the pillar.

95. The method of claim 90, wherein the pillar has a flat top surface and a diameter that is narrowest at the top surface.

96. The method of claim 90, wherein the pillar extends a first distance above the recessed portion, the insulative base extends a second distance above the recessed portion, and the first distance is at least twice the second distance.

97. The method of claim 90, wherein the pillar extends at least 100 microns above the insulative base.

98. The method of claim 90, wherein the conductive metal is copper and the insulative base is epoxy.

99. The method of claim 81, wherein the assembly is devoid of wire bonds, TAB leads and solder joints.

100. The method of claim 81, wherein the chip includes a plurality of conductive pads, the conductive metal includes a plurality of routing lines, the base is disposed above and covers and is wider than and is integral with and is the same metallic material as the routing lines, the routing lines are disposed above and overlap the pads, the routing lines are covered by the base before etching the conductive metal, and the routing lines are exposed by etching the conductive metal.

101. A method of manufacturing a semiconductor chip assembly, comprising:

disposing an adhesive between a chip and a conductive metal, thereby mechanically attaching the chip to the conductive metal, wherein the chip includes upper and lower surfaces, the upper surface includes a pad, the conductive metal is a single metallic material that includes top, middle and bottom surfaces, the top surface faces in an opposite direction to the middle and bottom surfaces, the routing line is a protrusion that is integral with the middle surface and extends beneath the middle surface to the bottom surface, the routing line is disposed above and overlaps the pad, the upper and middle surfaces face one another, the upper and bottom surfaces face one another, the adhesive contacts the upper and bottom surfaces and the adhesive contacts and is sandwiched between the routing line and the pad;

applying an etch to a portion of the top surface, thereby etching partially but not completely through a thickness of the conductive metal and removing a portion of the conductive metal directly above the routing line and forming a top surface of the routing line proximate to the middle surface while the routing line is disposed above and overlaps the pad and the adhesive contacts and is sandwiched between the routing line and the pad;

applying an etch to the adhesive, thereby exposing the chip while the routing line is disposed above and overlaps the pad and the adhesive contacts and is sandwiched between the routing line and the pad;

electrically connecting the routing line and the pad; and then forming an insulative base over the routing line.

102. The method of claim 101, including applying an etch that forms a pillar in the opposite side of the conductive metal that extends to the top surface and is connected to and extends above the routing line and does not overlap the pad.

103. The method of claim 102, including forming the pillar before electrically connecting the routing line and the pad.

104. The method of claim 102, including forming the pillar after electrically connecting the routing line and the pad.

105. The method of claim 102, including forming the pillar before forming the insulative base, wherein forming the insulative base includes simultaneously disposing the insulative base over the routing line and a lower portion of the pillar without disposing the insulative base over an upper portion of the pillar.

106. The method of claim 102, including forming the pillar after partially forming the insulative base, wherein forming the insulative base includes disposing a first portion of the insulative base over the routing line after electrically connecting the routing line and the pad and before forming the pillar, and then disposing a second portion of the insulative base over the first portion of the insulative base and a lower portion of the pillar without disposing the second portion of the insulative base over an upper portion of the pillar.

107. The method of claim 101, including applying an etch to a portion of the bottom surface, thereby etching partially but not completely through a thickness of the conductive metal to form outer edges of the routing line that extend between the middle and bottom surfaces.

108. The method of claim 101, including encapsulating the chip using an encapsulant that contacts the lower surface of the chip after mechanically attaching the chip to the conductive metal and before applying the etch to the portion of the top surface.

109. The method of claim 101, wherein the assembly is devoid of wire bonds, TAB leads and solder joints.

110. The method of claim 101, wherein the chip includes a plurality of conductive pads, the conductive metal includes a plurality of routing lines, the routing lines are disposed above and overlap the pads, the routing lines are covered from above by the conductive metal before etching the conductive metal, and the routing lines are exposed by etching the conductive metal.

111. A method of manufacturing a semiconductor chip assembly, comprising:

providing a conductive metal layer with top and bottom surfaces, wherein the conductive metal layer is a single metallic material;

providing a bottom etch mask under the bottom surface, wherein the bottom etch mask includes an opening that exposes a portion of the bottom surface;

applying an etch to the exposed portion of the bottom surface through the opening in the bottom etch mask, thereby etching partially but not completely through the conductive metal layer to form outer edges of a routing line that extends to the bottom surface;

mechanically attaching a chip to the conductive metal layer using an adhesive, wherein the chip includes upper and lower surfaces, the upper surface includes a pad, the routing line is disposed above and overlaps the pad, the upper and bottom surfaces face one another, the adhesive contacts the upper and bottom surfaces and the adhesive contacts and is sandwiched between the routing line and the pad;

providing a top etch mask over the top surface, wherein the top etch mask includes an opening that exposes a portion of the top surface;

applying an etch to the exposed portion of the top surface through the opening in the top etch mask, thereby etching partially but not completely through the conductive metal layer and removing a portion of the conductive metal layer above the routing line and the pad to (i) form a top surface of the routing line contiguous with the outer edges of the routing line and (ii) expose the adhesive;

applying an etch to the adhesive, thereby exposing the chip; and electrically connecting the routing line and the pad.

112. The method of claim 111, wherein applying the etch to the exposed portion of the bottom surface removes a first thickness of the conductive metal layer, applying the etch to the exposed portion of the top surface removes a second thickness of the conductive metal layer, and the second thickness is at least twice the first thickness.

113. The method of claim 111, wherein applying the etch to the adhesive includes applying a laser that ablates the adhesive.

114. The method of claim 111, wherein the routing line overlaps only one peripheral edge of the pad.

115. The method of claim 111 wherein the routing line overlaps only two peripheral edges of the pad, and the two peripheral edges are opposite one another.

116. The method of claim 111, wherein electrically connecting the routing line and the pad includes forming a connection joint that contacts a surface of the routing line that is disposed above and overlaps and faces away from the pad.

117. The method of claim 116, wherein the connection joint is the only electrical conductor external to the chip that contacts the pad.

118. The method of claim 116, wherein the connection joint and the adhesive are the only materials external to the chip that contact the pad.

119. The method of claim 116, wherein the connection joint and the adhesive are the only materials that contact both the conductive trace and the pad.

120. The method of claim 111, wherein the steps are performed in the sequence set forth.

121. A method of manufacturing a semiconductor chip assembly, comprising:

providing a conductive metal layer with top and bottom surfaces, wherein the conductive metal layer is a single metallic material;

providing a bottom etch mask under the bottom surface, wherein the bottom etch mask includes an opening that exposes a portion of the bottom surface;

applying an etch to the exposed portion of the bottom surface through the opening in the bottom etch mask, thereby etching partially but not completely through the conductive metal layer to form outer edges of a routing line;

mechanically attaching a chip to the conductive metal layer using an adhesive, wherein the chip includes upper and lower surfaces, the upper surface includes a pad, the routing line is disposed above and overlaps the pad, the upper and bottom surfaces face one another, the adhesive contacts the upper and bottom surfaces and the adhesive contacts and is sandwiched between the routing line and the pad;

providing a top etch mask over the top surface, wherein the top etch mask includes an opening that exposes a portion of the top surface;

applying an etch to the exposed portion of the top surface through the opening in the top etch mask, thereby etching partially but not completely through the conductive metal layer and removing a portion of the conductive metal layer above the routing line and the pad to (i) form a top surface of the routing line that is contiguous with the outer edges of the routing line, (ii) expose the adhesive and (iii) form a pillar that is connected to the routing line and extends above the routing line and does not overlap the pad;

applying an etch to the adhesive, thereby exposing the chip; and electrically connecting the routing line and the pad.

122. The method of claim 121, wherein applying the etch to the exposed portion of the bottom surface removes a first thickness of the conductive metal layer, applying the etch to the exposed portion of the top surface removes a second thickness of the conductive metal layer, and the second thickness is at least twice the first thickness.

123. The method of claim 121, wherein applying the etch to the adhesive includes applying a laser that ablates the adhesive.

124. The method of claim 121, wherein the routing line overlaps only one peripheral edge of the pad.

125. The method of claim 121 wherein the routing line overlaps only two peripheral edges of the pad, and the two peripheral edges are opposite one another.

126. The method of claim 121, wherein electrically connecting the routing line and the pad includes forming a connection joint that contacts a surface of the routing line that is disposed above and overlaps and faces away from the pad.

127. The method of claim 126, wherein the connection joint is the only electrical conductor external to the chip that contacts the pad.

128. The method of claim 126, wherein the connection joint and the adhesive are the only materials external to the chip that contact the pad.

129. The method of claim 126, wherein the connection joint and the adhesive are the only materials that contact both the conductive trace and the pad.

130. The method of claim 121, wherein the steps are performed in the sequence set forth.

131. A method of manufacturing a semiconductor chip assembly, comprising:

providing a conductive metal layer with top and bottom surfaces, wherein the conductive metal layer is a single metallic material;

providing a bottom etch mask under the bottom surface, wherein the bottom etch mask includes an opening that exposes a portion of the bottom surface;

applying an etch to the exposed portion of the bottom surface through the opening in the bottom etch mask, thereby etching partially but not completely through the conductive metal layer to form outer edges of a routing line;

mechanically attaching a chip to the conductive metal layer using an adhesive, wherein the chip includes upper and lower surfaces, the routing line is disposed above and overlaps the pad, the upper and bottom surfaces face one another, the adhesive contacts the upper and bottom surfaces and the adhesive contacts and is sandwiched between the routing line and the pad;

providing a first top etch mask over the top surface, wherein the first top etch mask includes an opening that exposes a first portion of the top surface;

applying an etch to the exposed first portion of the top surface through the opening in the first top etch mask, thereby etching partially but not completely through the conductive metal layer and removing a portion of the conductive metal layer above the routing line and the pad to (i) form a first portion of a top surface of the routing line that is contiguous with the outer edges of the routing line and (ii) expose the adhesive;

applying an etch to the adhesive, thereby exposing the chip;

electrically connecting the routing line and the pad;

forming a first portion of an insulative base over the first portion of the top surface of the routing line;

providing a second top etch mask over the top surface of the conductive metal layer, wherein the second top etch mask includes an opening that exposes a second portion of the top surface of the conductive metal layer;

applying an etch to the exposed second portion of the top surface of the conductive metal layer through the opening in the second top etch mask, thereby etching partially but not completely through the conductive metal layer and removing a portion of the conductive metal layer above the routing line to (i) form a pillar that is connected to the routing line and extends above the routing line and does not overlap the pad and (ii) form a second portion of a top surface of the routing line that extends between the pillar and the first portion of the top surface of the routing line and is contiguous with the outer edges of the routing line; and forming a second portion of the insulative base over the first portion of the insulative base and the second portion of the top surface of the routing line and a lower portion of the pillar and not over an upper portion of the pillar.

132. The method of claim 131, wherein applying the etch to the exposed portion of the bottom surface removes a first thickness of the conductive metal layer, applying the etch to the exposed portion of the top surface removes a second thickness of the conductive metal layer, and the second thickness is at least twice the first thickness.

133. The method of claim 131, wherein applying the etch to the adhesive includes applying a laser that ablates the adhesive.

134. The method of claim 131, wherein the routing line overlaps only one peripheral edge of the pad.

135. The method of claim 131 wherein the routing line overlaps only two peripheral edges of the pad, and the two peripheral edges are opposite one another.

136. The method of claim 131, wherein electrically connecting the routing line and the pad includes forming a connection joint that contacts a surface of the routing line that is disposed above and overlaps and faces away from the pad.

137. The method of claim 136, wherein the connection joint is the only electrical conductor external to the chip that contacts the pad.

138. The method of claim 136, wherein the connection joint and the adhesive are the only materials external to the chip that contact the pad.

139. The method of claim 136, wherein the connection joint and the adhesive are the only materials that contact both the conductive trace and the pad.

140. The method of claim 131, wherein the steps are performed in the sequence set forth.

141. A method of manufacturing a semiconductor chip assembly, comprising:

providing a semiconductor chip, a conductive metal and an adhesive, wherein the chip includes upper and lower surfaces, the upper surface includes a conductive pad, the conductive metal is a single metallic material that includes a routing line, the routing line is disposed above the chip, and the adhesive contacts and is sandwiched between the routing line and the chip; then etching the conductive metal on a side opposite the routing line, thereby exposing the routing line;

etching the adhesive, thereby exposing the chip; and electrically connecting the routing line and the pad.

142. The method of claim 141, wherein etching the conductive metal removes a portion of the conductive metal that is above the routing line and overlaps the pad.

143. The method of claim 142, wherein etching the conductive metal exposes a portion of the adhesive that is outside the routing line and overlaps the pad.

144. The method of claim 143, wherein the conductive metal and the pad are electrically isolated from one another after etching the conductive metal and etching the adhesive and before electrically connecting the routing line and the pad.

145. The method of claim 141, including etching the conductive metal to form the routing line before etching the conductive metal on the opposite side.

146. The method of claim 141, including etching the conductive metal on the opposite side to form a pillar that is connected to and extends above the routing line and does not overlap the pad.

147. The method of claim 146, including electrically connecting the routing line and the pad before forming the pillar.

148. The method of claim 146, including electrically connecting the routing line and the pad after forming the pillar.

149. The method of claim 141, wherein the conductive metal is a continuous strip of copper.

150. The method of claim 141, wherein the upper surface includes a plurality of conductive pads, the conductive metal includes a plurality of routing lines, the routing lines are disposed above the chip, the routing lines are covered by the conductive metal before etching the conductive metal, and the routing lines are exposed by etching the conductive metal.

151. A method of manufacturing a semiconductor chip assembly, comprising:

providing a semiconductor chip that includes upper and lower surfaces, wherein the upper surface includes a conductive pad;

providing a conductive metal that includes a routing line and a base, wherein the base is disposed above and covers and is wider than and is integral with and is the same metallic material as the routing line, and the routing line includes outer edges that are covered by the base and extend between a bottom surface of the base and a bottom surface of the routing line; then disposing an adhesive between the chip and the conductive metal, thereby mechanically attaching the chip to the conductive metal such that the routing line is disposed above the chip and the adhesive contacts and is sandwiched between the routing line and the chip;

etching partially but not completely through the conductive metal on a side opposite the routing line, thereby removing a portion of the conductive metal directly above the routing line and forming a recessed portion in the conductive metal that provides a top surface for the routing line and is contiguous with the outer edges of the routing line while the routing line is disposed above the chip and the adhesive contacts and is sandwiched between the routing line and the chip;

etching the adhesive, thereby exposing the chip while the routing line is disposed above the chip and the adhesive contacts and is sandwiched between the routing line and the chip; and electrically connecting the routing line and the pad.

152. The method of claim 151, wherein etching the adhesive includes applying a laser to the adhesive.

153. The method of claim 151, wherein the routing line overlaps only one peripheral edge of the pad.

154. The method of claim 151 wherein the routing line overlaps only two peripheral edges of the pad, and the two peripheral edges are opposite one another.

155. The method of claim 151, wherein electrically connecting the routing line and the pad includes forming a connection joint that contacts a surface of the routing line that faces away from the pad.

156. The method of claim 155, wherein the connection joint is the only electrical conductor external to the chip that contacts the pad.

157. The method of claim 155, wherein the connection joint and the adhesive are the only materials external to the chip that contact the pad.

158. The method of claim 155, wherein the connection joint and the adhesive are the only materials that contact both the conductive trace and the pad.

159. The method of claim 151, including encapsulating the chip after mechanically attaching the chip to the conductive metal and before etching the conductive metal.

160. The method of claim 151, including etching the conductive metal on the opposite side to form a pillar that is connected to and extends above the routing line and does not overlap the pad, and forming an insulative base over the routing line and a lower portion of the pillar but not over an upper portion of the pillar.

161. The method of claim 160, including forming the recessed portion and the pillar simultaneously.

162. The method of claim 160, including forming the recessed portion before forming the pillar.

163. The method of claim 160, including electrically connecting the routing line and the pad before forming the pillar.

164. The method of claim 160, including electrically connecting the routing line and the pad after forming the pillar.

165. The method of claim 160, wherein the pillar has a flat top surface and a diameter that is narrowest at the top surface.

166. The method of claim 160, wherein the pillar extends a first distance above the recessed portion, the insulative base extends a second distance above the recessed portion, and the first distance is at least twice the second distance.

167. The method of claim 160, wherein the pillar extends at least 100 microns above the insulative base.

168. The method of claim 160, wherein the conductive metal is copper and the insulative base is epoxy.

169. The method of claim 151, wherein the assembly is devoid of wire bonds, TAB leads and solder joints.

170. The method of claim 151, wherein the upper surface includes a plurality of conductive pads, the conductive metal includes a plurality of routing lines, the base is disposed above and covers and is wider than and is integral with and is the same metallic material as the routing lines, the routing lines are disposed above the chip, the routing lines are covered by the base before etching the conductive metal, and the routing lines are exposed by etching the conductive metal.

171. A method of manufacturing a semiconductor chip assembly, comprising:

disposing an adhesive between a chip and a conductive metal, thereby mechanically attaching the chip to the conductive metal, wherein the chip includes upper and lower surfaces, the upper surface includes a pad, the conductive metal is a single metallic material that includes top, middle and bottom surfaces, the top surface faces in an opposite direction to the middle and bottom surfaces, the routing line is a protrusion that is integral with the middle surface and extends beneath the middle surface to the bottom surface, the routing line is disposed above the chip, the upper and middle surfaces face one another, the upper and bottom surfaces face one another, the adhesive contacts the upper and bottom surfaces and the adhesive contacts and is sandwiched between the routing line and the chip;

applying an etch to a portion of the top surface, thereby etching partially but not completely through a thickness of the conductive metal and removing a portion of the conductive metal directly above the routing line and forming a top surface of the routing line proximate to the middle surface while the routing line is disposed above the chip and the adhesive contacts and is sandwiched between the routing line and the chip;

applying an etch to the adhesive, thereby exposing the chip while the routing line is disposed above the chip and the adhesive contacts and is sandwiched between the routing line and the chip;

electrically connecting the routing line and the pad; and then forming an insulative base over the routing line.

172. The method of claim 171, including applying an etch that forms a pillar in the opposite side of the conductive metal that extends to the top surface and is connected to and extends above the routing line and does not overlap the pad.

173. The method of claim 172, including forming the pillar before electrically connecting the routing line and the pad.

174. The method of claim 172, including forming the pillar after electrically connecting the routing line and the pad.

175. The method of claim 172, including forming the pillar before forming the insulative base, wherein forming the insulative base includes simultaneously disposing the insulative base over the routing line and a lower portion of the pillar without disposing the insulative base over an upper portion of the pillar.

176. The method of claim 172, including forming the pillar after partially forming the insulative base, wherein forming the insulative base includes disposing a first portion of the insulative base over the routing line after electrically connecting the routing line and the pad and before forming the pillar, and then disposing a second portion of the insulative base over the first portion of the insulative base and a lower portion of the pillar without disposing the second portion of the insulative base over an upper portion of the pillar.

177. The method of claim 171, including applying an etch to a portion of the bottom surface, thereby etching partially but not completely through a thickness of the conductive metal to form outer edges of the routing line that extend between the middle and bottom surfaces.

178. The method of claim 171, including encapsulating the chip using an encapsulant that contacts the lower surface of the chip after mechanically attaching the chip to the conductive metal and before applying the etch to the portion of the top surface.

179. The method of claim 171, wherein the assembly is devoid of wire bonds, TAB leads and solder joints.

180. The method of claim 171, wherein the upper surface includes a plurality of conductive pads, the conductive metal includes a plurality of routing lines, the routing lines are disposed above the chip, the routing lines are covered from above by the conductive metal before etching the conductive metal, and the routing lines are exposed by etching the conductive metal.

181. A method of manufacturing a semiconductor chip assembly, comprising:
  providing a conductive metal layer with top and bottom surfaces, wherein the conductive metal layer is a single metallic material;
  providing a bottom etch mask under the bottom surface, wherein the bottom etch mask includes an opening that exposes a portion of the bottom surface;
  applying an etch to the exposed portion of the bottom surface through the opening in the bottom etch mask, thereby etching partially but not completely through the conductive metal layer to form outer edges of a routing line that extends to the bottom surface;
  mechanically attaching a chip to the conductive metal layer using an adhesive, wherein the chip includes upper and lower surfaces, the upper surface includes a pad, the routing line is disposed above the chip, the upper and bottom surfaces face one another, the adhesive contacts the upper and bottom surfaces and the adhesive contacts and is sandwiched between the routing line and the chip;
  providing a top etch mask over the top surface, wherein the top etch mask includes an opening that exposes a portion of the top surface;
  applying an etch to the exposed portion of the top surface through the opening in the top etch mask, thereby etching partially but not completely through the conductive metal layer and removing a portion of the conductive metal layer above the routing line and the pad to (i) form a top surface of the routing line contiguous with the outer edges of the routing line and (ii) expose the adhesive;
  applying an etch to the adhesive, thereby exposing the chip; and
  electrically connecting the routing line and the pad.

182. The method of claim 181, wherein applying the etch to the exposed portion of the bottom surface removes a first thickness of the conductive metal layer, applying the etch to the exposed portion of the top surface removes a second thickness of the conductive metal layer, and the second thickness is at least twice the first thickness.

183. The method of claim 181, wherein applying the etch to the adhesive includes applying a laser that ablates the adhesive.

184. The method of claim 181, wherein the routing line overlaps only one peripheral edge of the pad.

185. The method of claim 181 wherein the routing line overlaps only two peripheral edges of the pad, and the two peripheral edges are opposite one another.

186. The method of claim 181, wherein electrically connecting the routing line and the pad includes forming a connection joint that contacts a surface of the routing line that faces away from the pad.

187. The method of claim 186, wherein the connection joint is the only electrical conductor external to the chip that contacts the pad.

188. The method of claim 186, wherein the connection joint and the adhesive are the only materials external to the chip that contact the pad.

189. The method of claim 186, wherein the connection joint and the adhesive are the only materials that contact both the conductive trace and the pad.

190. The method of claim 181, wherein the steps are performed in the sequence set forth.

191. A method of manufacturing a semiconductor chip assembly, comprising:
  providing a conductive metal layer with top and bottom surfaces, wherein the conductive metal layer is a single metallic material;
  providing a bottom etch mask under the bottom surface, wherein the bottom etch mask includes an opening that exposes a portion of the bottom surface;
  applying an etch to the exposed portion of the bottom surface through the opening in the bottom etch mask, thereby etching partially but not completely through the conductive metal layer to form outer edges of a routing line;
  mechanically attaching a chip to the conductive metal layer using an adhesive, wherein the chip includes upper and lower surfaces, the upper surface includes a pad, the routing line is disposed above the chip, the upper and bottom surfaces face one another, the adhesive contacts the upper and bottom surfaces and the adhesive contacts and is sandwiched between the routing line and the chip;
  providing a top etch mask over the top surface, wherein the top etch mask includes an opening that exposes a portion of the top surface;
  applying an etch to the exposed portion of the top surface through the opening in the top etch mask, thereby etching partially but not completely through the conductive metal layer and removing a portion of the conductive metal layer above the routing line and the pad to (i) form a top surface of the routing line that is contiguous with the outer edges of the routing line, (ii) expose the adhesive and (iii) form a pillar that is connected to the routing line and extends above the routing line and does not overlap the pad;
  applying an etch to the adhesive, thereby exposing the chip; and
  electrically connecting the routing line and the pad.

192. The method of claim 191, wherein applying the etch to the exposed portion of the bottom surface removes a first thickness of the conductive metal layer, applying the etch to the exposed portion of the top surface removes a second thickness of the conductive metal layer, and the second thickness is at least twice the first thickness.

193. The method of claim 191, wherein applying the etch to the adhesive includes applying a laser that ablates the adhesive.

194. The method of claim 191, wherein the routing line overlaps only one peripheral edge of the pad.

195. The method of claim 191 wherein the routing line overlaps only two peripheral edges of the pad, and the two peripheral edges are opposite one another.

196. The method of claim 191, wherein electrically connecting the routing line and the pad includes forming a connection joint that contacts a surface of the routing line that faces away from the pad.

197. The method of claim 196, wherein the connection joint is the only electrical conductor external to the chip that contacts the pad.

198. The method of claim 196, wherein the connection joint and the adhesive are the only materials external to the chip that contact the pad.

199. The method of claim 196, wherein the connection joint and the adhesive are the only materials that contact both the conductive trace and the pad.

200. The method of claim 191, wherein the steps are performed in the sequence set forth.

201. A method of manufacturing a semiconductor chip assembly, comprising:

provideing a conductive metal layer with top and bottom surfaces, wherein the conductive metal layer is a single metallic material;

providing a bottom etch mask under the bottom surface, wherein the bottom etch mask includes an opening that exposes a portion of the bottom surface;

applying an etch to the exposed portion of the bottom surface through the opening in the bottom etch mask, thereby etching partially but not completely through the conductive metal layer to form outer edges of a routing line;

mechanically attaching a chip to the conductive metal layer using an adhesive, wherein the chip includes upper and lower surfaces, the routing line is disposed above the chip, the upper and bottom surfaces face one another, the adhesive contacts the upper and bottom surfaces and the adhesive contacts and is sandwiched between the routing line and the chip;

providing a first top etch mask over the top surface, wherein the first top etch mask includes an opening that exposes a first portion of the top surface;

applying an etch to the exposed first portion of the top surface through the opening in the first top etch mask, thereby etching partially but not completely through the conductive metal layer and removing a portion of the conductive metal layer above the routing line and the pad to (i) form a first portion of a top surface of the routing line that is contiguous with the outer edges of the routing line and (ii) expose the adhesive;

applying an etch to the adhesive, thereby exposing the chip;

electrically connecting the routing line and the pad;

forming a first portion of an insulative base over the first portion of the top surface of the routing line;

providing a second top etch mask over the top surface of the conductive metal layer, wherein the second top etch mask includes an opening that exposes a second portion of the top surface of the conductive metal layer;

applying an etch to the exposed second portion of the top surface of the conductive metal layer through the opening in the second top etch mask, thereby etching partially but not completely through the conductive metal layer and removing a portion of the conductive metal layer above the routing line to (i) form a pillar that is connected to the routing line and extends above the routing line and does not overlap the pad and (ii) form a second portion of a top surface of the routing line that extends between the pillar and the first portion of the top surface of the routing line and is contiguous with the outer edges of the routing line; and forming a second portion of the insulative base over the first portion of the insulative base and the second portion of the top surface of the routing line and a lower portion of the pillar and not over an upper portion of the pillar.

202. The method of claim 201, wherein applying the etch to the exposed portion of the bottom surface removes a first thickness of the conductive metal layer, applying the etch to the exposed portion of the top surface removes a second thickness of the conductive metal layer, and the second thickness is at least twice the first thickness.

203. The method of claim 201, wherein applying the etch to the adhesive includes applying a laser that ablates the adhesive.

204. The method of claim 201, wherein the routing line overlaps only one peripheral edge of the pad.

205. The method of claim 201 wherein the routing line overlaps only two peripheral edges of the pad, and the two peripheral edges are opposite one another.

206. The method of claim 201, wherein electrically connecting the routing line and the pad includes forming a connection joint that contacts a surface of the routing line that faces away from the pad.

207. The method of claim 206, wherein the connection joint is the only electrical conductor external to the chip that contacts the pad.

208. The method of claim 206, wherein the connection joint and the adhesive are the only materials external to the chip that contact the pad.

209. The method of claim 206, wherein the connection joint and the adhesive are the only materials that contact both the conductive trace and the pad.

210. The method of claim 201, wherein the steps are performed in the sequence set forth.

* * * * *